(12) United States Patent
Arditi et al.

(10) Patent No.: US 9,543,455 B2
(45) Date of Patent: Jan. 10, 2017

(54) SYSTEM AND METHOD FOR LOW-COST, HIGH-EFFICIENCY SOLAR PANEL POWER FEED

(71) Applicant: Tigo Energy, Inc., Los Gatos, CA (US)

(72) Inventors: Shmuel Arditi, Los Gatos, CA (US); Daniel Eizips, Sunnyvale, CA (US); Mordechay Avrutsky, Cupertino, CA (US)

(73) Assignee: TIGO ENERGY, INC., Los Gatos, CA (US)

( * ) Notice: Subject to any disclaimer, the term of this patent is extended or adjusted under 35 U.S.C. 154(b) by 193 days.

(21) Appl. No.: 14/260,183

(22) Filed: Apr. 23, 2014

(65) Prior Publication Data

US 2014/0327313 A1 Nov. 6, 2014

Related U.S. Application Data

(60) Provisional application No. 61/818,036, filed on May 1, 2013.

(51) Int. Cl.
*H02J 3/00* (2006.01)
*H01L 31/02* (2006.01)

(52) U.S. Cl.
CPC ......... *H01L 31/02021* (2013.01); *Y02E 10/50* (2013.01); *Y10T 307/549* (2015.04); *Y10T 307/609* (2015.04)

(58) Field of Classification Search
CPC . H01L 31/02021; H02J 7/355; Y10T 307/609; Y10T 307/549
USPC ......................................................... 307/63
See application file for complete search history.

(56) References Cited

U.S. PATENT DOCUMENTS

| 6,248,950 B1 * | 6/2001 | Hoeber ............... H01L 31/048 136/244 |
| 7,602,080 B1 | 10/2009 | Hadar et al. |
| 7,933,841 B2 | 4/2011 | Schmeyer et al. |

(Continued)

OTHER PUBLICATIONS

In-circuit test, Wikipedia, the free encyclopedia, http://en.wikipedia.org/wiki/In-circuit_test, last modified on Nov. 26, 2014, retrieved on Dec. 2, 2014.

(Continued)

*Primary Examiner* — Rexford Barnie
*Assistant Examiner* — Toan Vu
(74) *Attorney, Agent, or Firm* — Greenberg Traurig LLP

(57) ABSTRACT

A cascading regulation system connected to a number of serially connected power sources and uses multiple regulators having different cutoff voltages to provide an output for the local power consumption unit. Each of the regulators is connected to a subset of serially connected power sources and so configured that if the voltage generated at the lowest tap is no longer sufficient for a stable supply to the local power consumption unit, the next higher regulator takes over, and the output voltage drops in small steps reflective of that takeover of the next higher tap. When the voltage generated across a subsection grows, a lower connected tap may take over again, producing a slightly higher output voltage for the local power consumption unit. The cutover steps are chosen such that the output voltage range matches the range given as the acceptable input range for the local power consumption unit.

18 Claims, 53 Drawing Sheets

(56) References Cited

U.S. PATENT DOCUMENTS

| | | | | |
|---|---|---|---|---|
| 2009/0322161 A1* | 12/2009 | Patel | ............... | H02H 3/18 |
| | | | | 307/131 |
| 2012/0187768 A1* | 7/2012 | Goder | ............... | H02J 1/10 |
| | | | | 307/82 |
| 2012/0242321 A1* | 9/2012 | Kasai | ............... | G01J 5/0066 |
| | | | | 324/72 |
| 2014/0319920 A1* | 10/2014 | Kuboyama | ............... | H02J 3/385 |
| | | | | 307/82 |
| 2015/0028679 A1* | 1/2015 | Francescutto | ............... | H02J 3/383 |
| | | | | 307/63 |

OTHER PUBLICATIONS

Potting (electronics), Wikipedia, the free encyclopedia, http://en.wikipedia.org/wiki/Potting_%28electronics%29, last modified on Apr. 17, 2014, retrieved on Dec. 2, 2014.

* cited by examiner

US 9,543,455 B2

SYSTEM AND METHOD FOR LOW-COST, HIGH-EFFICIENCY SOLAR PANEL POWER FEED

RELATED APPLICATIONS

The present application claims the benefit of the filing date of Prov. U.S. Pat. App. Ser. No. 61/818,036, filed May 1, 2013, and entitled "System and Method for Low-Cost, High-Efficiency Solar Panel Power Feed," the disclosure of which is incorporated herein by reference.

The present application relates to: U.S. patent application Ser. No. 13/346,482, filed Jan. 9, 2012 and entitled "Systems and Methods to Reduce the Number and Cost of Management Units of Distributed Power Generators", and U.S. Pat. No. 8,314,375, issued Nov. 20, 2012 and entitled "System and Method for Local String Management Unit," the entire disclosures of which applications are incorporated herein by reference.

FIELD OF THE TECHNOLOGY

At least some embodiments of this disclosure relate to photovoltaic systems in general, and more particularly but not limited to, improving the energy production performance of photovoltaic systems.

BACKGROUND

A traditional maximum power point tracking (MPPT) algorithm sees a solar array as if it were a single solar module. MPPT can pull and push current on all strings and solar modules in a solar array in an equivalent fashion. As such, if solar modules in the solar array operate at different working points on the I-V curve, due to differences in installation, fabrication, or degradation over time, an MPPT algorithm may not be able to find the maximum power point (MPP) for the solar array.

U.S. Pat. No. 7,602,080, issued on Oct. 13, 2009 and entitled "Systems and Methods to Balance Solar Panels in a Multi-Panel System," discloses a local management unit for a solar module. The local management unit has a controller for controlling the operation of the solar module and a link module unit to provide connectivity to a power bus for energy delivery and/or for data communications. The entire disclosure of U.S. Pat. No. 7,602,080 is incorporated herein by reference.

In some situations, in solar panels, a simple, economical solution is desirable to reduce both power consumption and component cost for the circuitry supplying a controller, etc., running in the solar panels. Further, it is desirable that such a solution offer high reliability and high efficiency.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
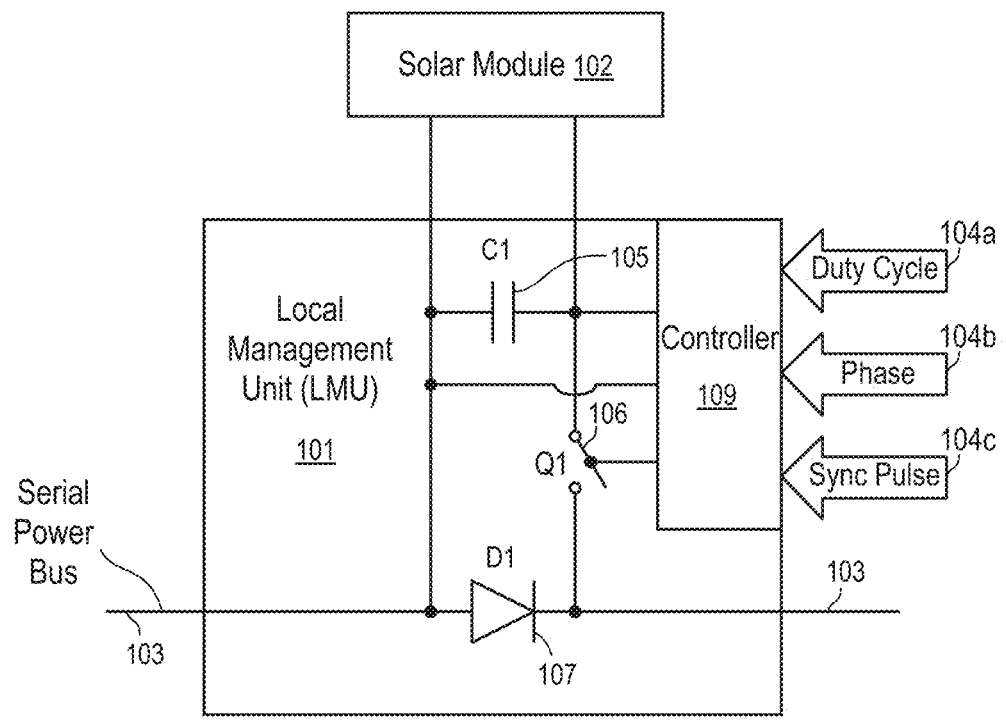
FIGS. 1-3B illustrate local management units according to some embodiments.

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments. As a result, this specification represents a disclosure of all possible combinations of features described herein, except that certain combinations are excluded by reasons of mutually exclusive relationships in features, where the mutual exclusiveness is either explicitly identified in this specification or is apparent from the description of the respective features.

When solar modules are connected in series or mesh configuration, there can be a problem in which weaker modules not only produce less energy but also affect other modules in the same string or wiring section. By measuring one can determine that a few modules are weaker than the others in most commercially installed strings. Thus, the string is generating less power than the sum available at each module if modules were operated separately.

At least one embodiment of the present disclosure provides methods and systems to switch on and off weak modules in the string in a way that the current on the string bus from the good modules won't be affected by the weak modules.

The present invention allows transmission of data from solar modules to a central (or system controller management) unit and other local management units in an energy production or photovoltaic system without adding significant cost. One embodiment of the present invention involves using the typically undesired electrical noise produced when operating local management units (sometimes referred to as "controllers" or "converters") to act as a carrier system for data to be transferred. As there are a multitude of solar modules, each can be run on a slightly different frequency. Such an approach allows a receiver in the energy production or photovoltaic system to identify the carrier signal of each local management unit separately. This approach has the added benefit of reducing the overall system noise, because each local management unit sends "noise energy" in a different part of the spectrum, thus helping to avoid peaks.

FIGS. 1-3B illustrate local management units according to some embodiments. In FIGS. 1-3B, local management units (101) are used to switch on and off the solar module units (102) periodically to improve the energy production performance of the photovoltaic systems connected, at least in part, in series. A local management unit can be variously referred to as a solar module controller (or converter) or link module unit.

In FIG. 1, a local management unit (101) is local to the solar module (102) and can be used to periodically couple the solar module (102) to the serial power bus (103) via the switch Q1 (106), to improve the total power output for the string of solar modules connected to the serial power bus in series.

The local management unit (LMU) (101) can include a solar module controller to control the operation of the solar module (102) and/or a link module unit to provide connectivity to the serial power bus (103) for energy delivery and/or for data communications.

In one embodiment, the command to control the operation of the switch Q1 (106) is sent to the local management unit (101) over the photovoltaic (PV) string bus (power line) (103). Alternatively, separate network connections can be used to transmit the data and/or commands to/from the local management unit (101).

Figure 2:
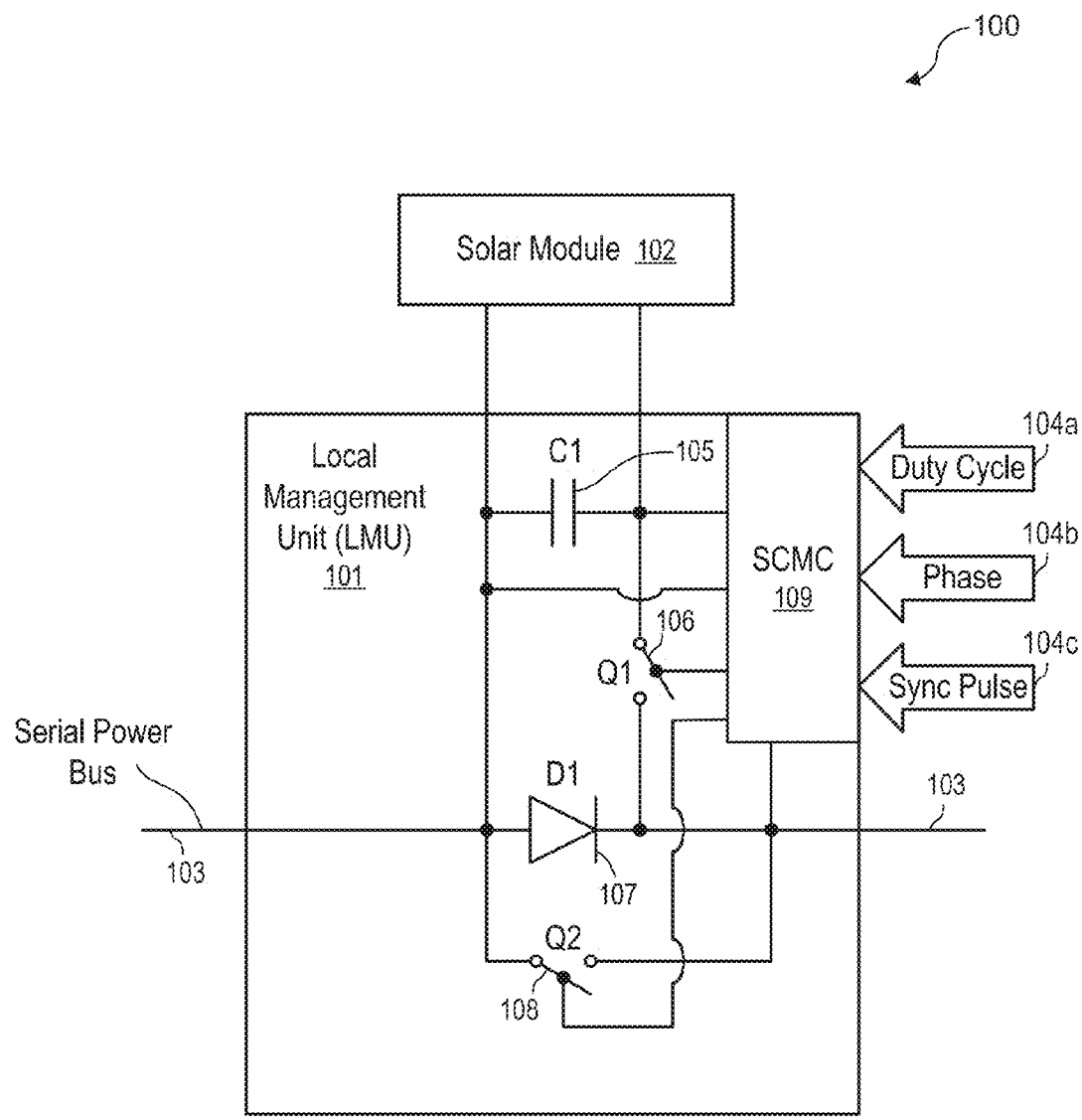

In FIGS. 1 and 2, the inputs (104a, 104b, 104c) to the local management unit (101) are illustrated separately. However, the inputs (104a, 104b, 104c) are not necessarily communicated to local management unit (101) via separate connections. In one embodiment, the inputs are received in the local management unit via the serial power bus (103).

In FIG. 1, the solar module (102) is connected in parallel to the capacitor C1 (105) of the local management unit (101). The diode D1 (107) of the local management unit (101) is connected in series in the serial power bus (103) which can or may not be part of an overall mesh configuration of solar modules. The switch Q1 (106) of the local management unit can selectively connect or disconnect the solar module (102) and the capacitor C1 (105) from a parallel connection with the diode D1 (107) and thus connect or disconnect the solar module (102) from the serial power bus (103).

In FIG. 1, a controller (109) of the local management unit (101) controls the operation of the switch (106) according to the parameters, such as duty cycle (104a), phase (104b) and synchronization pulse (104c).

In one embodiment, the controller (109) receives the parameters (104a, 104b, 104c) from a remote management unit via the serial power bus (103) or a separate data communication connection (e.g., a separate data bus or a wireless connection). In some embodiment, the controller (109) can communicate with other local management units connected on the serial power bus (103) to obtain operating parameters of the solar modules attached to the serial power bus (103) and thus compute the parameters (e.g., 104a and 104b) based on the received operating parameters. In some embodiment, the controller (109) can determine the parameter (e.g., 104a and 104b) based on the operating parameters of the solar module (102) and/or measurements obtained by the controller (109), without communicating with other local management units of other solar modules, or a remote system management unit.

In FIG. 2, a system (100) has a local management unit (101) coupled to the solar module (102). The local management unit (101) is connected between the solar module (102) and the string bus (103) to improve the total power output for the whole string on the serial power bus (103). Commands to the local management unit (101) can be sent over the photovoltaic (PV) string bus (power line) (103). To make the figure more clear, the inputs (104a, 104b, 104c) to the controller (109) of the local management unit (101) were drawn separately, which does not necessarily indicate that the inputs (104a, 104b, 104c) are provided via separate connections and/or from outside the local management unit (101). For example, in some embodiments, the controller (109) can compute the parameters (104a, 104b, 104c) based on measurements obtained at the local management unit (101), with or without data communications over the serial power bus (103) (or a separate data communication connection with other management units).

In FIG. 2, the local management unit (101) is connected in one side to the solar module (102) in parallel and on the other side in series to a string of other modules, which can or may not be part of an overall mesh configuration. The local management unit (101) can receive, among others, three inputs or types of input data, including a) requested duty cycle (104a), which can be expressed as a percentage (e.g., from 0 to 100%) of time the solar module (102) is to be connected to the serial power bus (103) via the switch Q1 (106), b) a phase shift (104b) in degrees (e.g., from 0 degree to 180 degree) and c) a timing or synchronization pulse (104c). These inputs (e.g., 104a, 104b and 104c) can be supplied as discrete signals, or can be supplied as data on a network, or composite signals sent through the power lines or wirelessly, and in yet other cases, as a combination of any of these input types.

In FIG. 2, the local management unit (101) periodically connects and disconnects the solar module (102) to and from the string that forms the serial power bus (103). The duty cycle (104a) and the phase (104b) of the operation of the switch Q1 (106) can be computed in a number of ways to improve the performance of the system, which will be discussed further below.

In FIG. 2, the local management unit (101) includes a capacitor C1 (105) and a switch Q1 (106), as well as a diode D1 (107). In FIG. 2, the diode D1 (107) is supplemented with an additional switch Q2 (108), which acts as a synchronous rectifier to increase efficiency. In one embodiment, the additional switch Q2 (108) is open (turned off) when the switch Q1 (106) is closed (turned on) to attach the solar module (102) (and the capacitor C1 (105)) to the serial power bus (103).

In some cases, a filter (not shown), including a serial coil and a parallel capacitor, is also used. The filter can be placed at the local management unit or placed just before the fuse box or inverter, or be part of either one of those.

In FIG. 2, the controller (109) is used to process the input signals (e.g., 104a, 104b, 104c) and drive the switches Q1 (106) and Q2 (108). In one embodiment, the controller (109) is a small single chip micro controller (SCMC). For example, the controller (109) can be implemented using Application-Specific Integrated Circuit (ASIC) or Field-Programmable Gate Array (FPGA). The controller (109) can even be implemented in discrete, functionally equivalent circuitry, or in other cases a combination of SCMC and discrete circuitry. It will be generally referred to as single chip micro controller (SCMC) herein, but any implementation can be used.

In one embodiment, the controller (109) is coupled to the solar module (102) in parallel to obtain power for processing; and the controller (109) is coupled to the serial power bus (103) to obtain signals transmitted from other management units coupled to the serial power bus (103).

By switching the module (102) (or groups of cells, or a cell) on and off to the string periodically, the local management unit (101) can lower the voltage reflected to the string bus (103) (e.g., a lower average voltage contributed to the string bus) and can cause the current reflected to the string bus (103) to be higher, nearer the level it would be if the module was not weak, generating a higher total power output.

In one embodiment, it is preferable to use different phases to operate the switches in different local management units on a string to minimize voltage variance on the string.

Figure 3A:
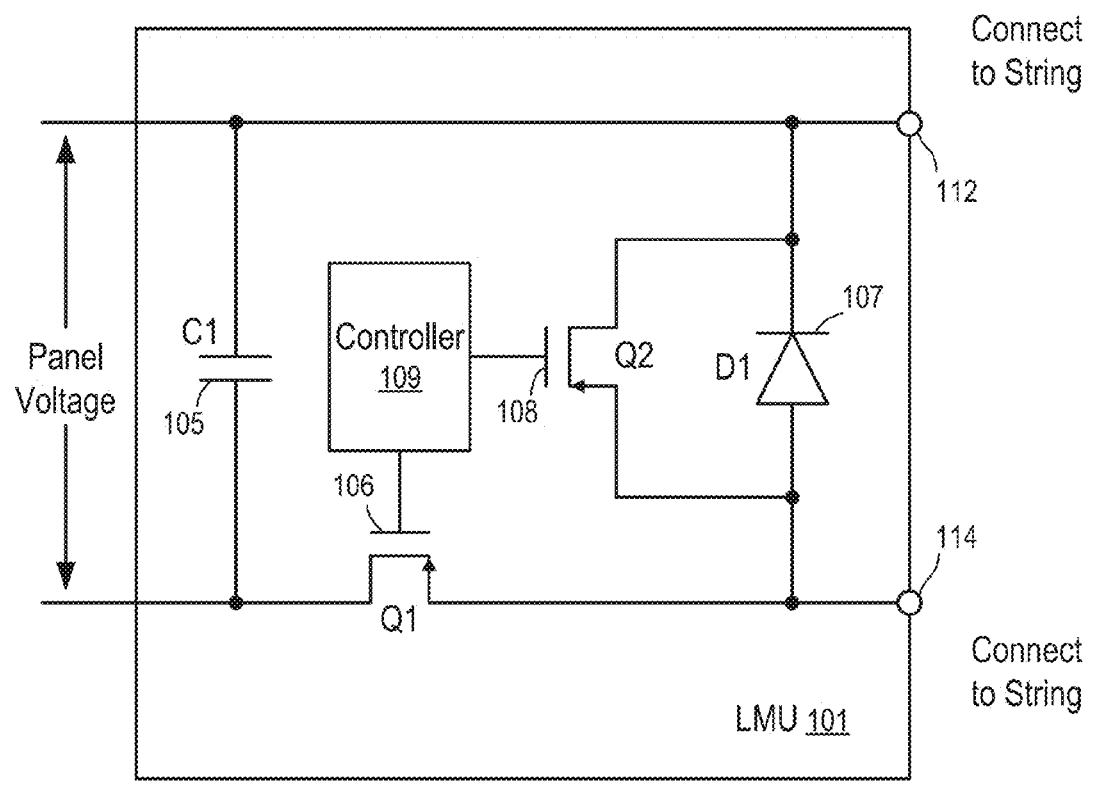

In FIG. 3A, the local management unit (101) provides two connectors (112 and 114) for serial connections with other local management unit (101) to form a serial power bus (103). The controller (109) controls the states of the switches Q1 (106) and Q2 (108).

In FIG. 3A, when the controller (109) turns on the switch (106), the panel voltage and the capacitor C1 (105) are connected in parallel to the connectors (112 and 114). The output voltage between the connectors (112 and 114) is substantially the same as the output panel voltage.

In FIG. 3A, during the period the switch (106) is turned off (open), the controller (109) turns on (closes) the switch (108) to provide a path around the diode D1 (107) to improve efficiency.

In FIG. 3A, when the switch (106) is turned off (open), the panel voltage charges the capacitor C1 (105), such that when the switch (106) is turned on, both the solar panel and the capacitor (105) provides currents going through the connectors (112 and 114), allowing a current larger than the current of the solar panel to flow in the string (the serial power bus (103)). When the switch (106) is turned off (open), the diode D1 (107) also provides a path between the connectors (112 and 114) to sustain the current in the string, even if the switch (108) is off for some reasons.

In one embodiment, the controller (109) is connected (not shown in FIG. 3A) to the panel voltage to obtain the power for controlling the switches Q1 (106) and Q2 (108). In one embodiment, the controller (109) is further connected (not shown in FIG. 3A) to at least one of the connectors to transmit and/or receive information from the string. In one embodiment, the controller (109) includes sensors (not shown in FIG. 3A) to measure operating parameters of the solar panel, such as panel voltage, panel current, temperature, light intensity, etc.

Figure 3B:
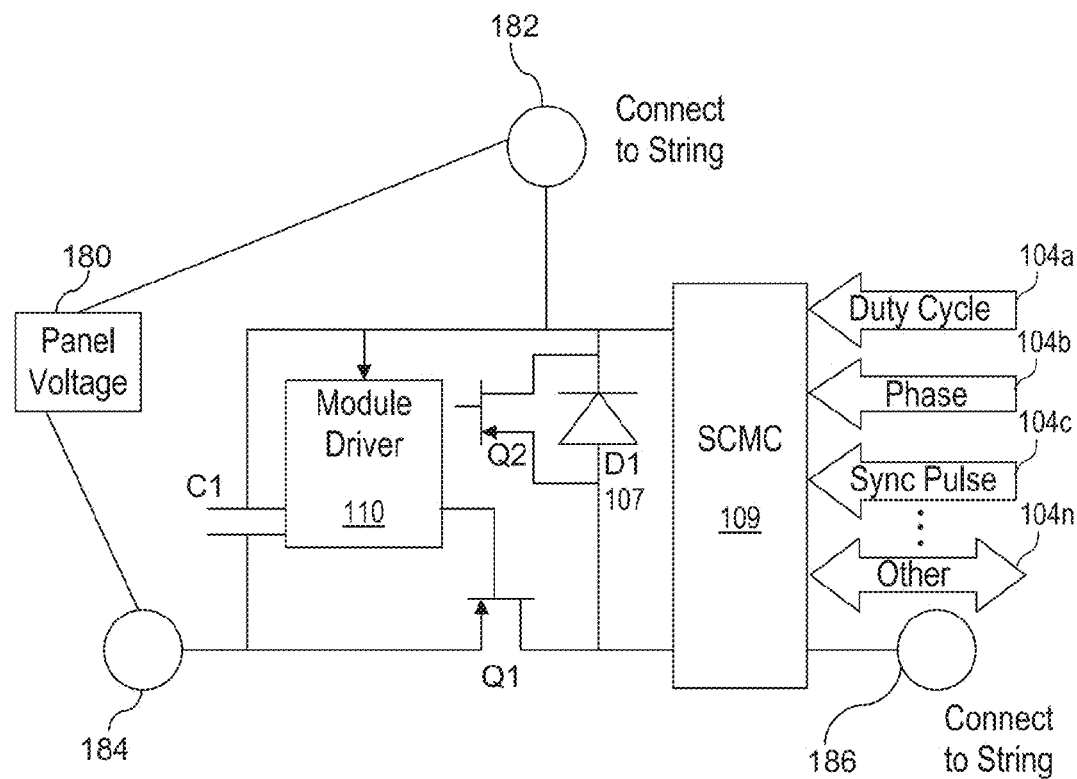

FIG. 3B shows an alternative three terminal implementation of the local management unit 101 shown in FIG. 3A. In FIG. 3B, a panel voltage (180) is connected to terminals (182, 184). Terminals (182, 186) are connected to the string bus (103). A module driver (110) and a single chip micro controller (SCMC) control the switches Q1 and Q2. Under normal operating conditions, Q1 is on to allow normal operation of the system. When string current exceeds source capability, and as a result source voltage drops, Q1 and Q2 start a PWM (pulse width modulation) operation under control of the module driver (110). PWM involves modulation of duty cycle to control the amount of power sent to the load. This allows string current to remain constant, and input voltages can be maintained at the maximum power point. This implementation protects transistors during low voltage or short situations. In one embodiment, a single chip micro controller (SCMC) (109) can be connected in parallel to the diode D1 (107) to function in the manner of the SCMC 109 as described above. In one embodiment, the module driver (110) and the single chip micro controller (SCMC) (109) can be integrated in a single controller as shown in, for example, FIG. 3A. As discussed above, single chip micro controller (SCMC) (109) can receive the inputs (104a, 104b, 104c). As shown in FIG. 3B, in one embodiment, the inputs (104a, 104b, 104c) are provided with a communications interface (not shown) coupled to a master controller (not shown). In one embodiment, other inputs (104n) constituting information about other operating parameters can also be communicated to the single chip micro controller (SCMC) (109) from the communications interface. In one embodiment, the other inputs (104n) can be information that is communicated bi-directionally. As discussed above, the power supply connections in the figures, including FIG. 3B, are not necessarily shown for purposes of clarity.

Figure 4A:
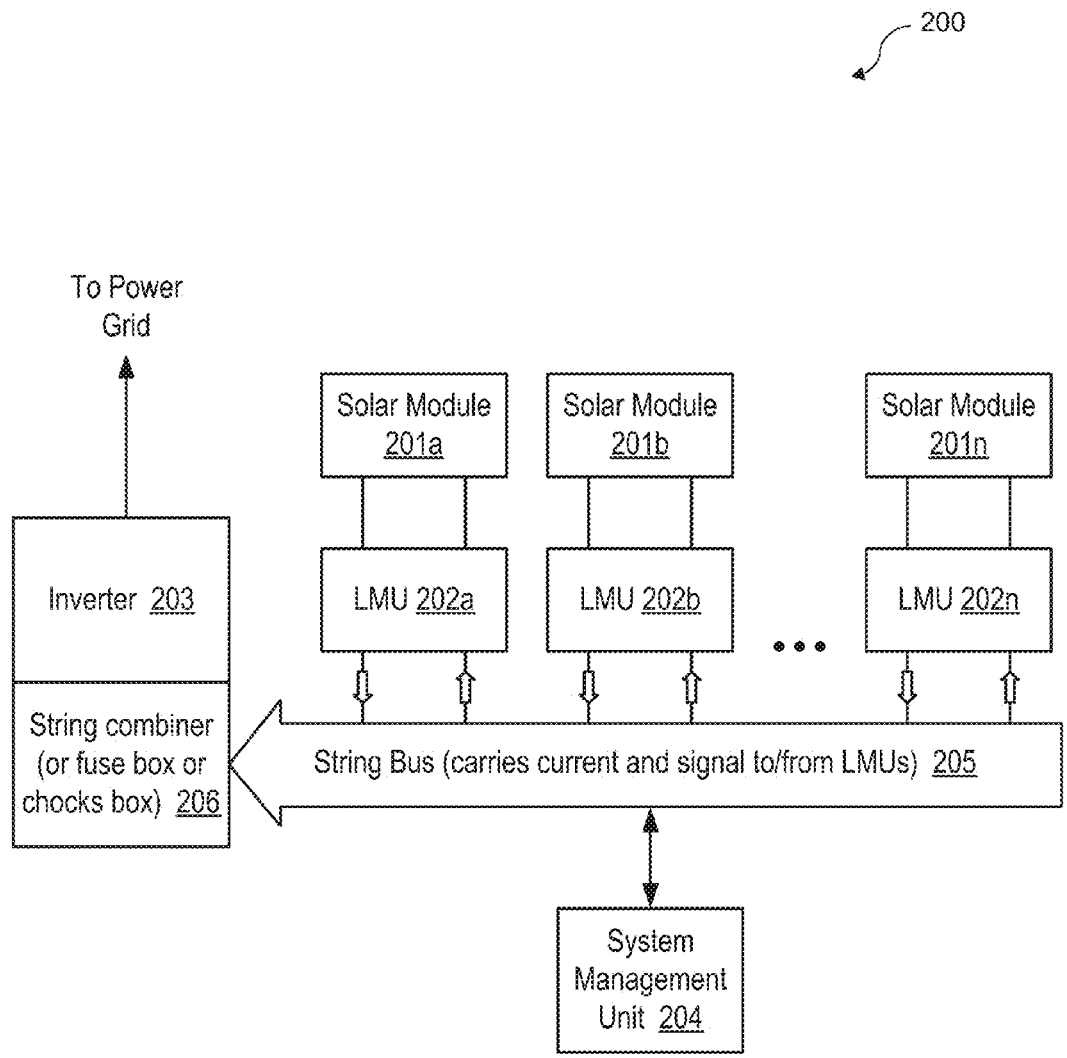
FIG. 4A illustrates a photovoltaic system according to one embodiment.

FIG. 4A illustrates a photovoltaic system (200) according to one embodiment. In FIG. 4A, the photovoltaic system 200 is built from a few components, including photovoltaic modules (201a, 201b, . . . , 201n), local management units (202a, 202b, . . . , 202n), an inverter (203), and a system management unit (204).

In one embodiment, the system management unit (204) is part of the inverter (203), the combiner box (206), a local management unit, or a stand-alone unit. The solar modules (201a, 201b, . . . , 201n) are connected in parallel to the local management units (202a, 202b, . . . , 202n) respectively, which are connected in series to form a string bus (205), which eventually is connected to an inverter (203) and the management unit (204). The solar module (201a), for example, is connected to the local management unit (202a) by the terminals (182, 184, 186) (FIG. 3B). As shown in FIG. 4A, in one embodiment, the terminal (182), which connects to the panel voltage and the string voltage, is connected to the depicted left connection between the solar module (201a) and the local management unit (202a) and connected to the depicted left connection between the local management unit (202a) and the string bus (205). The terminal (184), which is connected to the panel voltage, is connected to the depicted right connection between the between the solar module (201a) and the local management unit (202a). The terminal (186), which is connected to the string voltage, is connected to the depicted right connection between the local management unit (202a) and the string bus (205).

In FIG. 4A, the string bus (205) can be connected to the inverter (203) directly or as part of a mesh network or combiner boxes or fuse boxes (not shown). An isolated local management unit can be used as a combiner box (206) to adjust all voltages before connecting to the inverter (203); or, a single or multi-string inverter can be used. To limit the changes in the voltage of the bus, the management unit (204) can assign a different phase for each of the local management units (202a, 202b, . . . , 202n). In one embodiment, at any given time, a maximum of a predetermined number of solar modules (e.g., one single solar module) are disconnected from the string bus (205).

In one embodiment, beyond the module connection the local management units can have the signal inputs, including but not limited to duty cycle (104a), phase (104b) and synchronization pulse (104c) (e.g., to keep the local management units synchronized). In one embodiment, the phase (104b) and the synchronization pulse (104c) are used to further improve performance, but the local management unit (101) can work without them.

In one embodiment, the local management unit can provide output signals. For example, the local management unit (101) can measure current and voltage at the module side and optionally measure current and voltage in the string side. The local management unit (101) can provide other suitable signals, including but not limited to measurements of light, temperature (both ambient and module), etc.

In one embodiment, the output signals from the local management unit (101) are transmitted over the power line (e.g., via power line communication (PLC)), or transmitted wirelessly.

In one embodiment, the system management unit (204) receives sensor inputs from light sensor(s), temperature sensor(s), one or more each for ambient, solar module or both, to control the photovoltaic system (200). In one embodiment, the signals can also include synchronization signals. For example, a management unit can send synchronization signals periodically to set the timing values, etc.

Using the described methods the local management unit can be a very non-expensive and reliable device that can easily increase the throughput of a photovoltaic solar system by a few (e.g., signal or low double digits) percentage points. These varied controls also allow installers using this kind of system to control the VOC (open circuit voltage) by, for example by shutting off some or all modules. For example, by using the local management units of the system, a few modules can be disconnected from a string if a string is getting to the regulatory voltage limit, thus more modules can be installed in a string.

In some embodiments, local management units can also be used within the solar panel to control the connection of solar cells attached to strings of cells within the solar panel.

Figure 5:
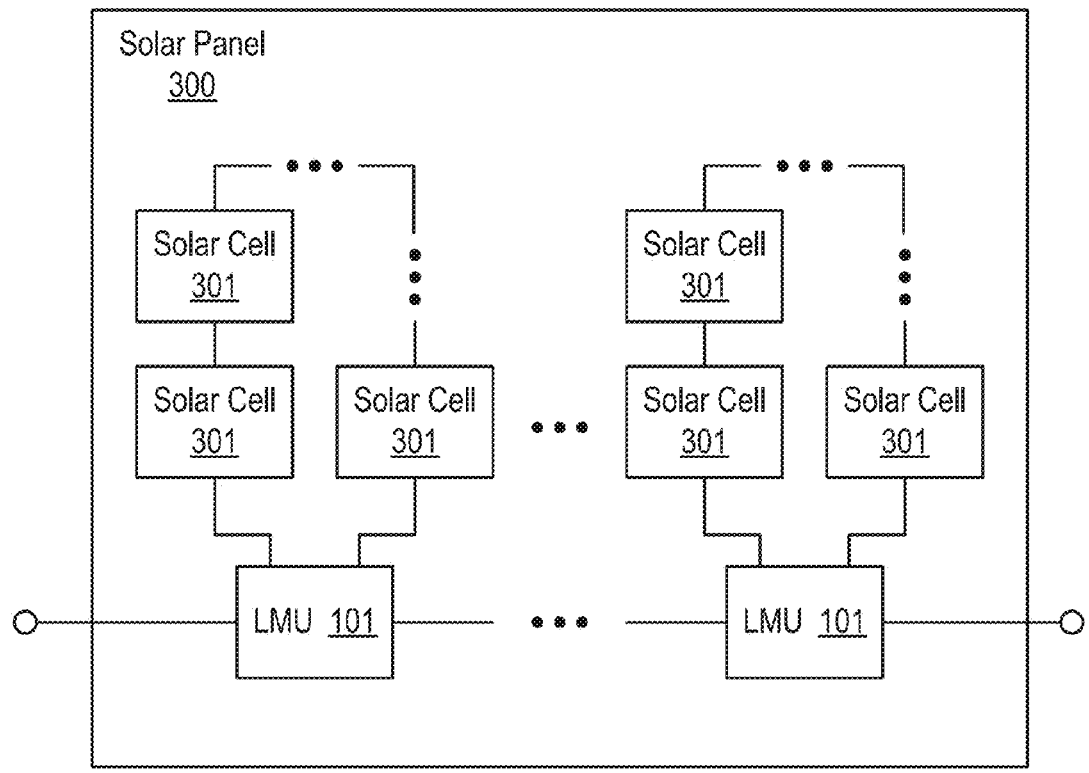
FIG. 5 illustrates a solar panel according to one embodiment.

FIG. 5 illustrates a solar panel according to one embodiment. In one embodiment, the solar panel (300) has a few strings of solar cells (e.g., three solar cell strings per module). In FIG. 5, a local management unit (101) can be applied to a group of cells (301) within a string of an individual solar panel (300), or in some cases to each cell (301) in a solar panel (300).

In FIG. 5, a group of solar cells (301) that are attached to a local management unit (101) can be connected to each other in series, in parallel, or in a mesh configure. A number of local management units (101) connect the groups of the solar cells (301) in a string to provide output for the solar panel (300).

Some embodiments of the disclosure include methods to determine the duty cycles and/or phases for local management units connected to a string or mesh of solar modules.

In some embodiments, the duty cycle of all local management units in a string or mesh can be changed, to increase or decrease the string voltage. The duty cycles can be adjusted to avoid exceeding the maximum voltage allowed. For example, the maximum voltage can be limited by the combiner box (206), the inverter (203), or any other load connected to the string bus (205), or limited by any regulations applicable to that system. In some embodiments, the duty cycles are adjusted to align the voltage of multiple strings.

In some embodiments, the duty cycle of one local management unit (101) in a string can be changed to cause higher current in that local management unit (101) and overall higher power harvesting.

In one embodiment, the duty cycles are computed for the solar modules that are connected to a string via the corresponding local management units. The duty cycles can be calculated based on the measured current and voltages of the solar modules and/or the temperatures.

After an initial set of duty cycles is applied to the solar modules, the duty cycles can be further fine tuned and/or re-adjusted to changes, such as shifting shading etc., one step a time, to improve power performance (e.g., to increase power output, to increase voltage, to increase current, etc.). In one embodiment, target voltages are computed for the solar modules, and the duty cycles are adjusted to drive the module voltage towards the target voltages.

The methods to compute the duty cycles of the solar modules can also be used to compute the duty cycles of the groups of solar cells within a solar module.

Figure 6:
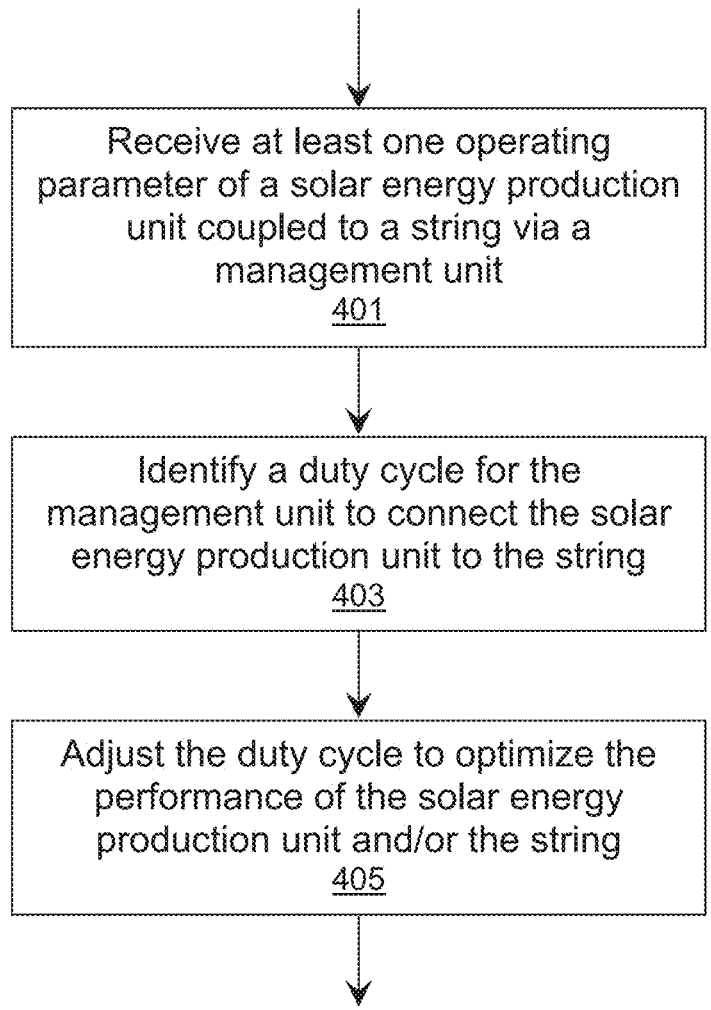
FIGS. 6-8 show methods to improve performance of a photovoltaic system according to some embodiments.
Figure 7:
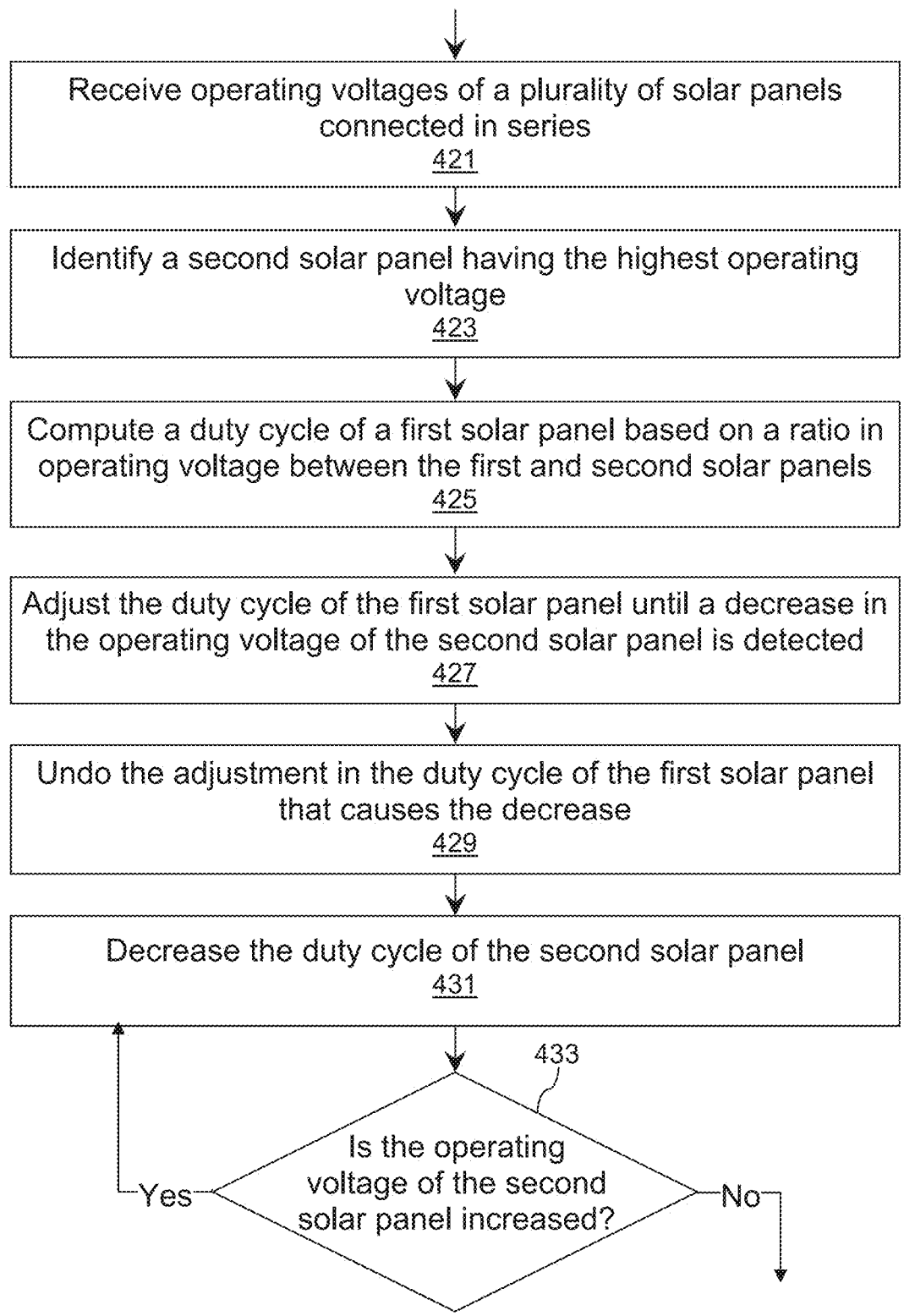
Figure 8:
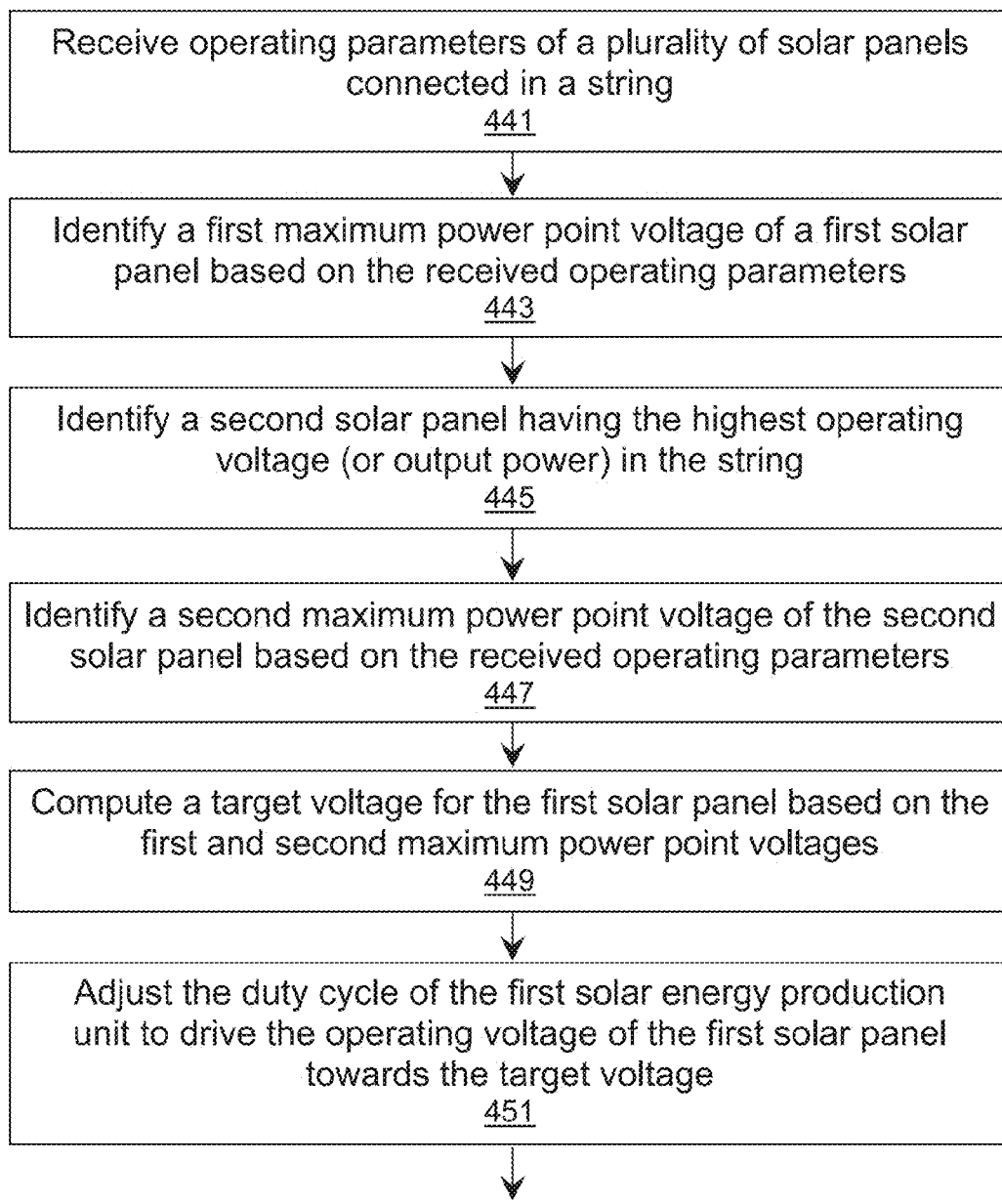

FIGS. 6-8 show methods to improve performance of a photovoltaic system according to some embodiments.

In FIG. 6, at least one operating parameter of a solar energy production unit coupled to a string via a management unit is received (401) and used to identify (403) a duty cycle for the management unit to connect the solar energy production unit to string. The solar energy production unit can be a solar module, a group of solar cells within a solar module, or a single solar cell in a string in a solar module. The duty cycle is adjusted (405) to optimize the performance of the solar energy production unit and/or the string.

For example, the duty cycle can be adjusted to increase the current in the string and/or the solar energy production unit, to increase the output power of the string and/or the solar energy production unit, to increase the voltage of the solar energy production unit, etc.

In FIG. 7, the operating voltages of a plurality of solar panels connected in series are received (421) and used to identify (423) a second solar panel having the highest operating voltage (highest output power) in the string.

In FIG. 7, a duty cycle of a first solar panel is computed (425) based on a ratio in operating voltage between the first and second solar panels. Alternatively, the duty cycle can be computed based on a ratio in output power between the first and second solar panels. Alternatively, the duty cycle can be computed based on a ratio between the first and second solar panels in estimated/computed maximum power point voltage. Alternatively, the duty cycle can be computed based on a ratio between the first and second solar panels in estimated/computed maximum power point power.

The duty cycle of the first solar panel is adjusted (427) to improve the performance of the first solar energy production unit and/or the string, until a decrease in the operating voltage of the second solar panel is detected. For example, the duty cycle of the first solar panel can be adjusted to increase the total output power of the string, to increase the current of the string, to increase the current of the first solar panel, to drive the voltage of the first solar panel towards a target voltage, such as its maximum power point voltage estimated based on its current operating parameters, such as temperature or a voltage calculated using its estimated maximum power point voltage.

In FIG. 7, in response to the detected decrease in the operating voltage of the second solar panel which had the highest operating voltage, the adjustment in the duty cycle of the first solar panel that causes the decrease is undone/reversed (429).

In FIG. 7, the duty cycle of the second solar panel is optionally decreased (431) to increase the operating voltage of the second solar panel. In some embodiments, the strongest solar panel (or strong panels within a threshold from the strongest panel) is not switched off line (e.g., to have a predetermined duty cycle of 100%).

In one embodiment, the duty cycle of the second solar panel is repeatedly decreased (429) until it is determined (431) that the decrease (429) in the duty cycle of the second solar panel cannot increase the voltage of the second solar panel.

In FIG. 8, operating parameters of a plurality of solar panels connected in a string are received (441) and used to identify (443) a first maximum power point voltage of a first solar panel. A second solar panel having the highest operating voltage (or output power) in the string is identified. A second maximum power point voltage of the second solar panel is identified (447) based on the received operating parameters and used to compute (449) a target voltage for the first solar energy production unit. In one embodiment, the target voltage is a function of the first and second maximum power point voltages and the highest operating voltage identified (445) in the second solar panel in the string. The duty cycle of the first solar energy production unit is adjusted to drive the operating voltage of the first solar panel towards the target voltage.

Alternatively, the target voltage can be set as the first maximum power point voltage of the first solar panel.

In one embodiment, to adjust voltage a same factor is applied to all modules in that string. For example, in a case of a first module A1 that is producing only 80%, and the voltage of the whole string needs to be 5% lower, the duty cycle of A1 is 80% multiplied the duty cycle applied to the whole string (which is Y in this example) so module A1 then has Y×0.8 as duty cycle.

In some embodiments, the system management unit (204) and/or the local management units (e.g., 202a, 202b, . . . , 202n) are used solely or in combination to determine the parameters to control the operations of the switches.

For example, in one embodiment, a system management unit (204) is the "brain" of the system, which decides on the duty cycle and phase parameters.

For example, in another embodiment, each local management unit broadcasts information to the other local management units on the string to allow the individual local management units to decide their own duty cycle and phase parameters.

In some embodiment, a local management unit can instruct one or more other local management units to adjust duty cycle and phase parameters. For example, the local management units on a string bus (205) can elect one local management unit to compute the duty cycle and phase parameters for other local management units on the string.

For example, in some embodiment, the system management unit (204) can determine one or more global parameters (e.g., a global duty cycle, the maximum power on the string, the maximum voltage on the string, etc.), based on which individual local management units adjust their own duty cycles.

In some embodiments, a local management unit can effectively self manage and determine its own duty cycles without relying upon communicating with other management units. For example, the local management unit can adjust its duty cycle for connecting its solar module to the string to operate the solar module at the maximum power point. No local management unit is in control over the system, and each adjusts its own duty cycle (and thus, its power and voltage.)

In one embodiment, module voltages are measured by the local management units in the same string at substantially/approximately the same time and used to identify the strongest solar module. A strongest solar module provides the most power in the string. Since the modules are connected in series, the solar module having the highest module voltage in the string can be identified as the strongest solar module. In some embodiment, the operating voltage and current of the solar module are measured to determine the power of the solar module.

Additional approaches can be implemented to control the voltage, power output, or the efficiency of one or more strings of solar module controllers as described above. In some embodiments, a system controller management unit controls the operation of a plurality of local management units in one or more strings. In some embodiments, one or more local management units control the operation of a plurality of local management units in one or more strings. In some embodiments, the local management unit can only control its own operation, or can control the operation of itself and other local management units in the same string.

One or more local management units in a string can have the capability to control the operation of other local management units in the same string. In one embodiment, a single local management unit can be selected to be a controlling local management unit to control a plurality of panels in a string. The controlling local management unit in a string can be selected using any suitable protocol. In one embodiment, in a string of local management units, the first local management unit that announces its intent to take control of other modules in the string could become the controlling local management unit.

In one embodiment, to improve power output by a string, one or more local management units can each receive module voltage from all local management units in the same string and identify the strongest local management unit (i.e., the one with the maximum power and voltage). Each local management unit can then set its own duty cycle as a function of the received voltage.

In one embodiment, after the highest module voltage Vm in the string is identified, the duty cycle for each module can be computed as a function of a ratio between the module voltage V of the module and the highest module voltage Vm. For example, the duty cycle for a module can be computed as $1-((Vm-V)/Vm)=V/Vm$. In one embodiment, a particular local management unit receives the voltages of all other local management units at the same time or substantially same time (e.g., all voltages are received within an interval of less than one second.)

In one embodiment, the system management unit (204) can identify the highest module voltage from the module voltages received from the local management units (202a, 202b, . . . , 202n), and compute the duty cycles for the corresponding local management units (202a, 202b, . . . , 202n).

In one embodiment, the local management units (202a, 202b, . . . , 202n) can report their module voltages on the string bus (205) to allow individual local management units (202a, 202b, . . . , 202n) to identify the highest module voltage and compute the duty cycles, without relying upon the system management unit (204).

In one embodiment, one of the local management units (202a, 202b, . . . , 202n) can identify the highest module voltage and/or compute the duty cycles for the other local management units (202a, 202b, . . . , 202n).

In one embodiment, the duty cycles are determined and/or adjusted periodically (e.g., every 30 seconds). The intervals can take into account various environmental factors (e.g., where shadows on a solar panel are cast on different parts of the panel over the course of a day).

In one embodiment, after the duty cycles for the solar modules on the string are set based on the module voltage ratio relative to the highest module voltage in the string, the duty cycles can be fine-tuned to increase the power performance. The duty cycles can be fine-tuned one step a time, until a decrease of voltage of the module with the highest power is detected. In response to the detected decrease, the last change that caused the decrease can be reversed (undone). The fine tuning of the duty cycles can be used to reach the peak performance point (e.g., for maximum power point tracking).

In one embodiment, after the strongest module is identified, the duty cycles of the solar modules on the string are adjusted until the module with the highest power in the string decrease its voltage. Since decreasing the duty cycle of a solar module decreases the time period the module is connected to the string and thus increases its voltage, the duty cycle of the module with the highest power in the string can be decreased to increase its voltage, in response to the decrease in its voltage caused by the adjustment to the duty cycles of other solar modules on the string. For example, the duty cycle of the module with the highest power in the string can be decreased until its voltage is maximized.

The performance of solar modules can vary significantly with temperature. A system capable of measuring temperature can implement methods for controlling the voltage, power output, or the efficiency of one or more strings of solar module controllers using module temperature as a factor. In one embodiment, the local management unit measures module and ambient temperatures for some methods to determine the duty cycles. For example, the operating parameters measured at the local management units (e.g., 202a, 202b, . . . , 202n), such as module temperature, can be used to compute the estimated voltages of the solar modules at their maximum power points. For example, a formula presented by Nalin K. Gautam and N. D. Kaushika in "An efficient algorithm to simulate the electrical performance of solar photovoltaic arrays," Energy, Volume 27, Issue 4, April 2002, pages 347-261, can be used to compute the voltage Vmp of a solar module at the maximum power point. Other formulae can also be used. Once the maximum power point voltage Vmp of a solar module is computed or estimated, the duty cycle of the solar module connected to a string can be adjusted to drive the module voltage to the computed/estimated maximum power point voltage Vmp, since decreasing the duty cycle of a solar module normally increases its voltage.

In one embodiment, a local management unit can adjust the duty cycle of the solar module connected to the local management unit to change the module voltage to the computed/estimated maximum power point voltage Vmp, without having to communicate with other management units.

In one embodiment, a local management unit (or a system management unit) can adjust the duty cycle of the solar module connected to the local management unit to perform maximum power point tracking.

In one embodiment, after identifying the strongest module and computing/estimating the maximum power point voltage Vmpm of the strongest module, the duty cycle for each module on a string can be computed as a function of a ratio between the maximum power point voltage Vmp of the module and the maximum power point voltage Vmpm of the strongest module. For example, the duty cycle for a module can be computed as 1−((Vmpm−Vmp)/Vmpm)=Vmp/Vmpm. The duty cycle can be periodically updated, based on the current operating parameters measured, and/or fine tuned until a decrease in the voltage of the strongest module is detected.

Alternatively, a target voltage for each module on the string can be computed as a function of a ratio between the maximum power point voltage Vmp of the module and the maximum power point voltage Vmpm of the strongest module. For example, the target voltage for a module can be computed as Vm×Vmp/Vmpm, where Vm is the measured voltage of the strongest module. The duty cycle of the module can be changed to drive the module voltage of the module towards the target voltage.

In one embodiment, after identifying the strongest module and computing/estimating the maximum power point power Pmpm of the strongest module, the duty cycle for each module on a string can be computed as a function of a ratio between the maximum power point power Pmp of the module and the maximum power point power Pmpm of the strongest module. For example, the duty cycle for a module can be computed as 1−((Pmpm−Pmp)/Pmpm)=Pmp/Pmpm. The duty cycle can be periodically updated, based on the current operating parameters measured, and/or fine-tuned until a decrease in the voltage of the strongest module is detected, since decreasing the duty cycle normally increases the module voltage.

In one embodiment, a target voltage for each module on the string can be computed as a function of a ratio between the maximum power point power Pmp of the module and the maximum power point power Pmpm of the strongest module. For example, the target voltage for a module can be computed as Vm×Pmp/Pmpm, where Vm is the measured voltage of the strongest module. The duty cycle of the module can be changed to drive the module voltage of the module towards the target voltage, since decreasing the duty cycle normally increases the module voltage.

In one embodiment, the duty cycle for each local management unit is changed to increase the current of the solar module attached to the local management unit (e.g., based on the measurement of the voltage and current of the solar module), until the maximum current is achieved. This method assumes that string maximum power can be achieved with some accuracy by driving each local management unit to maximum current. In one embodiment, the voltages and currents of the solar modules are measured for tuning the duty cycles for maximum power point tracking for the string. The measurements of the voltages and currents of the solar modules also enable the local management units to additionally serve as a module level monitoring system.

The duty cycles can be adjusted by the system management unit (e.g., 204) based on the measurements reported by the local management units (e.g., 202a, 202b, . . . , 202n), or adjusted directly by the corresponding local management units (e.g., 202a, 202b, . . . , 202n).

In one embodiment, during the process of setting and/or tuning the duty cycles, the maximum power point tracking operation by the inverter (203) is frozen (temporarily stopped). Light intensity at the solar modules is monitored for changes. When the light intensity at the solar modules stabilizes, the voltage and current of the solar modules are measured for the determination of the duty cycles. Then normal operation resumes (e.g., unfreezing of maximum power point tracking operation).

In one embodiment, the local management units measure the voltages and currents of the solar modules to determine the power of the solar modules. After identifying the highest power Pm of the solar module on the string, the duty cycles of the solar modules on the string are determined by the power ratio relative to the highest power Pm. For example, if a module produces 20 percent less power, it will be disconnected from the string bus about 20 percent of the time. For example, if a module produces power P, its duty cycle can be set to 1−((Pm−P)/Pm)=P/Pm.

In one embodiment, a predetermined threshold is used to select the weak modules to apply duty cycles. For example, in one embodiment, when a module produces power less than a predetermine percent of highest power Pm, a duty cycle is calculated and applied to the solar module. If the module is above the threshold, the module is not disconnected (and thus having a duty cycle of 100%). The threshold can be based on the power, or based on the module voltage.

In one embodiment, the system management unit (204) finds the duty cycles for the local management units (202a, 202b, . . . , 202n) and transmits data and/or signals representing the duty cycles to the local management units (202a, 202b, . . . , 202n) via wires or wireless connections. Alternatively, the local management units (202a, 202b, . . . , 202n) can communicate with each other to obtain the parameters to calculate the duty cycles.

In one embodiment, the system management unit (204) knows all the different duty cycles indicated for the local management units (202a, 202b, . . . , 202n).

In one embodiment, during power fine tuning, the system management unit (204) sends the appropriate data/signal to the appropriate local management units (202a, 202b, . . . , 202n), and then the system management unit (204) calculates the total power of the string and corrects the duty cycle to produce maximum power. Once maximum power is achieved, the duty cycles for the local management units (202a, 202b, . . . , 202n) can be saved in a database and serve as a starting point for the corresponding local management units (202a, 202b, . . . , 202n) at the same time of day on the next day. Alternatively, a local management can store the duty cycle in its memory for the next day.

The stored duty cycles can be used when there is a fixed shade on the modules, such as a chimney, a tree, etc., which will be the same shade on any day at the same time. Alternatively, historical data may not be saved, but can be recalculated from scratch on each run, for example every 30 minutes.

In one embodiment, the light intensity at the solar modules is monitored for changes. The duty cycles are calculated when the light intensity does not change significantly. If there are changes in sun light radiation at the solar modules, the system will wait until the environment stabilizes before applying or adjusting the duty cycles.

In one embodiment, the system management unit (204) can communicate with the inverter as well. When the environment is not stable (e.g., when the sun light radiation is changing), the inverter can stop maximum power point tracking. In such a situation, the inverter can be set up for its load, instead of tracking for maximum power point. Instead of using the inverter to perform maximum power point tracking, the system management unit (204) and the local management units (202a, 202b, . . . , 202n) are used to set the operating parameters and balance the string.

Alternatively, when the environment is not stable but measurements and calculation are done faster than the MPPT is working, there can be no need to stop the MPPT on the inverter. Alternatively, when the environment is not stable, measurements can be taken few times for the same radiation until a stable result is achieved.

Many variations can be applied to the systems and methods, without departing from the spirit presented in the disclosure. For example, additional components can be added, or components can be replaced. For example, rather than using a capacitor as primary energy store, an inductor can be used, or a combination of inductor and capacitor. Also, the balance between hardware and firmware in the micro controllers or processors can be changed. In some cases, only some problematic modules can have a local management unit, for example in a shaded or partially shaded or otherwise different situation. In yet other cases, local management units of strong modules can be virtually shut off. The methods for determining the duty cycles for the solar modules can also be used to determine the duty cycles of groups of cells connected via local management units in a string within a solar panel/module.

Figure 9:
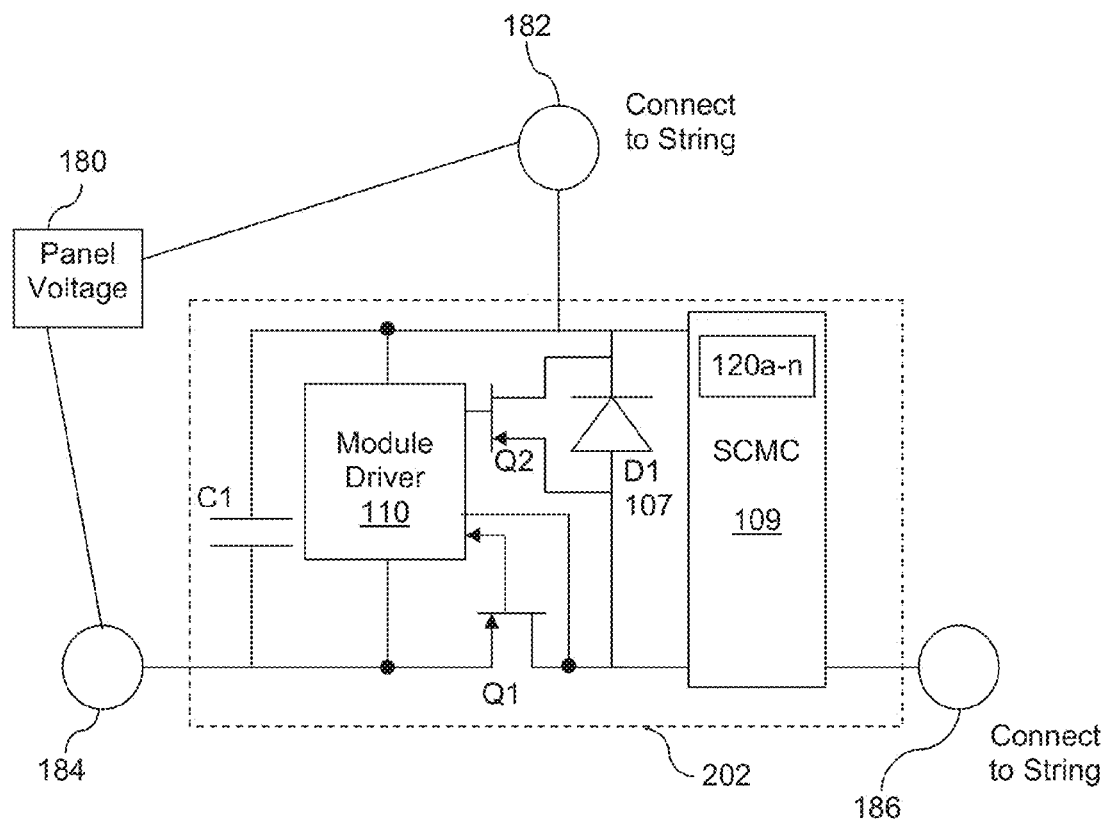
FIG. 9 illustrates a local management unit according to one embodiment.

FIG. 9 shows an overview of a local management unit (202x) that is modified from the local management unit (101) discussed above in relation to FIG. 3B. In FIG. 9, local management unit (202x) contains a single chip micro controller (SCMC) (109). In one embodiment, all of the features and details of the local management units discussed above apply to the local management unit (202x) and are not repeated for purposes of clarity. In one embodiment, some of the features and details of the local management units discussed above selectively apply to the local management unit (202x) and are not repeated for purposes of clarity. The module driver (110) is connected in parallel with the capacitor C1, and is also connected between the switches Q1 and Q2. The micro controller (109) contains various operating parameters regarding the local management unit (202x), such as the voltage, current, etc. The micro controller (109) can run suitably programmed software (120a-n) to modulate the chopping frequency of the switches Q1 and Q2. The switches Q1 and Q2 perform a duty cycle according to the formula calculated as previously described. A duty cycle would result in minor variations from cycle to cycle (i.e., in the inter cycle) that can be used to encode using MFM (modified frequency modulation), Manchester-type encoding, or other suitable time-delay type encoding technique with or without additional error correction. As discussed further below, the approach of modulating, for example, the PWM inter cycle would allow a receiver (301) at the end of the string bus (205) to measure the different variations of each of the local management units. Also, the local management units each can have a slightly different base frequency so that their respective harmonics would not cover each other, although they would move in a similar range. This approach has the added benefit of reducing overall EMI of the system.

Figure 10A:
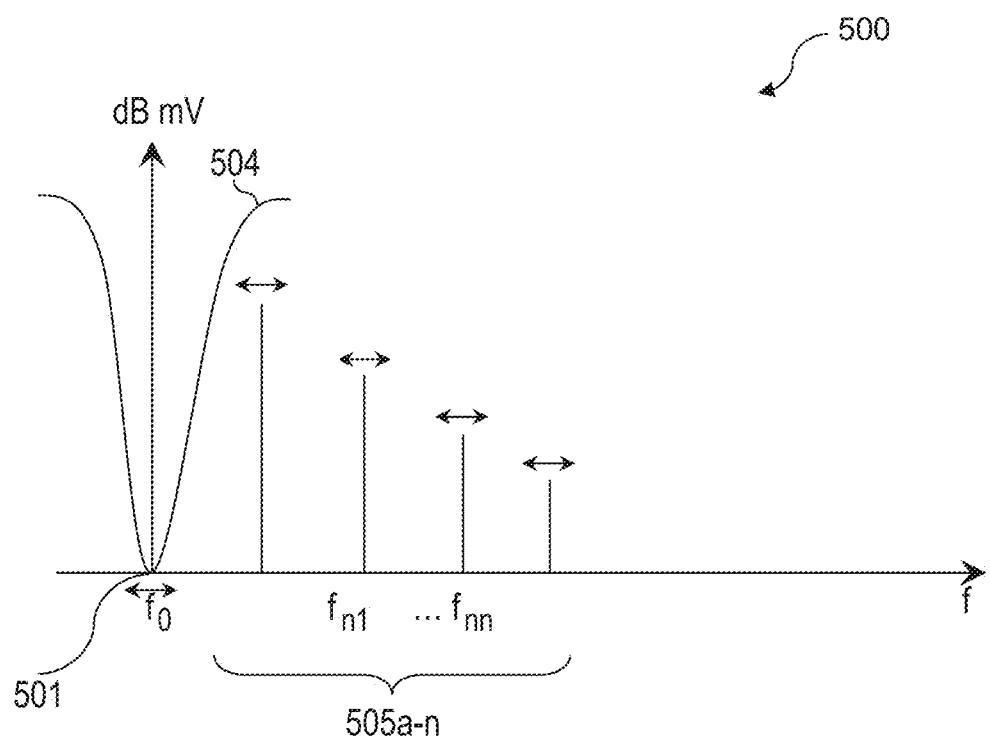
FIG. 10A is a plot of carrier frequency for a local management unit according to one embodiment.

FIG. 10A is a plot of the upper half of a frequency spectrum (500) of a carrier frequency (501) for a particular local management unit. The frequency spectrum (500) shows the harmonics fn1-fnn as elements (505a-n). Arrows above the harmonics fn1-fnn (505a-n) indicate they wobble around with the variations in pulse width modulation from cycle to cycle. Also shown is a notch filter curve (504), which can be used to remove significant noise to avoid EMI problems in the system and to comply with FCC and other regulatory agency regulations as needed.

Figure 10B:
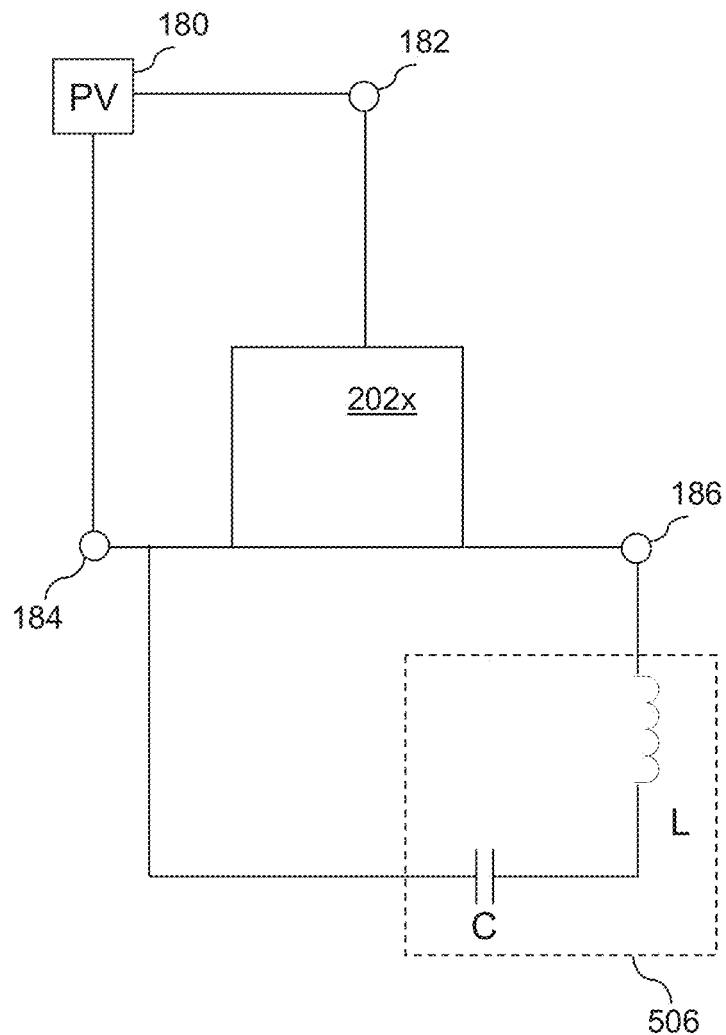
FIG. 10B illustrates a subsystem including a local management unit according to one embodiment.

FIG. 10B shows an overview of a subsystem (510) that includes the local management unit (202x), the panel voltage (180), terminals (182, 184, 186), and a notch filter (506). In one embodiment, the notch filter (506) includes an inductor Ln and a capacitor Cn. The notch filter (506) acts as a low pass filter and relies on the internal capacity of the single chip micro controller (SCMC) of the local management unit (202x). A notch frequency of the notch filter (506) sits on the switching frequency to suppress noise. In one embodiment, additional or different filters can be used.

Figure 11A:
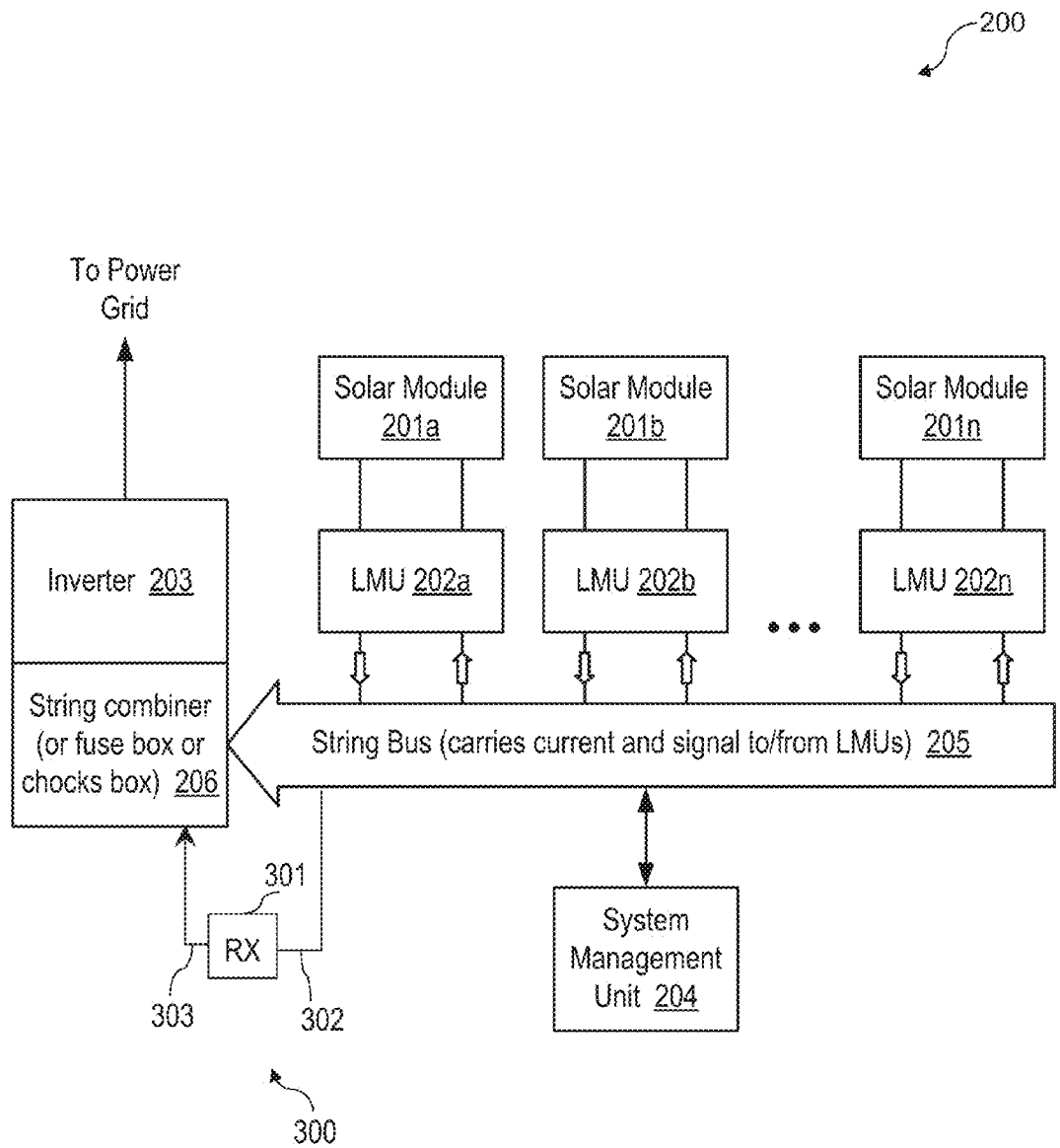
FIG. 11A illustrates a photovoltaic system according to one embodiment.

FIG. 11A shows an overview of a system (200) with a string bus (205) similar to that of system (200) previously discussed in relation to FIG. 4A. In FIG. 11A, a receiver subsystem (300) is a receiving portion of a modem associated with a head end to receive modulated signals from local management units, as described in more detail below. The receiver subsystem (300) includes a receiving path separate from the string bus (205) and the combiner box (206) so that the modulated signals from the local management units can be recovered before provision to the combiner box (206) and significant noise therein. The receiver subsystem (300) includes a receiver (301), a sensing line (302), and a data output line (303). The sensing line (302) is connected to the string bus (205) and the data output line (303) connects to the combiner box (206). In one embodiment, the subsystem (300) can be inside the inverter (203). In one embodiment, the subsystem (300) is contained in the combiner box (206). The subsystem (300) is shown external to the combiner box (206) in FIG. 11A for purposes of clarity.

Figure 11B:
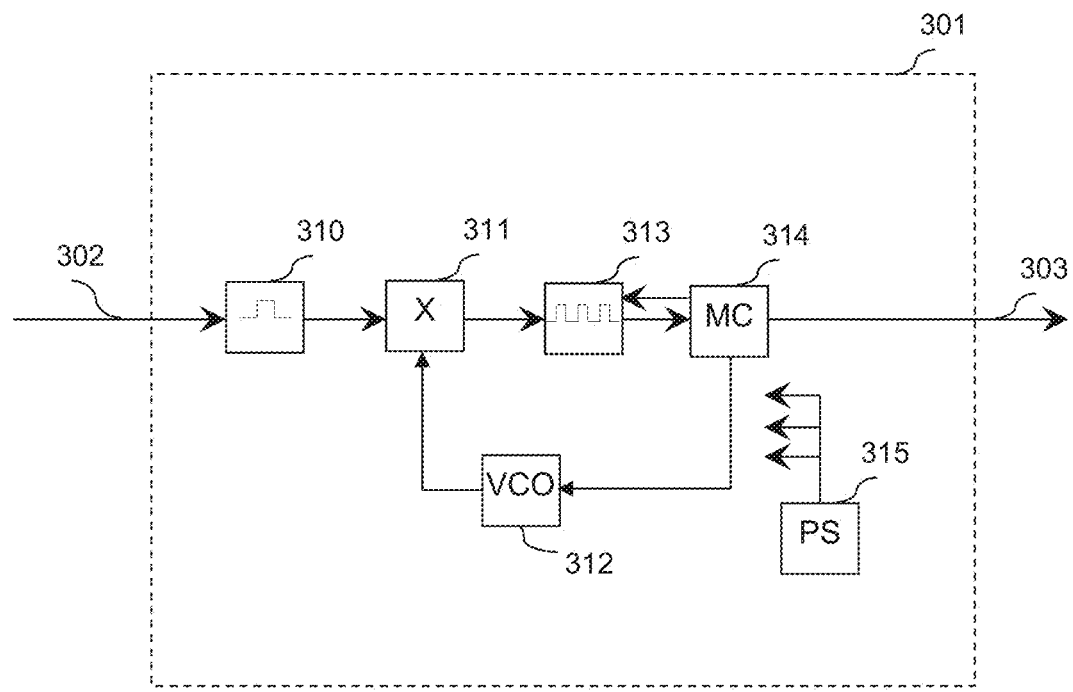
FIG. 11B illustrates a receiver of a photovoltaic system according to one embodiment.

FIG. 11B shows the receiver (301). The receiver (301) includes a band pass filter (310), a mixer (311), a beat oscillator (VCO) (312), a multiband pass filter (313), a microcontroller (314), and a power supply (315). Data from the local management unit arrives over the power bus 205 via sensing line (302), and then passes through the band pass filter (310) to improve signal-to-noise ratio. The mixer (311) mixes the output of the band pass filter (310) and the output of the VCO (312). The output of the mixer (311) is then applied to the multiband pass filter (313), where the signal is analyzed in multiple band, frequency, and time domains. The output of the multiband pass filter (313) is analyzed by the microcontroller (314). The power supply (315) can receive power from the string bus (205) or from the inverter (203) and provide it to the various elements of the receiver (301).

In one embodiment, the receiver (301) can manage communications from all the local management units. In one embodiment, each local management unit can have its own receiver. In one embodiment, a receiver can be implemented in hardware (HW) only. In one embodiment, a digital radio can be used as the receiver, in which case an analog to digital converter (ADC) samples the signals and all the processing is done in a microcontroller or a digital signal processor using software (SW), or any combination of SW and HW.

Figure 12:
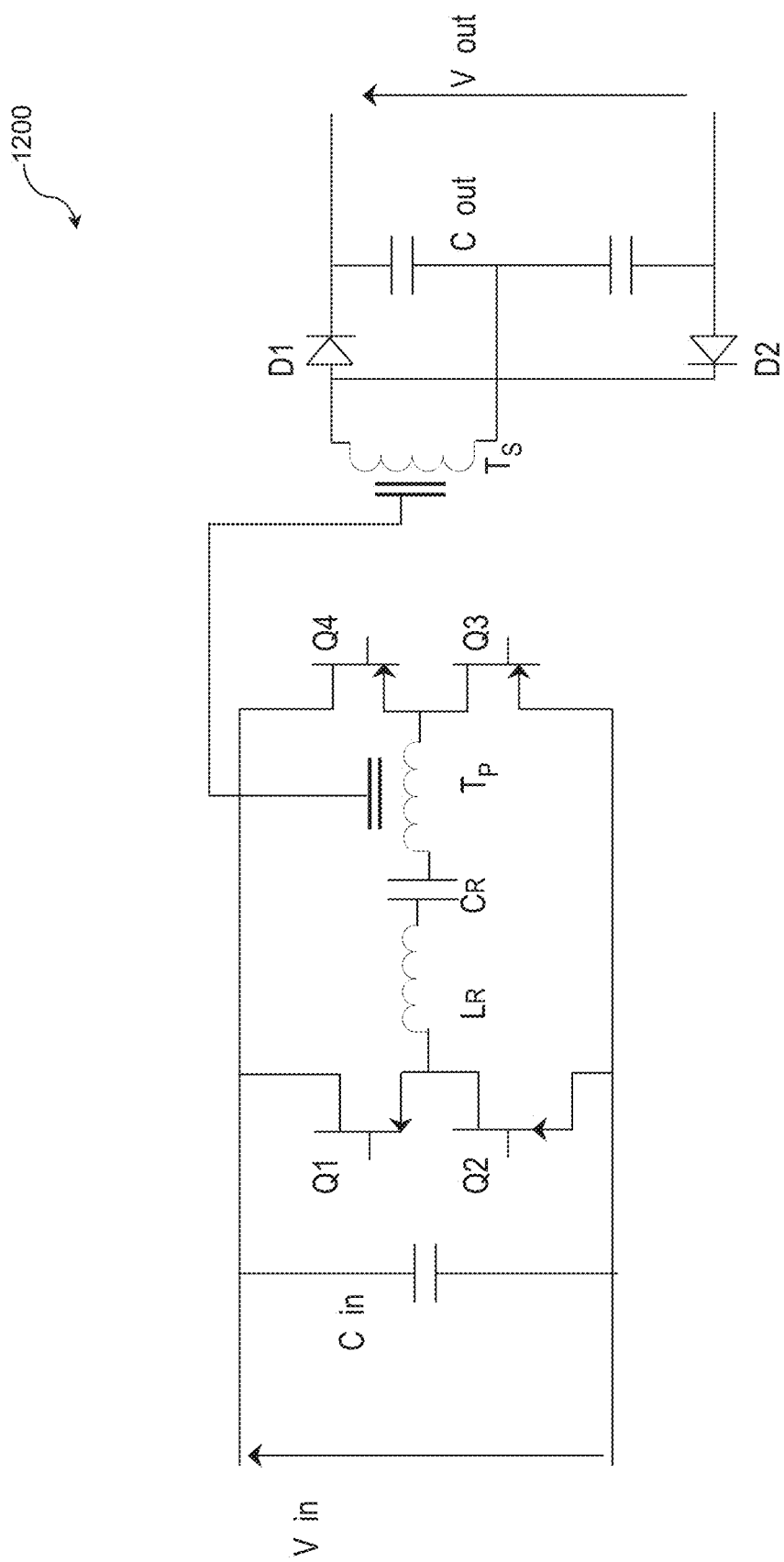
FIG. 12 illustrates a local management unit according to one embodiment.

FIG. 12 shows a novel topology of a local management unit (1200) as a distributed converter and remaining aspects of the local management unit (1200), as discussed above, are not shown for purposes of clarity. In the energy production or photovoltaic system, the local management unit (1200) in FIG. 12 can be used alternatively to the local management units discussed above. The local management unit (1200) is a series-resonant converter with phase shift operation for light load operation. The local management unit (1200) includes capacitor Cin, switches Q1, Q2, Q3, Q4, inductor LR, capacitor CR, transformer having a primary winding Tp coupled to a secondary winding Ts, diodes D1, D2, and two capacitors Gout. A typical range of input voltage Vin for the local management unit (1200) is the standard panel voltage of Vmp plus or minus 20%. Output voltage Vout of the distributed converter is a fixed value of 375V plus or minus a few percentage points.

In operation, switch Q1 and switch Q2 are controlled oppositely, and switch Q3 and switch Q4 are controlled oppositely. When switch Q1 is on, switch Q3 is on. When switch Q2 is on, switch Q4 is on. The current can be increased or decreased by adjusting switches Q1, Q2, Q3, Q4. A controller (not shown), suitably connected to a power supply, controls the operation of the switches Q1, Q2, Q3, Q4. In one embodiment, the controller can be off the shelf and possibly modified. In one embodiment, the controller can have analog circuitry. In one embodiment, the controller can be a microcontroller. In one embodiment, the controller could be a combination of these features. As discussed below, a phase shift can be created between the currents controlled by the switches Q1, Q2, Q3, Q4. The inductor LR and the capacitor CR constitute an LC (or tank) circuit. The primary winding Tp of the transformer T is coupled to the secondary winding Ts. Diode D1, diode D2, and capacitor Cout constitute a Delon rectifier circuit. In a positive cycle, diode D1 charges the upper capacitor of capacitor Cout. In a negative cycle, diode D2 charges the lower capacitor of the capacitor Cout. Vout is effectively two times the voltage across the secondary winding Ts of the transformer T.

The local management unit (1200) requires a reliable current limit because it is required to charge a large input capacitance reflected from the inverter (203). The local management unit (1200) needs to allow operation with low input and output capacitance, because reliability does not allow the use of aluminum capacitors due to their limited life expectancy. In many instances aluminum may not be suitable for the local management unit (1200) for reasons of reliability.

Efficiency of the novel topology of the local management unit (1200) should be higher than 96 percent at the range of 20 percent to 100 percent load. The topology of the local management unit (1200) should allow direct control of input impedance for smooth MPPT control, and should minimize the need for damping networks (i.e., snubbers) in order to limit EMI emissions to improve reliability and maximize efficiency. Further, the transformer should be protected from saturation. Isolation voltage must be higher than 2000V, and switching losses reduced (i.e., zero current switching/zero voltage switching). No load condition is to be defined during inverter turn on.

Figure 13:
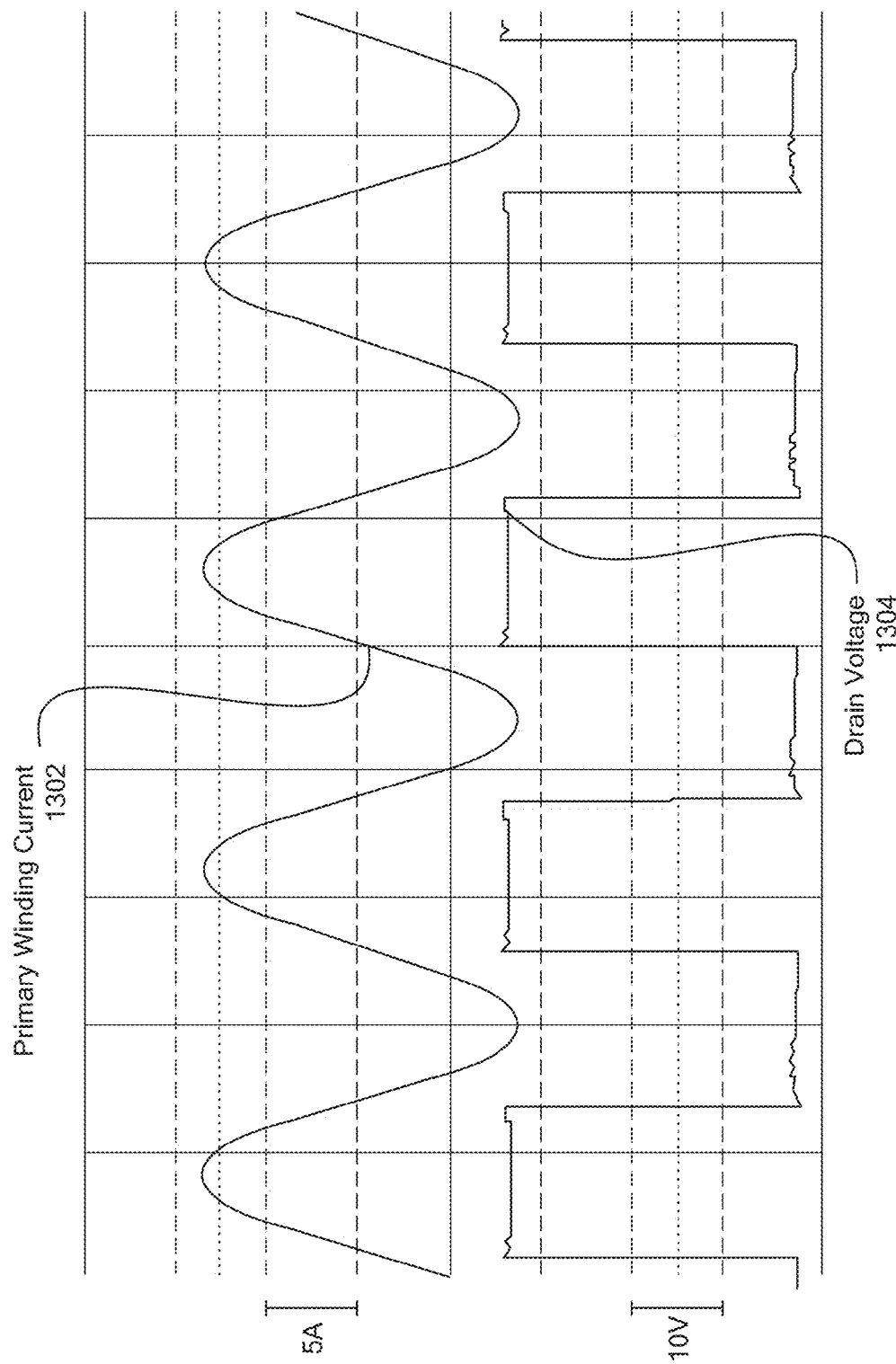
FIGS. 13-18 illustrate operation of the local management unit illustrated in FIG. 12.

The local management unit (1200) achieves the aforementioned performance goals. FIGS. 13 through 18 illustrate waveforms to show performance of the local management unit (1200) and the reduction of snub voltage transients without resort to a snubber network in the local management unit (1200). In FIG. 13, waveform 1302 shows the current through the primary winding Tp of the transformer T and waveform 1304 shows the drain voltage at the switch Q1 at the MPPT point. The waveform 1304 shows ringing on the square wave for only approximately two and a half waves at approximately one volt peak-to-peak.

Figure 14:
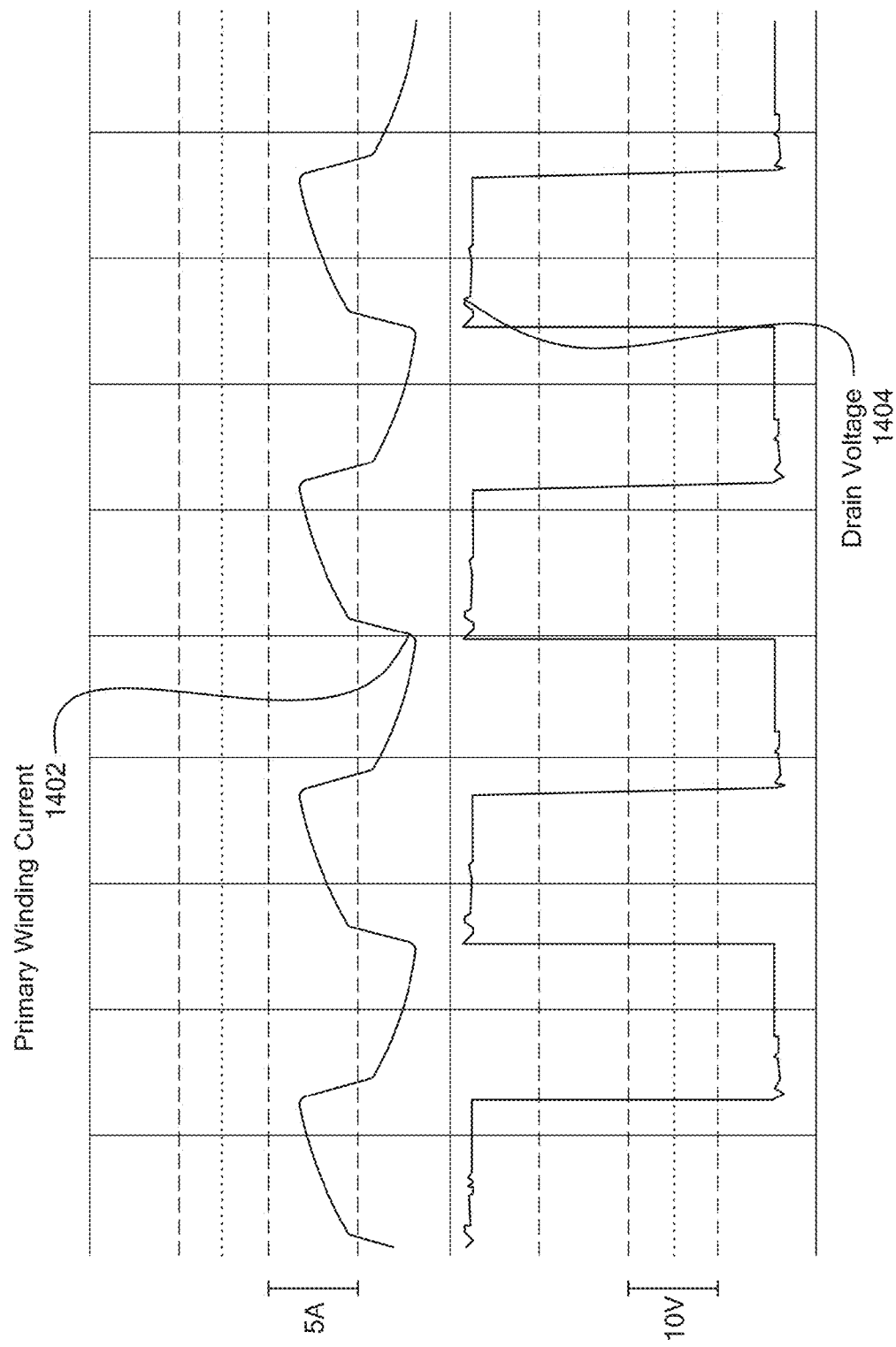

In FIG. 14, waveform 1402 shows the current through the primary winding Tp of the transformer T and waveform 1404 shows the drain voltage at the switch Q1 at 30 percent load.

Figure 15:
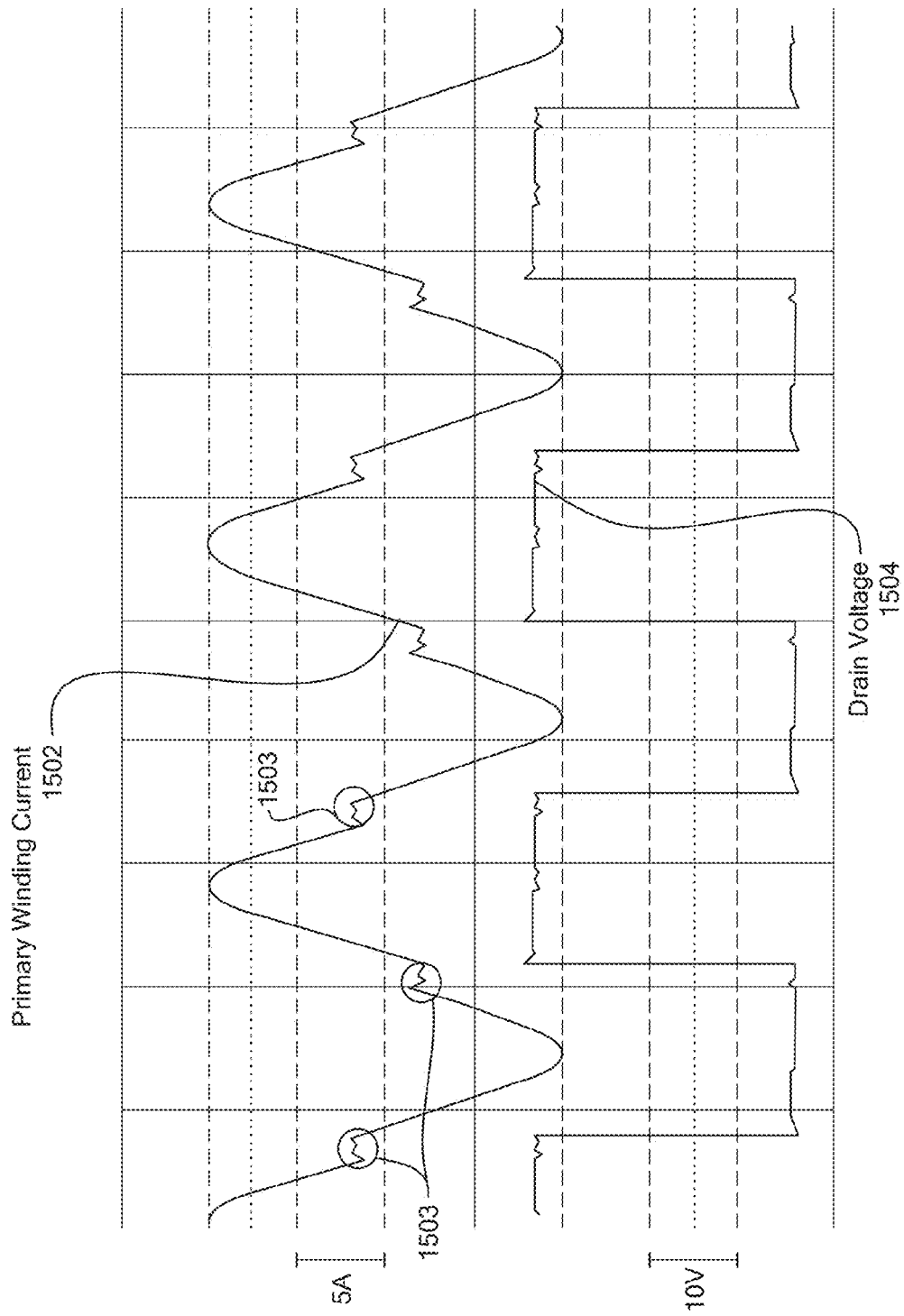

FIG. 15 shows low input voltage at full load condition. In FIG. 15, waveform 1502 shows the current through the primary winding Tp of the transformer T and waveform 1504 shows the drain voltage at the switch Q1 at full load condition. Steps (1503) in the waveform 1502 result from a phase shift between switches. The steps (1503) results is reduced undershoot and overshoot in the waveform 1504.

Figure 16:
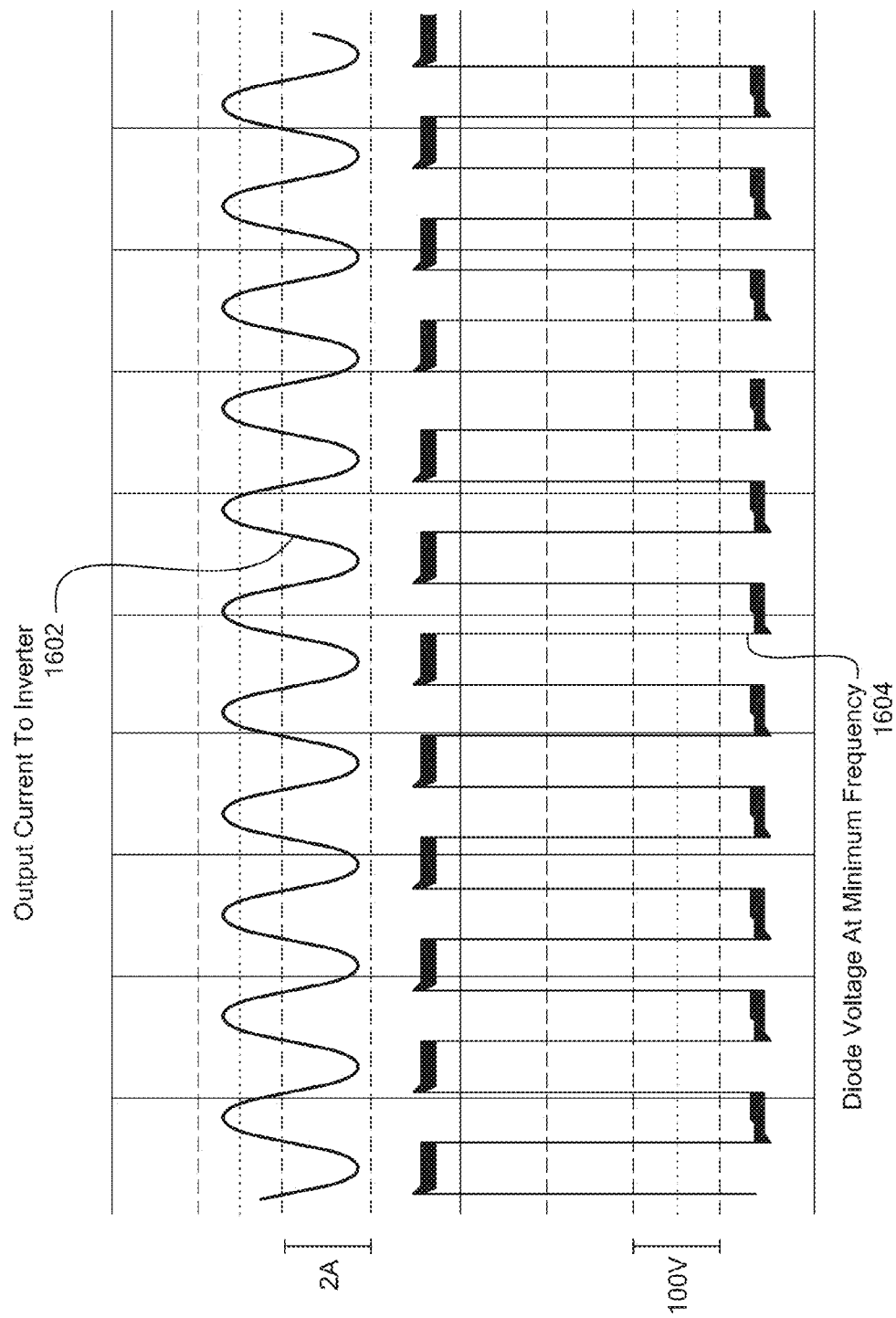

FIG. 16 shows output diode voltage at resonant frequency at maximum load. In FIG. 16, waveform 1602 shows the output current from the local management unit (1200) to the inverter (203) and waveform 1604 shows diode D1 (or diode D2) voltage at minimum frequency.

Figure 17:
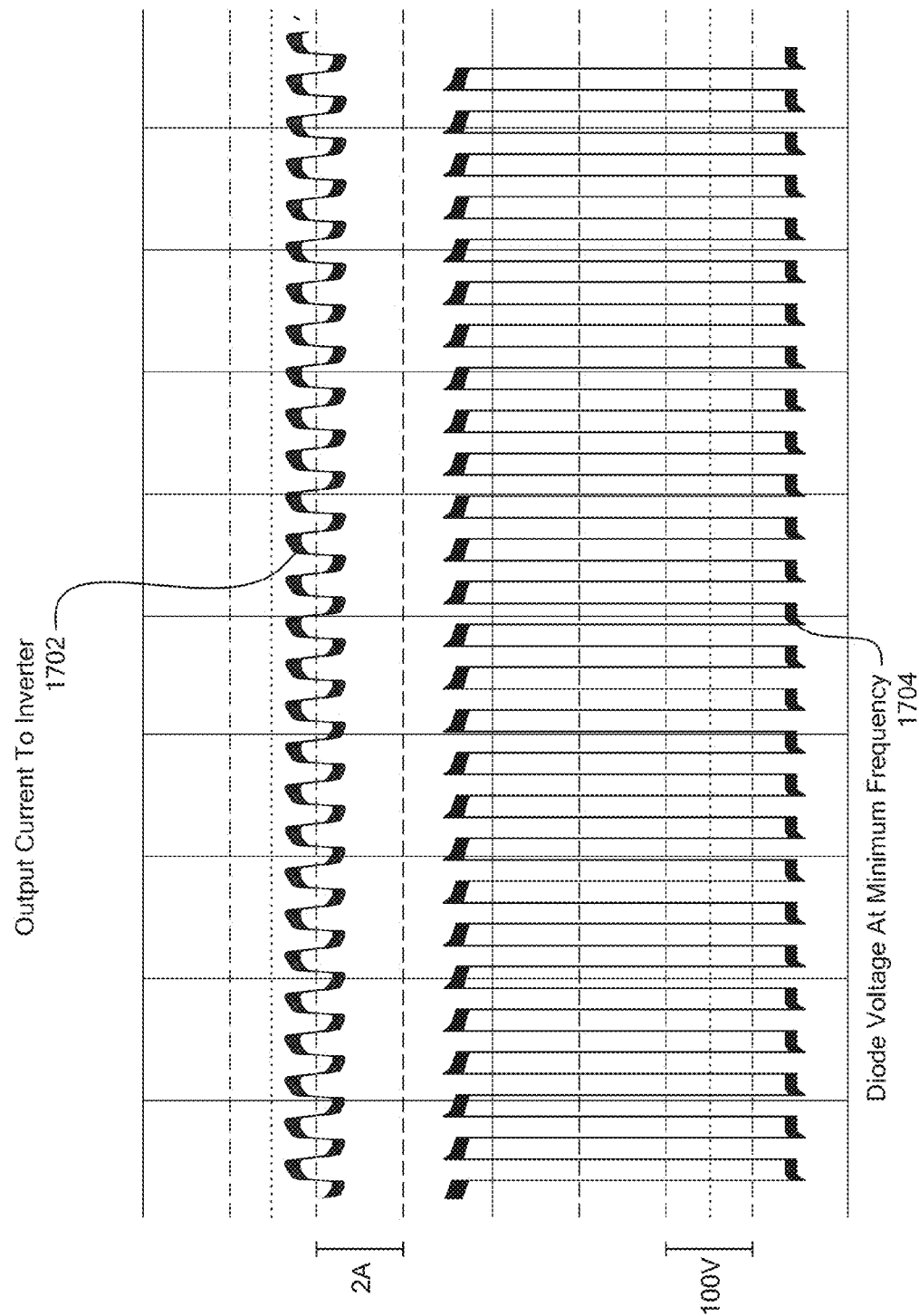

FIG. 17 shows typical output diode voltages at medium loads. In FIG. 17, waveform 1702 shows the output current from the local management unit (1200) to the inverter (203) and waveform 1704 shows diode D1 (or diode D2) voltage at minimum frequency.

For loads higher than 15 percent of the maximum load, switches Q1, Q3 are operated together at 50 percent duty cycle, while switches Q4, Q2 are operated together at 50 percent duty cycle with no phase shift. Input power is controlled by changing operating frequency of the local management unit (1200) above and below the resonant frequency. Turn ratio of the primary winding Tp and secondary winding Ts is set according to MPPT voltage because at this voltage efficiency is at the highest point (i.e., zero voltage, zero current is achieved). For other frequencies, switching is performed at zero voltage because there is current in the primary winding Tp and resonant tank that is maintained, and this current causes voltage shift that allows turn-on to be performed at zero voltage.

Below 15 percent of load, the local management unit (1200) is operated in phase shift mode. In phase shift mode, switches Q1, Q2 are reversed, and switches Q3, Q4 are reversed. However, a phase shift causes switches Q3 and Q4 to conduct together part of the time, and likewise for switches Q1, Q4. A phase shift operation allows no load and light load control. As shown in, for example, FIG. 15, steps 1503 in the waveform 1502 are caused by the phase shift. The phase shift range and frequency range are optimized for maximum efficiency by the local management unit (1200). The switches (primary transistors) do not have off spike because they are clamped to the input bus. The phase shift minimizes ringing (and overshoot and undershoot), which in turn increases efficiency, reduces EMI, and reduces heat losses. Secondary diodes D1, D2 are connected in center tap configuration to prevent voltage spikes from developing across them during turn-off and eliminating need for clamping components.

As shown in FIG. 16, a phase shift between the switches, as described above, causes a reduction in undershoot and overshoot in the diode D1 voltage without implementation of snubber networks. As a result, efficiency of the local management unit (1200) is improved both on the switch side and the diode side. In one embodiment, efficiency is improved on each side by approximately 1-2%.

In the local management unit (1200), a resonant tank provides a limit to the current through the primary winding Tp. A serial capacitor CR prevents transformer saturation.

Output rectifier voltage is clamped to output voltage Vout allowing the use of 600V ultra fast diodes. There are no spikes across the switching transistors. Transformer parameters act as part of resonant tank. Input voltage range and efficiency are optimized for solar module operation by transformer turn ratio and transformer small air gap. Resonant frequency controls input impedance, which is the required control parameter for the application of separate solar modules operating against a fixed voltage inverter load in the system.

Figure 18:
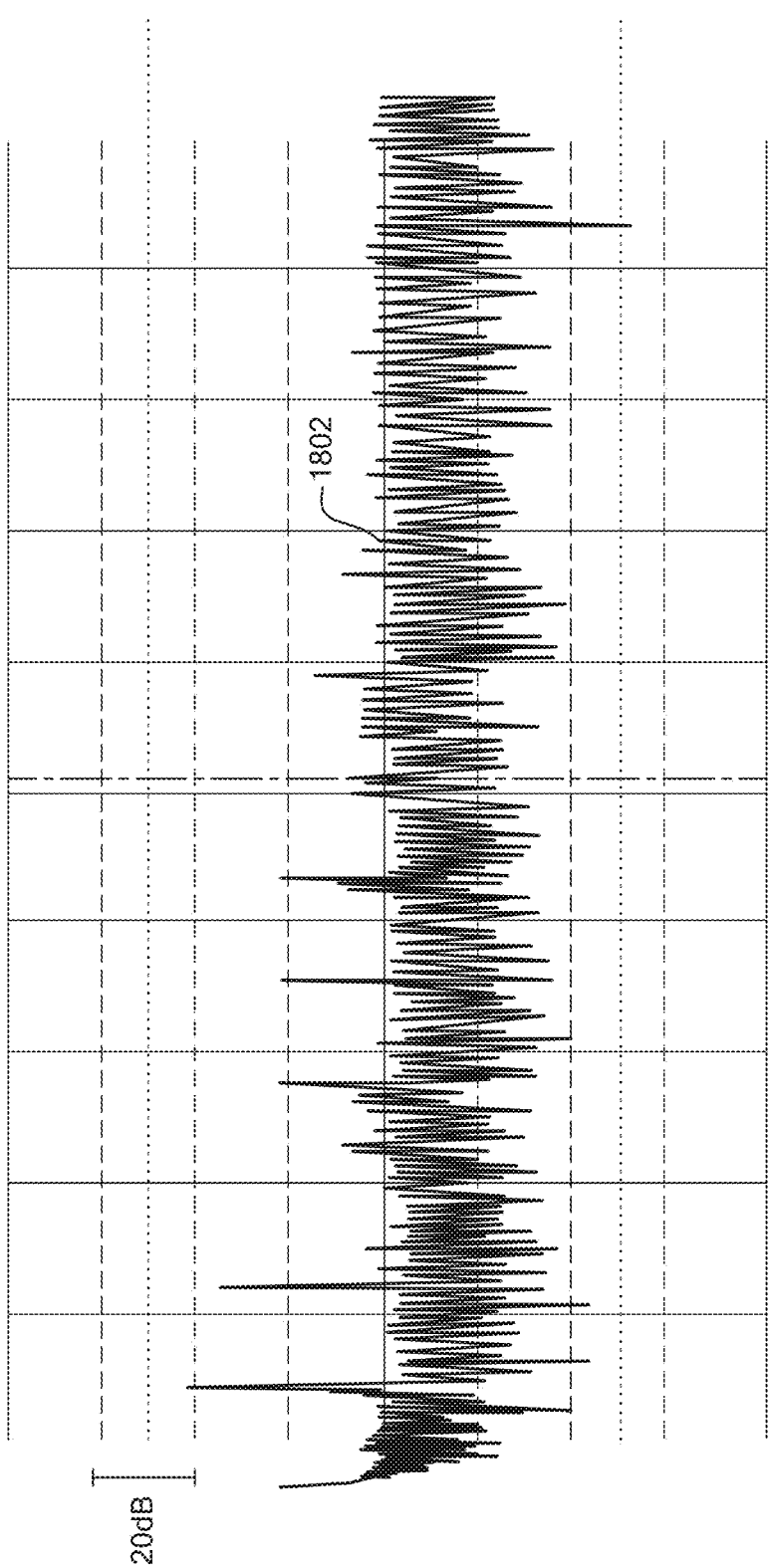

FIG. 18 shows a spectral waveform (1802) of typical emission characteristics of the local management unit (1200). Current ripple of the local management unit (1200) is measured with a current probe. Most of the current ripple comes from the inverter (203). In one embodiment, the inverter (203) is an off the shelf item. From the spectral waveform (1802), it can be seen that data transmission is possible but needs to be in the same level or higher level than the noise level. It can be seen that the maximum noise level value is approximately 35 dB. Switching frequency is clearly seen and can be detected in the spectral waveform (1802).

Figure 19:
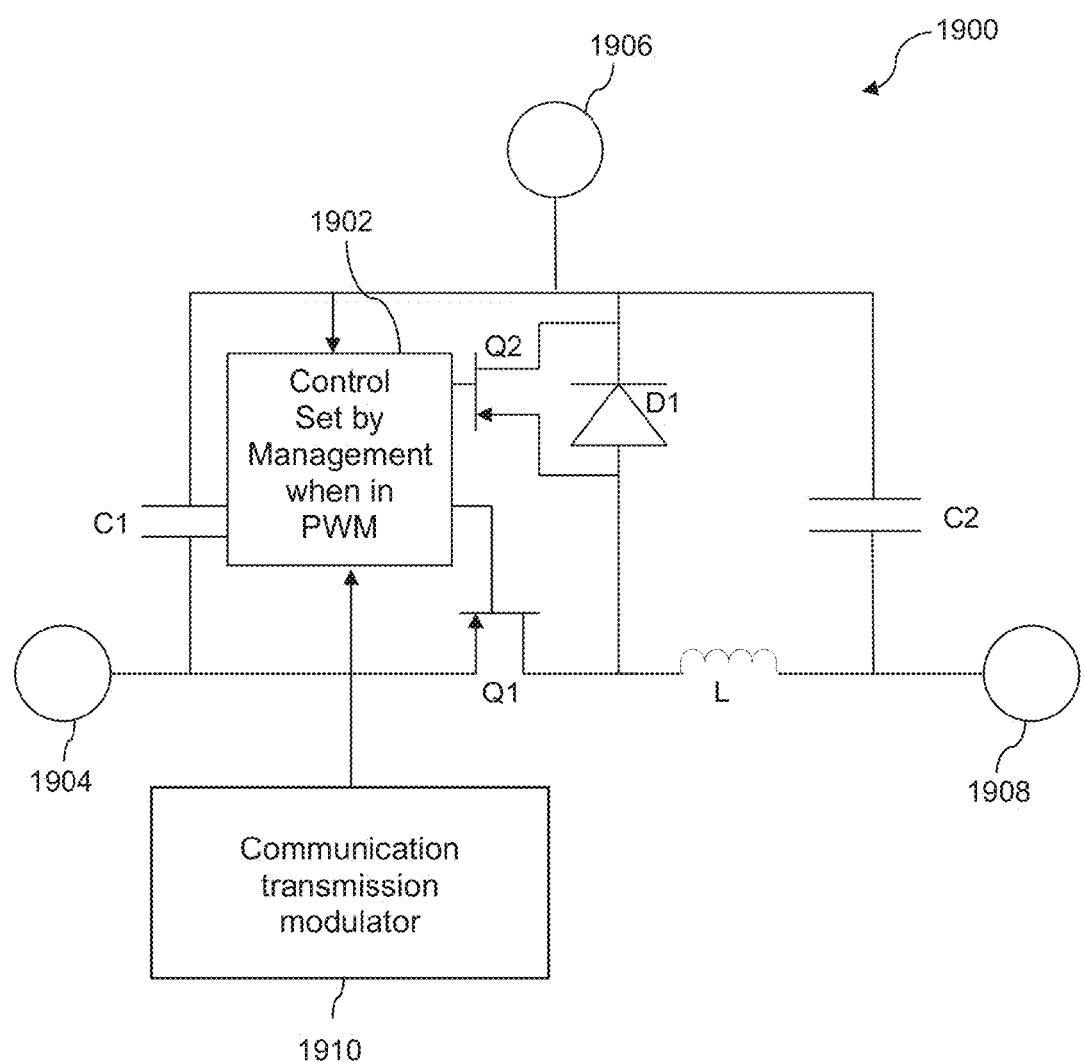
FIG. 19 illustrates a local management unit and transmission modulator according to one embodiment.

FIG. 19 shows a local management unit (1900) that can be used in accordance with one embodiment. The local management unit (1900) can be used in place of the local management units discussed above. The local management unit (1900) includes a capacitor C1, switches Q1, Q2, diode D1, inductor L, capacitor C2, controller 1902, terminals 1904, 1906, 1908, and communication transmission modulator 1910. Operation of the local management unit (1900) is similar to the operation of the local management units, as discussed above. Data transmission by the local management unit (1900) involves modulating the switching frequency of the local management unit (1900) and transferring data by using the solar module itself as power amplifier (PA).

Operation of the local management units in FIGS. 1-3B and FIG. 12 involve pulse width modulation (PWM), as discussed above. The PWM technique creates noise, as shown in, for example, FIG. 18. The created noise can be modulated to transmit data over the string bus (205) from a solar module (or slave node) to a head unit (master) in the energy production or photovoltaic system. The use of noise in this way avoids the need to provide a costly separate, dedicated communications channel from the solar module to the head unit.

The communication transmission modulator (1910) modulates switching of the pulse width modulation (PWM) operation to transmit data from the local management unit (1900). Various modulation encoding schemes can be used, such as, for example, modified FM (MFM) and Manchester coding. In one embodiment, another modulating and encoding scheme can be used. In one embodiment, the communication transmission modulator (1910) represents the transmission portion of a modem (not shown) that is associated with the local management unit (1900). In one embodiment, the communication transmission modulator (1910) is part of the local management unit (1900). In one embodiment, the communication transmission modulator (1910) is external to the local management unit (1900).

This system allows the use of full duplex (two-way) communications. The receiver at the module side can be implemented within the module circuitry. The limitation of transmit and receive within same circuit does not exist. Transmission from management unit can be used to synchronize modules. Reliability is not affected by transmission. The effect on overall performance is very small because the transmission duty cycle from the module is low.

Weak solar modules in a string bus, and weak string buses in a solar array can bring down the total output power of the solar array. A weak string may produce less current, voltage, and/or power than other strings because one or more solar modules in the string are either partially/wholly in shade or are malfunctioning (or for other reasons). Traditional solar arrays may not be able to overcome this problem since the output of individual solar modules and string buses may not be controllable independently of other solar modules and string buses. The systems and methods herein disclosed monitor and adjust individual solar module outputs such that weak solar modules are balanced with strong solar modules in a string bus, and strong string buses are balanced with weak string buses in a solar array. Once balancing within string buses and between string buses has been accomplished, an inverter using maximum power point tracking (MPPT) can determine the maximum power point for the solar array.

Strong string buses are within a threshold voltage of a string output voltage of a strongest string, and weak string buses are not within the threshold voltage of a string output voltage of a strongest string. The strongest string bus operates at a higher voltage than the other string buses. The weakest string bus operates at a lower voltage than the other string buses.

Figure 27:
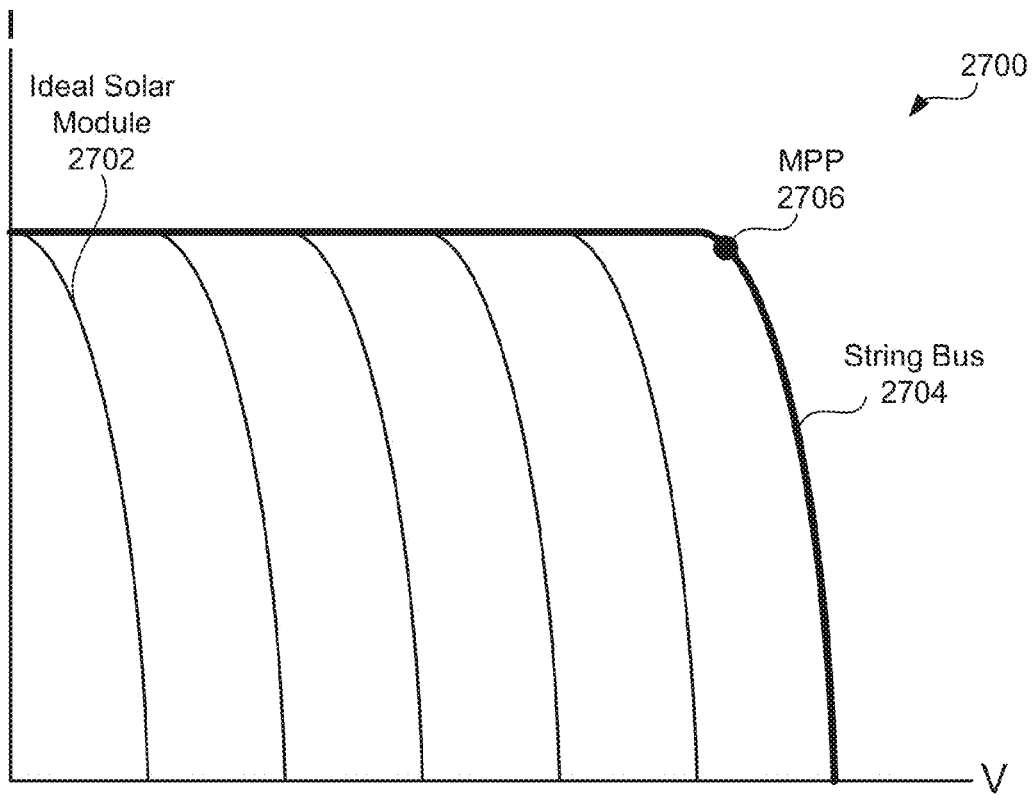
FIG. 27 illustrates an I-V curve for a string bus where all solar modules (2702) are operating at their ideal outputs.

Three I-V curves for a string bus will now be used to describe balancing solar modules on a string bus. FIG. 27 illustrates an I-V curve (2700) for a string bus where all solar modules (2702) are operating at their ideal outputs. There are six solar modules (2702) in the illustrated string bus. A string bus I-V curve (2704) is derived from a composite of all six ideal solar module I-V curves (2702). The voltage of the string bus (2704) is derived by adding the voltages provided by each solar module (2702). The MPP (2706) is the point on the string bus I-V curve (2704) where current times voltage is maximized.

Figure 28:
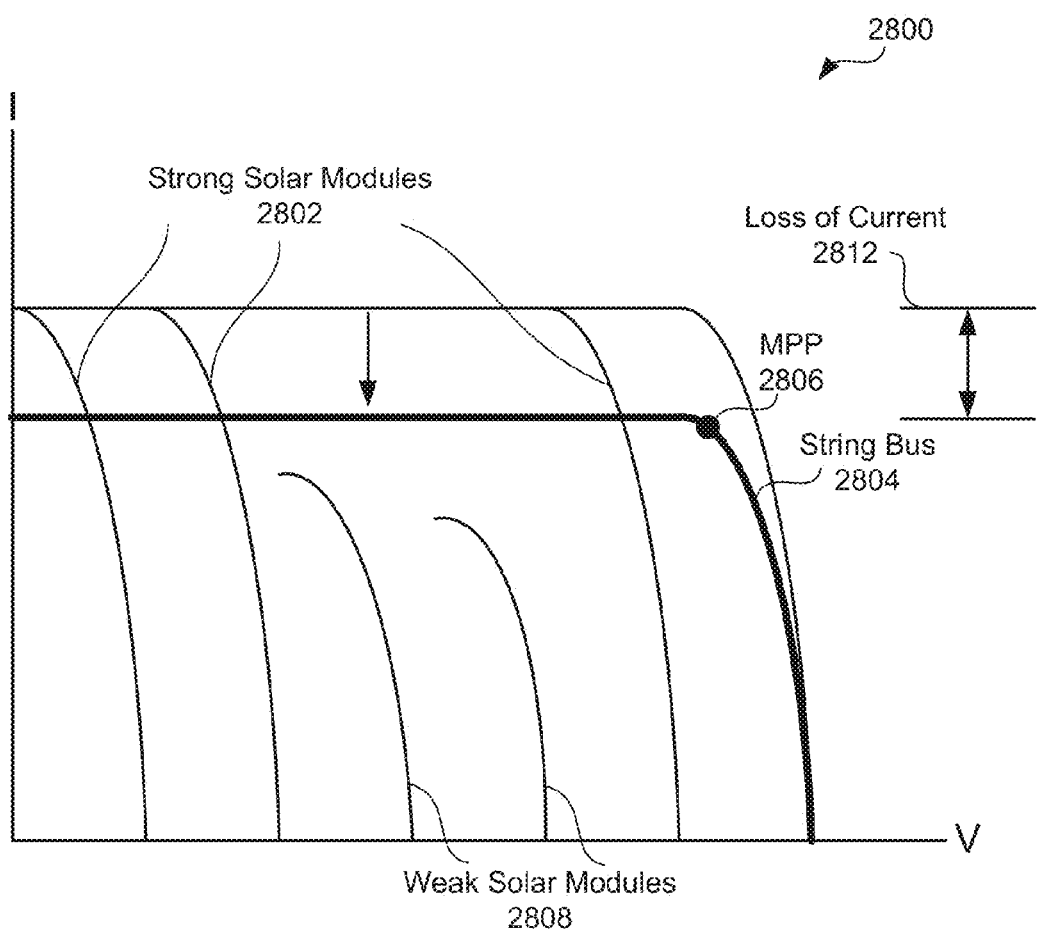
FIG. 28 illustrates an I-V curve for a string bus where two solar modules are operating as weak solar modules.

FIG. 28 illustrates an I-V curve (2800) for a string bus where two solar modules are operating as weak solar modules. The weak solar modules (2808) produce the same voltage as the strong solar modules (2802), but cannot produce as large of currents. The string bus sees a loss of current (2812), since the string bus (2804) cannot produce the maximum current of the strong solar modules (2802). The MPP (2806) is lower than that seen in the ideal string bus illustrated in FIG. 27. In this operating region, the strong solar modules (2902) are operating at maximum voltage, but are incapable of operating at their maximum current. The string bus is thus producing less energy than what it is capable of.

Figure 29:
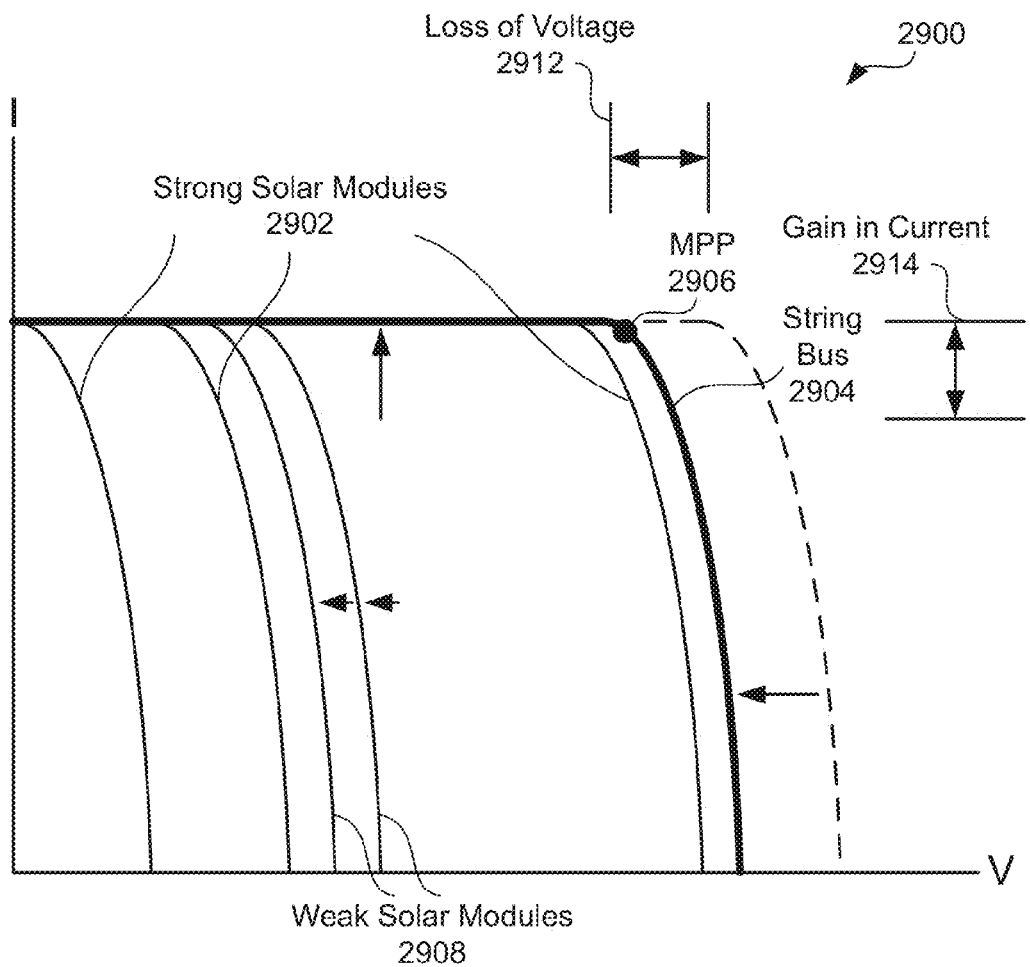
FIG. 29 illustrates an I-V curve for a string bus implementing the systems and methods of this disclosure.

FIG. 29 illustrates an I-V curve (2900) for a string bus implementing the systems and methods of this disclosure. The voltage of the two weak solar modules (2908) can be decreased, which in turn increases their current. The voltage can be decreased until the current balances with the current from the strong solar modules (2902). This is what is meant by balancing solar modules on a string bus. As a result, the string bus voltage output decreases by a small value (2912) equal to the decrease in voltage for the two weak solar modules (2908). However, the string bus current rises by a larger value (2914) to the level of what the strong solar modules (2902) are capable of producing. The maximum power produced from the MPP (2906) of this I-V curve (2900) is greater than the maximum power produced when the weak solar modules are holding down the current of the strong solar modules (FIG. 28). Stated differently, the sacrifice in voltage is more than compensated for by the increased current.

Figure 30:
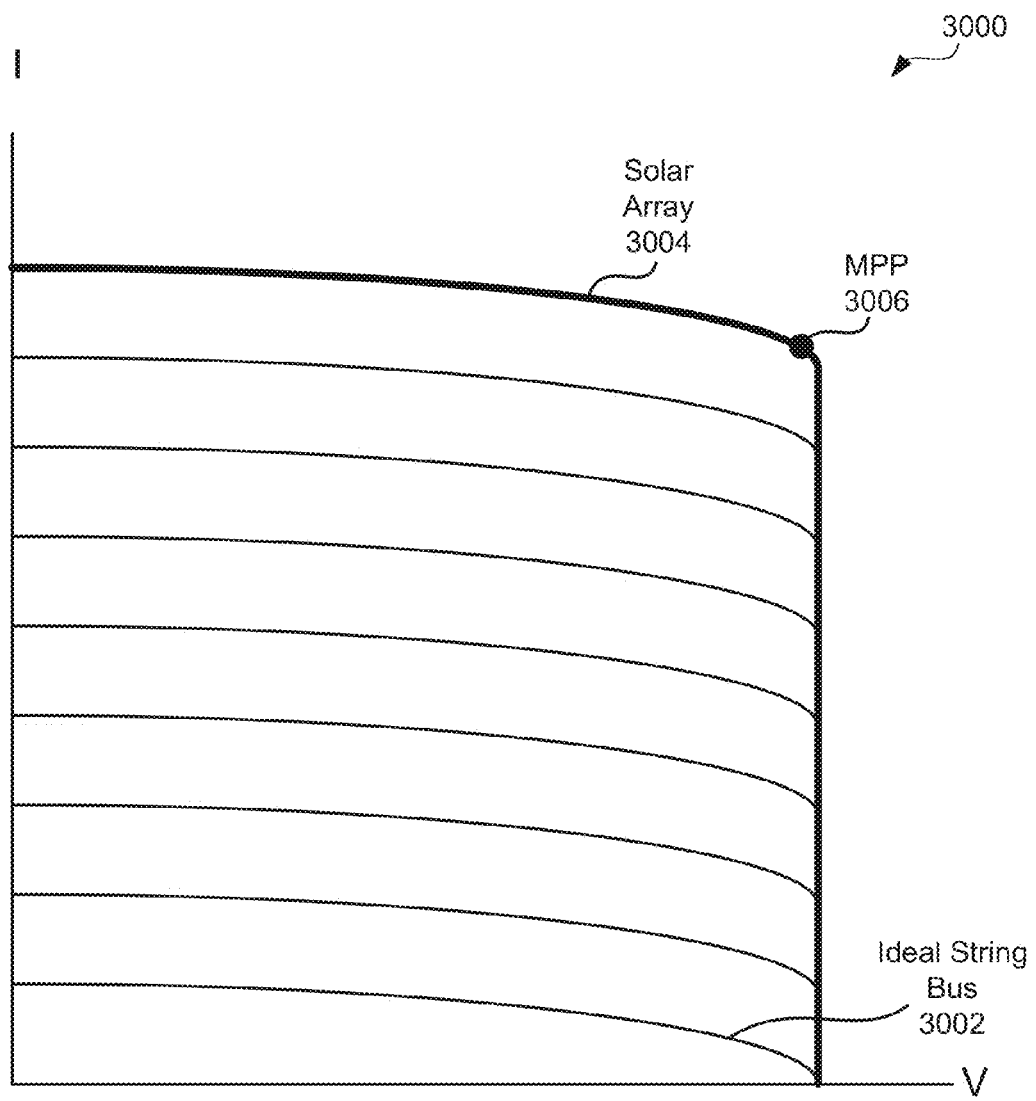
FIG. 30 illustrates an I-V curve for a solar array where all string buses (3002) are operating at their ideal outputs.

Three I-V curves for a solar array will now be used to describe balancing string buses in a solar array. FIG. 30 illustrates an I-V curve (3000) for a solar array where all string buses (3002) are operating at their ideal outputs. There are nine string buses (3002) in the illustrated solar array. A solar array I-V curve (3004) is derived from a composite of all nine ideal string bus I-V curves (3002). The current of the solar array I-V curve (3004) is derived by adding the currents provided by each string bus (3002). The MPP (3006) is the point on the solar array I-V curve (3004) where current times voltage is maximized.

Figure 31:
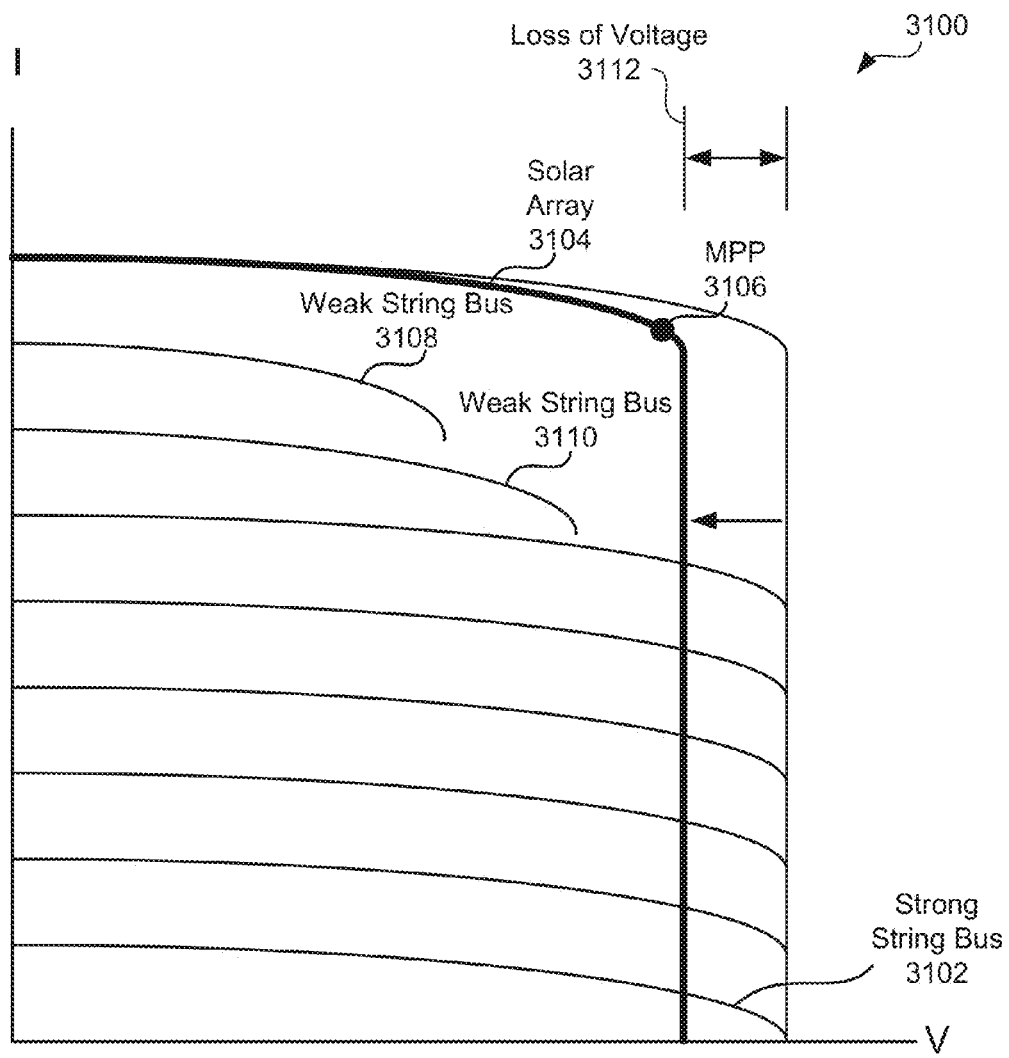
FIG. 31 illustrates a composite I-V curve for string buses in a solar array where two string buses are operating as weak string buses.

FIG. 31 illustrates a composite I-V curve (3100) for string buses in a solar array where two string buses are operating as weak string buses. The weak string buses (3108, 3110) produce the same current as the strong string buses (3102), but cannot produce equivalent voltages. The solar array sees a loss of voltage (3112), since the solar array (3104) cannot produce the maximum voltage of the strong string buses (3102). The MPP (3106) is lower than that seen in the ideal solar array illustrated in FIG. 30. In this operating region, the strong string buses (3102) are operating at maximum current, but are incapable of operating at their maximum voltage. The solar array is thus producing less energy than what it is capable of.

Figure 32:
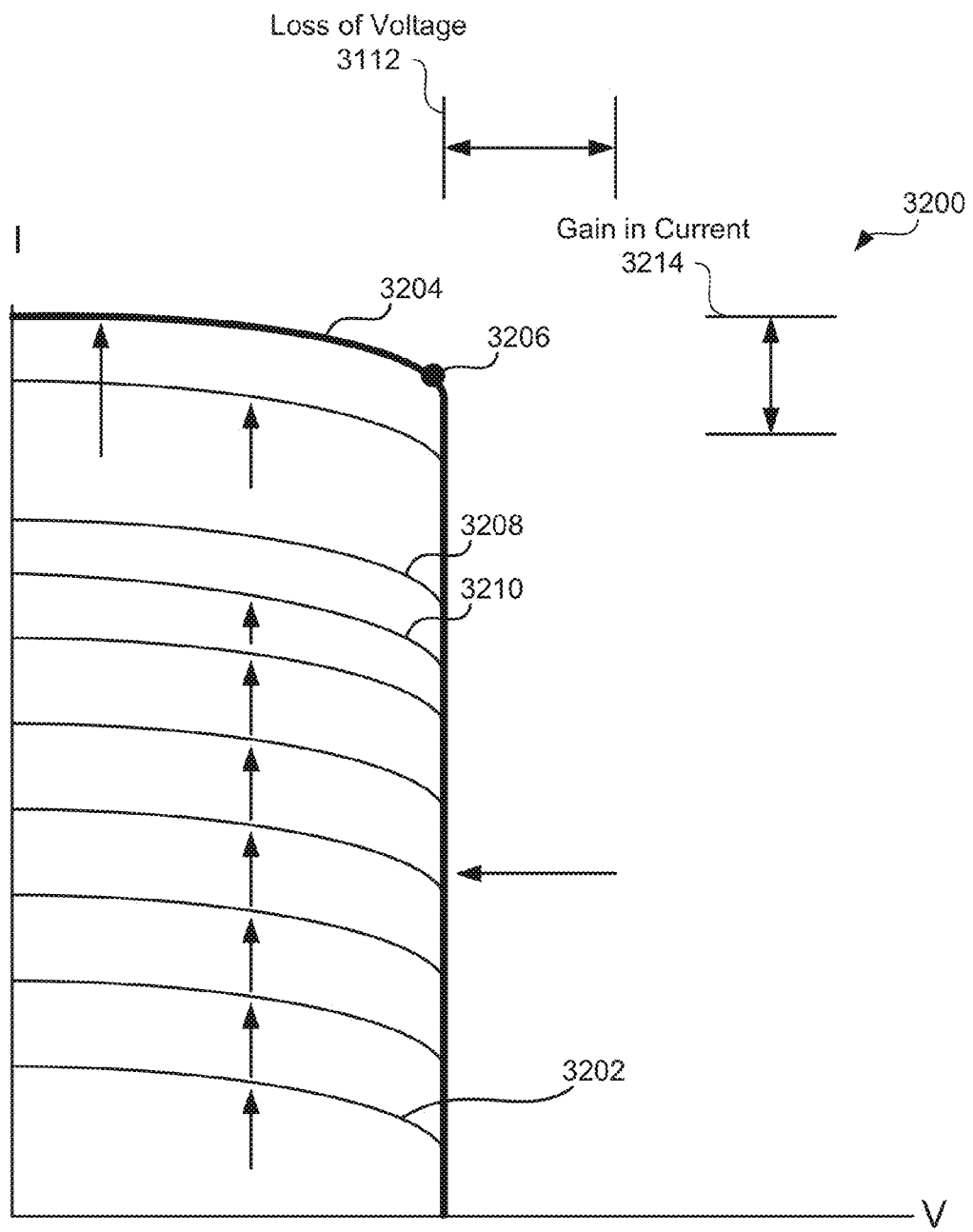
FIG. 32 illustrates an I-V curve for a solar array implementing the systems and methods of this disclosure.

FIG. 32 illustrates an I-V curve (3200) for a solar array implementing the systems and methods of this disclosure. Voltages of strong string buses (3202) can be decreased, which in turn increases the current output from the strong string buses (3202). The voltages can be decreased until all string bus voltages balance with the voltage of the weakest string bus (3208) or an average voltage of the weakest string buses (3208, 3210). This is one way to balance string buses in a solar array (another way will be described with reference to FIGS. 34-37). As a result, the solar array voltage output decreases by a value (3112) equal to the decrease in voltage for the strong string buses (3202). However, the solar array gain in current (3214) is equal to the sum of the increased currents from all of the strong string buses (3202) whose voltages were decreased. The maximum power produced from the MPP (3206) of this I-V curve (3200) is greater than the maximum power produced when the weak string buses (3208) were holding down the voltage of the strong string buses (3202). Stated differently, the sacrifice in voltage is more than compensated for by the increased current, even when conversion losses are accounted for.

In an embodiment, the voltages of the strong string buses (3202) can be decreased until the string bus voltage balances with the voltage of the one or more weak string buses (3208, 3210). Since the weak string buses (3208, 3210) may not operate at the same maximum voltage (e.g., (3210)>(3208)), strong string buses (3202) can be balanced with an average of the weak string buses (3208), (3210).

It should be understood that FIGS. 27-32 are not drawn to scale, and are illustrative only. The curvatures of the I-V curves are also merely illustrative and can vary significantly depending on the actual systems that the I-V curves represent. Although six solar modules and nine string buses were described, these numbers are illustrative only. Any number of solar modules and string buses can be used.

Balancing solar modules in a string bus means that the solar module currents converge. In an embodiment, balancing solar modules in a string bus means that weak solar module currents converge on strong solar module currents. Balancing string buses in a solar array means that string bus voltages converge. In an embodiment, balancing string buses in a solar array means that strong string bus voltages converge on weak string bus voltages. It should be understood that balancing need not mean an exact balance. Two values can only converge to within a threshold value of each other—a relative equivalency. For instance, two currents that are to be balanced by causing them to converge on 1 amp, can be considered balanced if they come within 0.1 amp of the 1 amp goal. Two currents that are to be balanced by causing them to converge can be considered balanced when they are within five percent of each other. However, even when balanced, the process is iterative and will continue indefinitely. This is because the solar module performance changes, the load changes, and local conditions (e.g., clouds, leaves, dirt, to name a few). Furthermore, every balancing of a string bus can require a balancing of solar modules on each string bus, and every balancing of solar modules on each string bus can require a balancing of string buses.

Figure 4B:
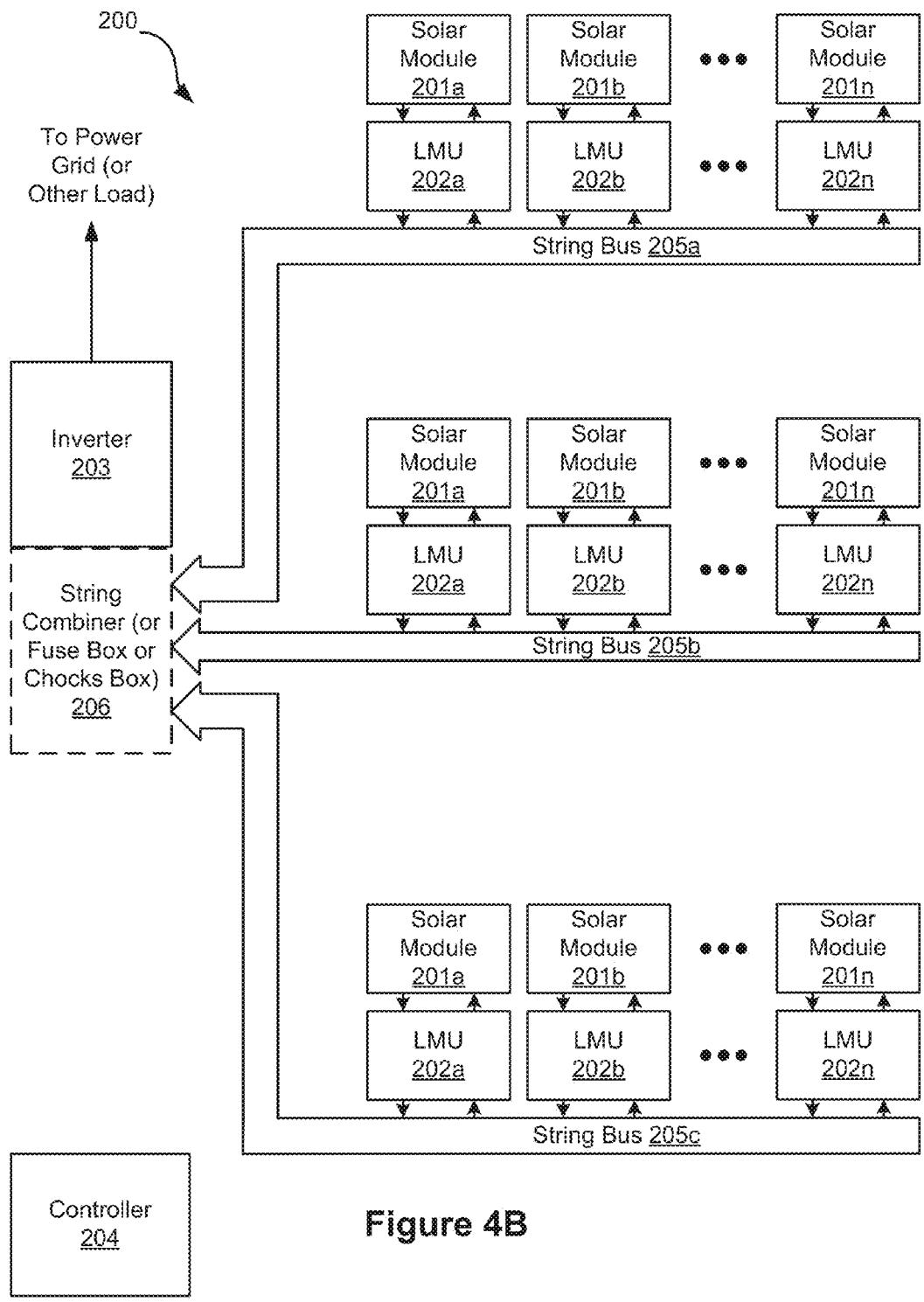
FIG. 4B illustrates an embodiment of a solar array along with an inverter and a string combiner.

FIG. 4B illustrates an embodiment of a solar array along with an inverter and a string combiner. In the illustrated embodiment the solar array 200 includes three string buses (205a, 205b, 205c), although one or more string buses (205a, 205b, 205c) can also be used. The string buses enable a series connection of solar modules (201a, 201b, ..., 201n). Coupled between each solar module (201a, 201b, ... 201n) and its corresponding string bus (205a, 205b, 205c), is a local management unit (LMU) (202a, 202b, ..., 202n). The LMUs (202a, 202b, ..., 202n) are controlled by a controller (204). The controller (204) can communicate wirelessly with the LMUs (202a, 202b, ..., 202n) or via wireless repeaters. In an embodiment (not illustrated), wired connections between the controller (204) and the LMUs (202a, 202b, ..., 202n) can be implemented. String bus (205a, 205b, 205c) outputs are connected at an inverter (203) or in an optional string combiner (206). The controller (204) can be configured to balance current outputs from the solar modules on a string bus (205a, 205b, 205c). This can be done for each string bus (205a, 205b, 205c). Once, the current outputs from solar modules (201a, 201b, ..., 201n) on a string bus (205a, 205b, 205c) are balanced (weak solar module currents are raised to the level of strong solar module currents within a string), the controller (204) can balance the current outputs from the string buses (205a, 205b, 205c) (strong string bus voltages are lowered to the level of weak string bus voltages, which in turn raise strong string bus currents and hence the solar array current). This process can be repeated or an inverter (203) can then attempt to determine the MPPT for the solar array (200).

A "solar array" typically comprises two or more solar modules series-connected via a string bus where the output voltage is a sum of the voltages of the series-connected solar modules. In larger solar arrays, string buses can be connected in parallel such that their currents add. A combiner and inverter are not part of the solar array.

Balancing current outputs of solar modules (201a, 201b, ..., 201n) on a string bus (205a, 205b, 205c) will now be discussed in more depth. The controller (204) can be configured to balance the currents produced by the solar modules (201a, 201b, ..., 201n) on a given string bus (205a, 205b, 205c), and perform this balancing for each string bus (205a, 205b, 205c). As a result, the currents from the solar modules (201a, 201b, ..., 201n) on a string bus (205a, 205b, 205c) can be balanced.

In order to balance solar modules (201a, 201b, ..., 201n) on a string bus (205a, 205b, 205c), it can be useful to identify strong solar modules (201a, 201b, ..., 201n) and weak solar modules (201a, 201b, . . . , 201n). This is done by varying the current on a string bus (205a, 205b, 205c), monitoring the resulting change in voltage in each solar module (201a, 201b, . . . , 201n), and comparing the changes in voltage on each solar module (201a, 201b, . . . , 201n) to identify strong solar modules (201a, 201b, . . . , 201n) and weak solar modules (201a, 201b, . . . , 201n).

Varying the current on the string bus (205a, 205b, 205c) can involve the inverter (203) pulling a different current from the string bus (205a, 205b, 205c). It can involve varying an impedance seen by the string bus (205a, 205b, 205c). For instance, the inverter (203) can vary the impedance that the string bus (205a, 205b, 205c) sees, and in doing so the current and voltage produced by the solar modules (201a, 201b, . . . , 201n) on the string bus (205a, 205b, 205c) will vary. In other words, pulling a different current or changing the impedance changes where on the I-V curve each solar module (201a, 201b, . . . , 201n) operates at. Since current for devices connected in series is the same, a change in current on the string bus (205a, 205b, 205c) causes the same change in current for each solar module (201a, 201b, . . . , 201n) on the string bus (205a, 205b, 205c). However, the changes in voltage may not be the same, since the solar modules (201a, 201b, . . . , 201n) can operate at different operating points on the I-V curve.

Figure 22:
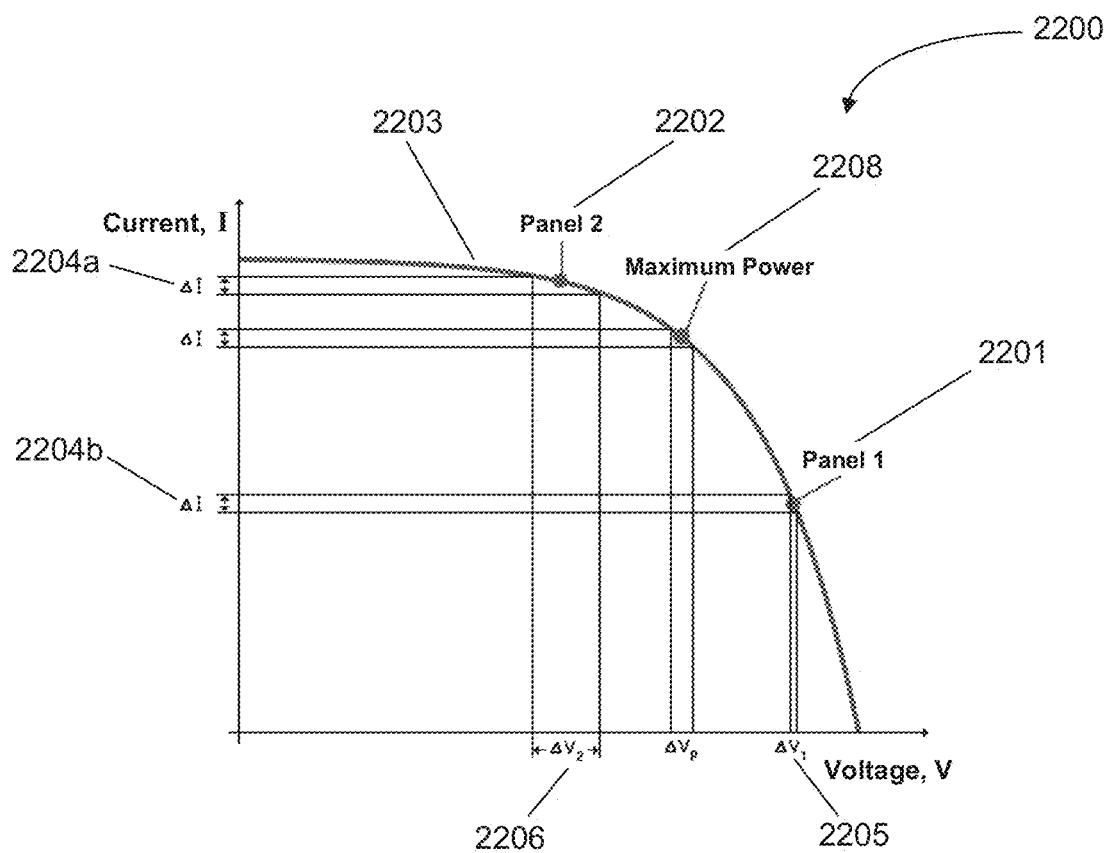
FIG. 22 illustrates an exemplary composite I-V curve for solar modules in a solar array.

This can be seen in FIG. 22, which illustrates an example of a composite I-V curve (2203) for solar modules on a string bus. This composite I-V curve (2203) is not drawn to scale. Working points for two different solar modules can be seen in FIG. 22. The working point (2202) has a lower-angled slope and represents a weak solar module. The working point (2201) has a higher-angled slope and represents a strong solar module. The variation in string bus current (2204a) for the weak solar module is the same as the variation in string bus current (2204b) for the strong solar module since the solar modules are connected in series, and thus must operate at the same current. However, since the two solar modules are at different working points on the I-V curve (2203), the resulting change in voltage (2206, 2205) for each is not the same. The change in voltage dV2 (2206) for the weak solar module is greater than the change in voltage dV1 (2205) for the strong solar module.

By identifying strong and weak solar modules, based on the changes in voltage dV1, dV2, one can determine which solar module(s) (201a, 201b, . . . , 201n) to adjust. Strong solar modules (201a, 201b, . . . , 201n) can be used as a reference. Strong solar modules (201a, 201b, . . . , 201n) may not be adjusted, while weak solar module (201a, 201b, . . . , 201n) voltages can be decreased until their current outputs converge on the strong solar module (201a, 201b, . . . , 201n) outputs (or an average strong solar module (201a, 201b, . . . , 201n) current output). This raises the current output of the string bus (205a, 205b, 205c), while decreasing the string bus (205a, 205b, 205c) voltage output. However, the net effect is greater power output from the string bus since the loss in voltage is more than compensated for by the increased current. The end result can preferably be working points that are proximal for all solar modules (201a, 201b, . . . , 201n), that is balanced or near balanced current outputs. An indication that balancing has been achieved and that the solar modules (201a, 201b, . . . , 201n) are operating near the maximum current output of the strong solar modules (201a, 201b, . . . , 201n), is that a variation in the current along the string bus (205a, 205b, 205c) will cause a nearly equivalent change in voltage for each solar module (201a, 201b, . . . , 201n).

In an embodiment, instead of using strong solar modules (201a, 201b, . . . , 201n) as the reference, an average of all solar modules (201a, 201b, . . . , 201n) on a string bus (205a, 205b, 205c) can be used as a reference. In this embodiment, all solar modules (201a, 201b, . . . , 201n) on the string bus (205a, 205b, 205c) can be adjusted, including strong solar modules (201a, 201b, . . . , 201n), until their current outputs converge on the average. In an embodiment, the controller (204) can identify strong and weak solar modules (201a, 201b, . . . , 201n) of all solar modules (201a, 201b, . . . , 201n) on a string bus (205a, 205b, 205c).

In an embodiment, the change in voltage dVi for each solar module (201a, 201b, . . . , 201n) can be checked for anomalies, and those measurements appearing to be erroneous can be ignored or eliminated and replaced with a new measurement of dVi. In an embodiment, at least one solar module (201a, 201b, . . . , 201n) can be identified as a strong solar module (201a, 201b, . . . , 201n). In an embodiment, the solar modules (201a, 201b, . . . , 201n) identified as strong solar modules (201a, 201b, . . . , 201n) can be left out of the other steps involved in balancing a string bus (205a, 205b, 205c) (e.g., strong solar module (201a, 201b, . . . , 201n) current outputs may not be changed while the current outputs of weak solar modules (201a, 201b, . . . , 201n) are changed).

String buses (205a, 205b, 205c) can be connected in parallel and have an output that is optionally connected to a string combiner (206) (or fuse box or chocks box). In an embodiment, the output of the string buses (205a, 205b, 205c) can be connected to the inverter (203).

Figure 21:
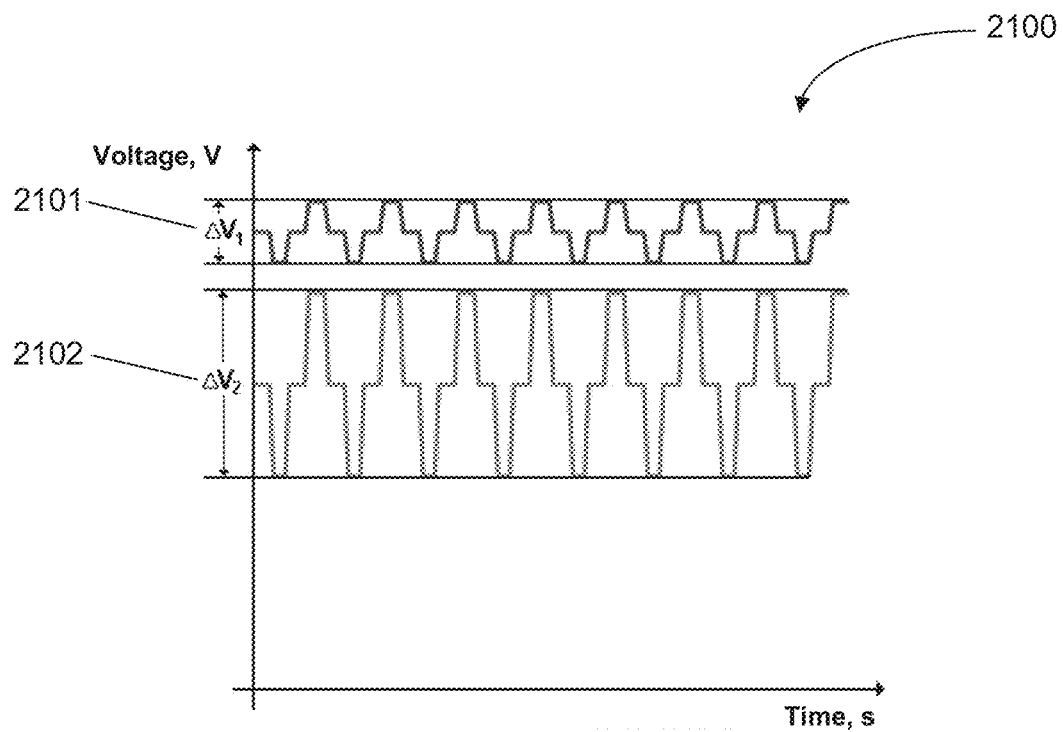
FIG. 21 illustrates exemplary solar module voltages for strong and weak solar modules.

FIG. 21 illustrates exemplary solar module voltages for strong and weak solar modules. Peaks and troughs are caused by changes in current on a string bus that the two solar modules are coupled to. Since the two solar modules may not operate at the same working point on the I-V curve, the resulting changes in voltage dV1 (2101) and dV2 (2102) may not be the same. Here, the stronger solar module has a smaller dV1 (2101) since its working point corresponds to higher voltage and lower current. The weaker solar module has a larger dV2 (2102) since its working point corresponds to lower voltage and higher current. By monitoring these voltage fluctuations, a controller or LMU can decrease the voltage, and increase the current of the weak solar modules in order to shift dV2 towards dV1.

In an embodiment, the LMUs (202a, 202b, . . . , 202n) control the voltage and current provided to the string buses (205a, 205b, 205c) from the solar modules (201a, 201b, . . . 201n). In an embodiment, one LMU can control the voltage and current output for more than one solar module (201a, 201b, . . . , 201n). In an embodiment, the number of solar modules (201a, 201b, . . . , 201n) can exceed the number of LMUs (202a, 202b, . . . , 202n). For instance, LMUs (202a, 202b, . . . , 202n) can only be used to control the current and voltage output from solar modules (201a, 201b, . . . , 201n) identified as weak solar modules.

In an embodiment, a controller (204) can control the LMUs (202a, 202b, . . . , 202n). The controller (204) can also monitor the string buses (205a, 205b, 205c) and the solar modules (201a, 201b, . . . 201n) via the LMUs (202a, 202b, . . . , 202n). Data regarding the solar modules (201a, 201b, . . . 201n) and LMUs (202a, 202b, . . . , 202n) can be transmitted via the string buses (205a, 205b, 205c) to the controller (204). In an embodiment, the controller (204) can transmit instructions or commands to the LMUs (202a, 202b, . . . , 202n) via the string buses (205a, 205b, 205c). In another embodiment, the controller (204) can perform the above-noted communications with the LMUs (202a, 202b, . . . , 202n) via wireless communication paths. The controller (204) can also be in communication with the inverter (203). In the illustrated embodiment, the controller (204) is a standalone device. However, in other embodiments, the controller (204) can be a part of other devices (e.g., the inverter (203), or LMUs (202a, 202b, . . . , 202n). In an embodiment, the controller (204) can be a part of one of the LMUs (202a, 202b, . . . , 202n).

In an embodiment, operation of the controller (204) can be based on historical current and voltage data to help in pattern identification. For example, where the controller (204) notices that certain solar modules (201a, 201b, . . . , 201n) become weak solar modules (201a, 201b, . . . , 201n) at a specified time every day, this can be an indication of an object casting a predictable shadow over those solar modules (201a, 201b, . . . , 201n). As a result, instructions can be sent to the affected LMUs (202a, 202b, . . . , 202n) at the time when those LMUs (202a, 202b, . . . , 202n) regularly become weak.

Balancing current outputs of string buses (205a, 205b, 205c) will now be discussed in more depth. Although solar module (201a, 201b, . . . 201n) output current can be balanced on each string bus as described above, each string bus (205a, 205b, 205c) can produce different voltages (i.e., weak string buses can produce less-than-ideal or less-than-maximum voltages).

Figure 23:
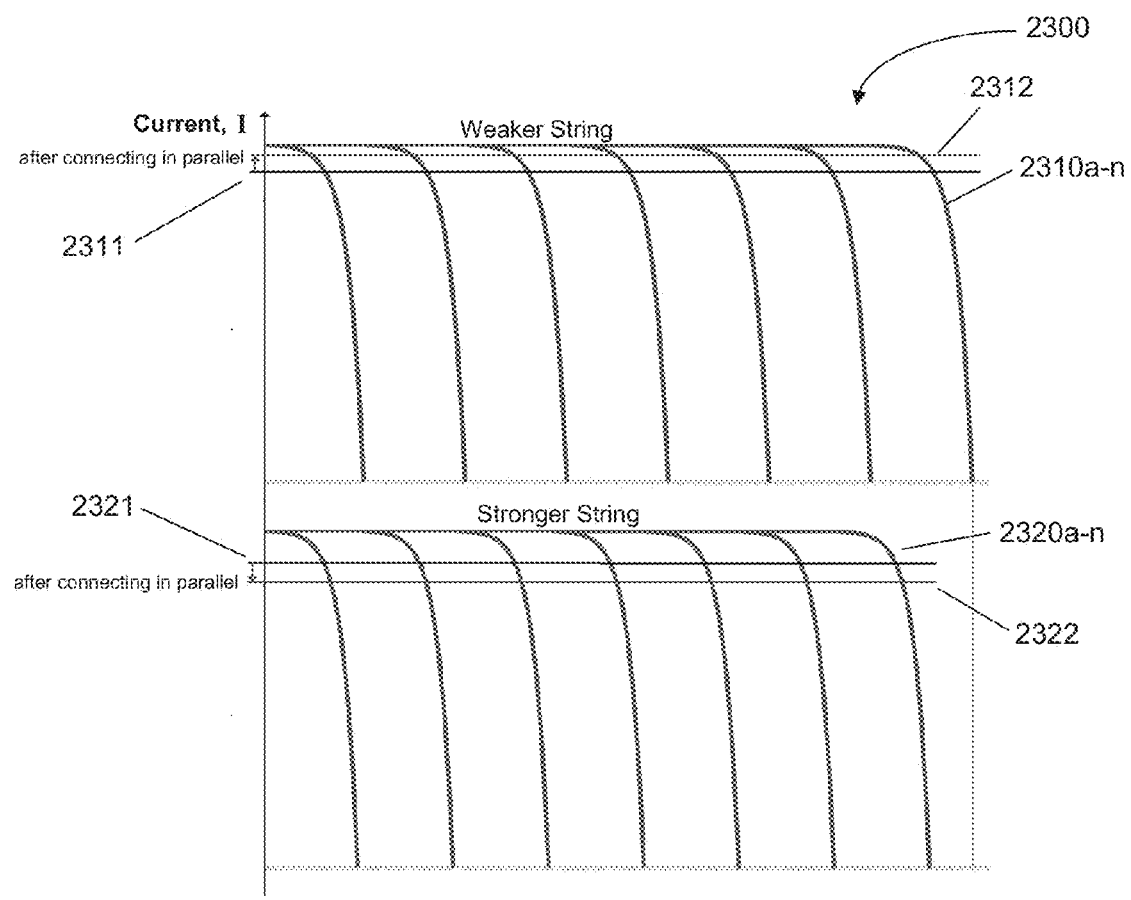
FIG. 23 illustrates exemplary plots of current changes seen on two string buses when connected in parallel.

Since string buses (205a, 205b, 205c) can be connected in parallel, the voltages produced by the string buses (205a, 205b, 205c) can converge. This voltage convergence causes the working points of the solar modules (201a, 201b, . . . 201n) in each string bus (205a, 205b, 205c) to change. FIG. 23 shows exemplary plots of the resulting change in current seen on two string buses when connected in parallel. The stronger string sees a decrease in current while the weak string sees an increase in current.

In an embodiment, varying the voltage of the string buses in the solar array involves varying the current drawn from the string buses (205a, 205b, 205c) or varying an impedance seen by the string buses (205a, 205b, 205c). For instance, an inverter (203) connected to the string buses (205a, 205b, 205c) can vary the impedance that the string buses (205a, 205b, 205c) see, and in doing so the current and voltage produced by the solar modules (201a, 201b, . . . 201n) on the string bus (205a, 205b, 205c) will change. In other words, changing the impedance changes where on the I-V curve each string bus (205a, 205b, 205c), and the solar modules (201a, 201b, . . . 201n) on each string bus, (205a, 205b, 205c) operate at. A change in voltage on the string buses (205a, 205b, 205c) causes a change in the current output from each of the string buses (205a, 205b, 205c). However, since the string buses (205a, 205b, 205c) may not operate at the same operating point on the I-V curve, the change in voltage will cause differing changes in current for some or all of the string buses (205a, 205b, 205c).

Figure 25:
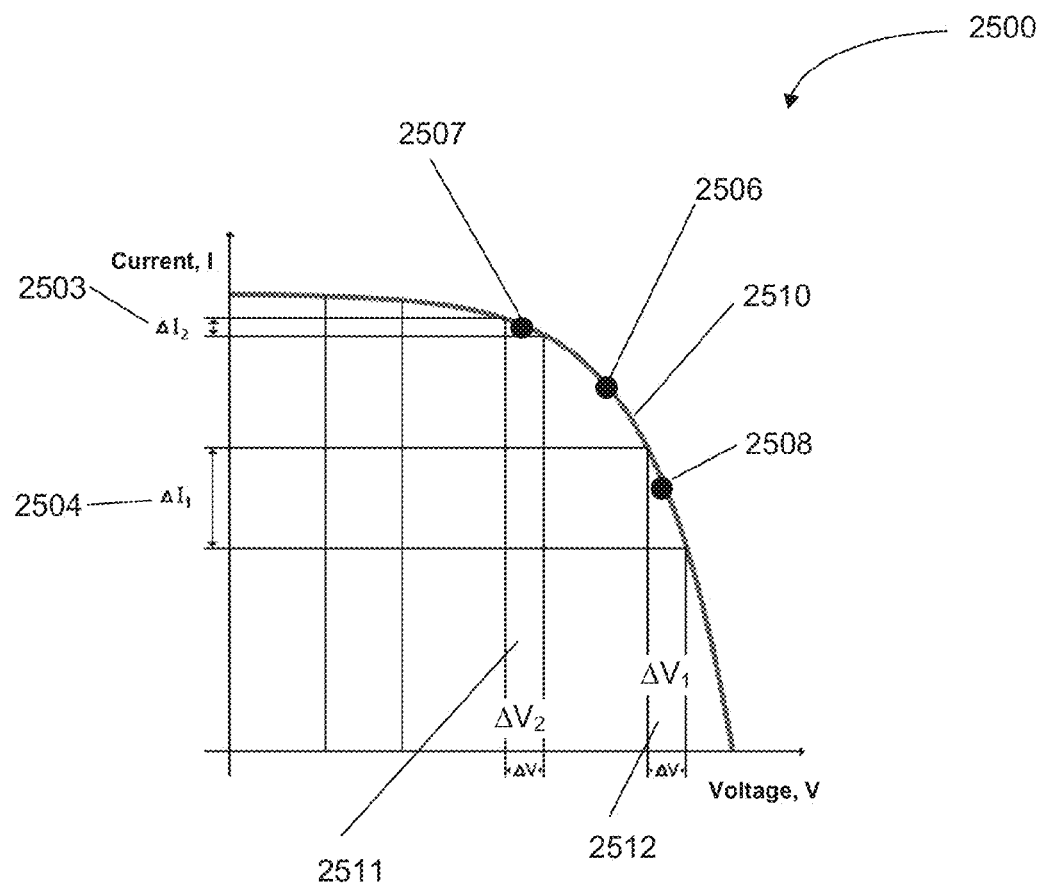
FIG. 25 illustrates an exemplary composite I-V curve for string buses in a solar array.

This can be seen in FIG. 25, which illustrates a composite I-V curve (2510) for string buses in the solar array (200). The I-V curve is not drawn to scale. An operating point for two different string buses can be seen in FIG. 25. Working point (2508) represents a weak string bus and working point (2507) represent a strong string bus. The variation in string bus voltage dV1 (2512) is the same variation as seen for string bus voltage variation dV2 (2511) since the string buses are connected in parallel. However, since the two string buses are at different working points on the I-V curve (2510), the resulting change in current dI1 (2503) and dI2, (2504) are not the same. The change in voltage dI2 (2503) for the strong string bus is smaller than the change in voltage dI1 (2504) for the weak string bus.

By comparing the change in currents dI1, dI2 one can determine which string buses (205a, 205b, 205c) to adjust. Adjusting string bus voltage output involves equally decreasing the voltage output of all solar modules on a string bus (205a, 205b, 205c), resulting in an increase of the current from the string bus (205a, 205b, 205c). In an embodiment, one or more weak string buses (205a, 205b, 205c) can be used as references such that all other string bus voltages are balanced with that of the one or more weak string buses (205a, 205b, 205c). In another embodiment, an average of weak string buses (205a, 205b, 205c) can be used as the reference. In an embodiment, an average of all string buses (205a, 205b, 205c) can be used as the reference.

Not all solar modules can be adjusted. For instance, if two or more string buses (205a, 205b, 205c) are producing about the same current, then those string buses (205a, 205b, 205c) can be used as references (the outputs from solar modules (201a, 201b, . . . 201n) on those string buses (205a, 205b, 205c) will not be changed). Solar module output currents on all other string buses (205a, 205b, 205c) can be such that the string bus output currents converge on the output from the reference string buses (205a, 205b, 205c).

Having identified weak string buses (205a, 205b, 205c), an average change in current dIw for the weak string buses (205a, 205b, 205c) can be determined. The average change in current dIw for the weak string buses (205a, 205b, 205c) can be a reference value. The change in current dIk for each strong string bus (205a, 205b, 205c) can be compared to the average change in current dIw for the weak string buses (205a, 205b, 205c). The difference between dIk for a string bus (205a, 205b, 205c) and dIw indicates by how much the string bus (205a, 205b, 205c) output current should be decreased in order to match the output current of the weak string buses (205a, 205b, 205c) (to push the strong string bus (205a, 205b, 205c) working point (2507) towards the weak string bus (205a, 205b, 205c) working point (2508)).

For instance, and referring to FIG. 25, the weak string bus (205a, 205b, 205c) change in current (2503) dI2 is greater than the strong string bus (205a, 205b, 205c) change in current (2504) dI1. Thus, the strong string bus (205a, 205b, 205c) current could be increased, which would reduce the voltage. The string bus (205a, 205b, 205c) working point (2508) for the strong string bus (205a, 205b, 205c) would thus shift towards the working point (2507) of the weak string bus (205a, 205b, 205c). Similarly, the change in current dIk for each string bus (205a, 205b, 205c) can be compared to the average change in current of the weak string buses dIw and the current outputs for the strong string buses (205a, 205b, 205c) adjusted such that all the string buses (205a, 205b, 205c) in the solar array (200) have working points that converge on those of the weak string buses. The end result can preferably be working points that are proximal for all string buses (205a, 205b, 205c)—balanced or near balanced current outputs. An indication that balancing has been achieved and that the string buses (205a, 205b, 205c) are operating at nearly identical working points on the I-V curve, is that a variation in the voltage for all string buses (205a, 205b, 205c) will cause a nearly equivalent change in current for each string bus (205a, 205b, 205c).

In an embodiment, before weak string bus (205a, 205b, 205c) outputs are adjusted, one or more weak string buses (205a, 205b, 205c) can be disconnected from the other string buses (205a, 205b, 205c) to determine if disconnecting the one or more weak string buses (205a, 205b, 205c) increases the power output from the solar array (200).

The inverter (203) can convert the direct current (DC) outputs from the string buses (205a, 205b, 205c) to an alternating current (AC) output that can be supplied, for example to a power grid or other load (e.g., a home or business). The inverter (203) can control the current and voltage drawn from the string buses (205a, 205b, 205c), and thus control where on the I-V curve the string buses (205a, 205b, 205c) operate at. For instance, as the inverter (203) can increase impedance seen by the solar array (200), which will cause the current drawn from the string buses (205a, 205b, 205c) to decrease and the voltage to increase, and the working point will shift along the I-V curve to the right towards where the I-V curve meets the x-axis (voltage). Thus, if the string buses (205a, 205b, 205c) are operating at a working point having a higher current and lower voltage than the MPP for the solar array (200), then the inverter (203) can increase the impedance causing the string bus (205a, 205b, 205c) working points to shift towards the MPP. Balancing can be carried out via the methods described with reference to FIG. 26.

Figure 20:
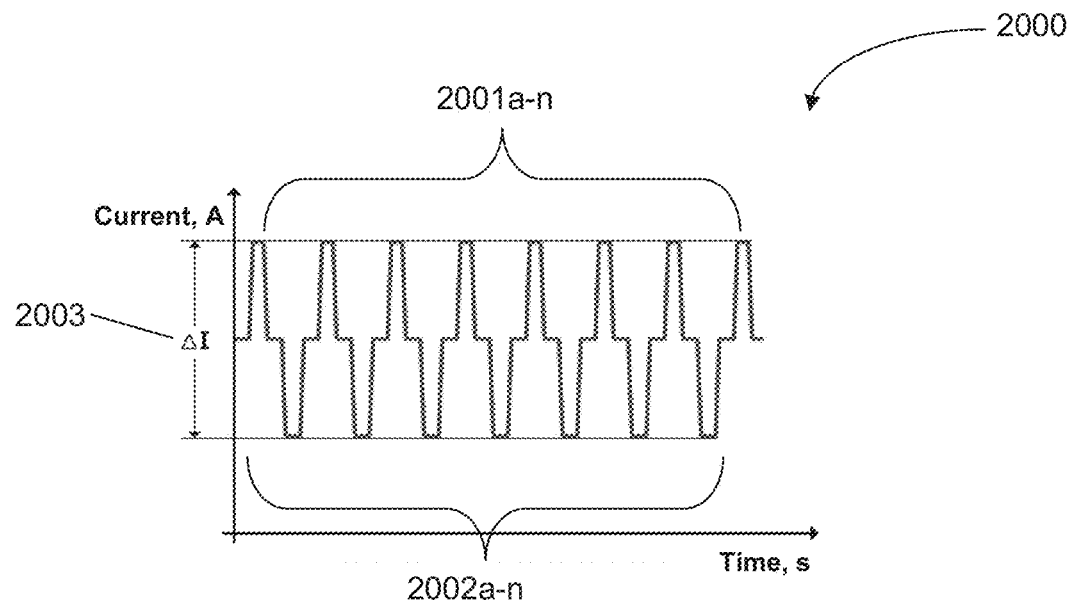
FIG. 20 illustrates an exemplary inverter current controlled by a maximum power point tracking algorithm.

FIG. 20 illustrates an exemplary inverter current controlled by a maximum power point tracking algorithm. Such a current can occur when a solar array is connected to an MPPT-enabled inverter such as, but not limited to, SB300 made by SMA America, Inc., and IG2000 made by Fronius USA, LLC. A typical MPPT algorithm pulls and pushes the current (2003) in the solar array (for example, by increasing and decreasing the impedance seen by the solar array) causing I to fluctuate into peak current spikes (2001a-n) and valley current spikes (2002a-n). These fluctuations cause solar module voltage fluctuations. These fluctuations can be used to determine the MPP for solar modules.

Figure 24:
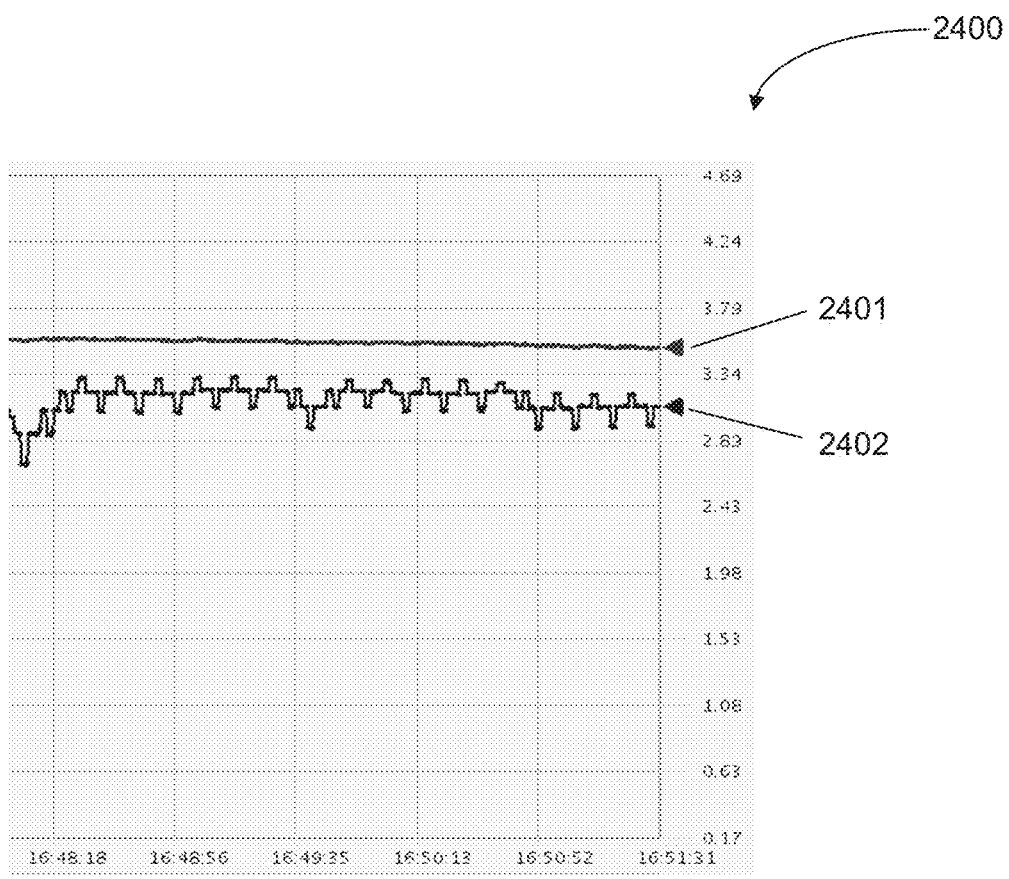
FIG. 24 illustrates an exemplary current versus time diagram for a stronger and weaker string bus when the voltage to the string buses fluctuates.

FIG. 24 illustrates an exemplary current versus time diagram for a stronger and weaker string bus when the voltage to the string buses fluctuates. The stronger string bus has a smaller current change (2401) since the working point is closer to the closed-circuit current (where the I-V curve meets the Y-axis). The weaker string bus has a larger current change (2402) since the working point is closer to the open-circuit voltage (where the I-V curve meets the X-axis).

Figure 26:
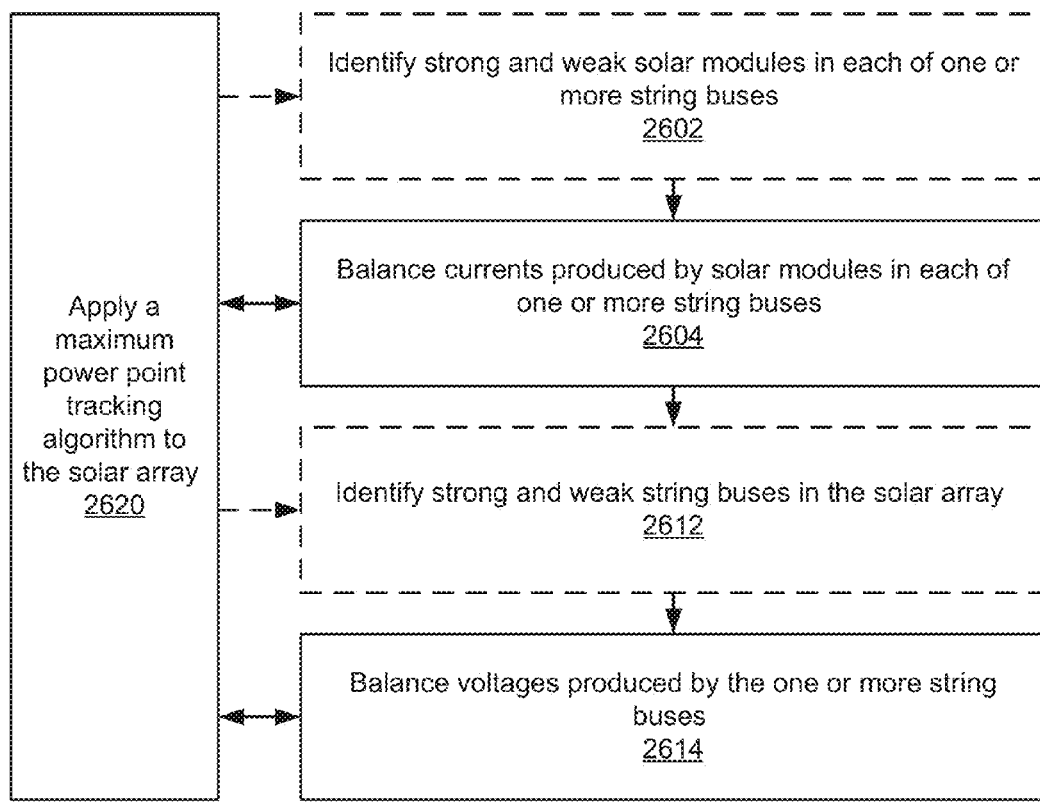
FIG. 26 illustrates an embodiment of a method of maximizing the power output of a solar array by (1) balancing current outputs of solar modules, (2) balancing voltage outputs of string buses, and (3) applying an MPPT algorithm to the solar array.

FIG. 26 illustrates an embodiment of a method (2600) of maximizing the power output of a solar array by (1) balancing current outputs of solar modules, (2) balancing voltage outputs of string buses, and (3) applying an MPPT algorithm to the solar array. The method (2600) can also maximize power by identifying strong and weak solar modules before balancing current outputs of solar modules and by identifying strong and weak string buses before balancing voltage outputs of string buses. The method (2600) can be carried out via an optional first identify operation (2602), a first balance operation (2604), an optional second identify operation (2612), a second balance operation (2614), and an apply operation (2620).

The order that balancing operations and the applying operation occur in can vary. For instance, currents produced by solar modules in each of one or more string buses can be balanced in a first balance operation (2604). Voltages produced by the one or more string buses can then be balanced in a second balance operation (2614). An MPPT algorithm can then be applied to the solar array in an apply operation (2620). In another embodiment, the method (2600) can begin with the first balance operation (2604) followed by one or more loops of the apply operation (2620). The second balance operation (2614) can then occur followed by one or more further loops of the apply operation (2620). It should be understood that the first and second balance operations (2604, 2614) and the apply operation (2620) can operate in any order or pattern, with each operation repeating one or more times before another operation operates. The first and second balance operation (2604, 2614) can pause between operations to allow the apply operation (2620) to repeat numerous times. In an embodiment, the balance operations (2604, 2614) can run simultaneously with the apply operation (2620). In an embodiment, the applying an MPPT algorithm is not a part of the method (2600). Rather, the method (2600) can merely include balancing the solar modules and the string buses.

As noted above, the method (2600) includes the balance currents produced by solar modules in each of one or more string buses operation (2604). The solar modules can be connected by a string bus of the solar array, for instance in series. In an embodiment, balancing involves (1) varying the current on the string bus, (2) monitoring changes in voltage output for each solar module on the string bus, (3) comparing the monitored changes in voltage output for the solar modules on the string bus, and (4) adjusting the current output of one or more of the solar modules such that the current outputs from all solar modules on the string bus converge (see FIG. 29).

In an embodiment, before the first balance operation (2604), strong and weak solar modules can be identified via a first identify operation (2602). The first identify operation (2602) identifies, for each string bus, one or more strong solar modules and one or more weak solar modules. Weak solar modules can be adjusted such that their outputs converge on those of the strong solar modules.

In an embodiment, the first identify operation (2602) can be carried out by: (1) varying the current on the string bus (or impedance seen by the string bus), (2) monitoring changes in voltage output for each solar module, and (3) comparing the changes in voltage output. Strong solar modules can be those having the smallest change in voltage. Strong solar modules can also be characterized as operating at relatively the same current (indicated by similar changes in voltage). Strong solar modules can be those having working points furthest to the right on the I-V curve (e.g., working point (2201) in FIG. 22).

Having identified strong solar modules, an average change in voltage dVs for the strong solar modules can be determined. The average change in voltage dVs for the strong solar modules can be a reference value. The change in voltage dVi for each solar module can be compared to the average change in voltage dVs for the strong solar modules. The difference between dVi for a solar module and dVs indicates by how much the solar module output current should be decreased in order to match the output current of the strong solar modules (to push the weak solar module working point (2202) towards the working point (2201) of the strong solar modules).

In an embodiment, once the first identify and balance operations (2602, 2604) have been performed, strong and weak solar modules can again be identified via the first identify operation (2602). This can be done since some strong solar modules can have become weak while the weak solar modules were being adjusted. If a weak solar module is identified that was previously a strong solar module, then its current output can be adjusted in the next loop of the first balance operation (2604).

The method (2600) can also include a second balance operation (2614). In an embodiment, the second balance operation (2614) includes (1) varying the voltage of the string buses in the solar array, (2) monitoring changes in current of each string bus, (3) comparing the monitored changes in current, and (4) adjusting the voltage output of the string buses (by changing the voltage output of all solar modules in a string bus) such that the string bus output voltages converge (see FIG. 32).

In an embodiment, before the second balance operation (2614), strong and weak string buses can be identified via a second identify operation (2612). The second identify operation (2612) identifies strong and weak string buses in the solar array. Strong string buses can be adjusted such that their outputs converge on those of the weak string buses. In an embodiment, the second identify operation (2612) can be carried out by: (1) varying impedance seen by the string buses (or the voltage on the string buses), (2) monitoring changes in current output for each string bus, and (3) comparing the changes in current output. Weak string buses can be those having the smallest change in current. Weak string buses can also be characterized as operating at relatively the same current (indicated by similar changes in current). Weak string buses can be those having working points furthest towards the left of the I-V curve (e.g., working point (2507) in FIG. 25).

The method (2600) also includes an apply operation (2620) wherein the maximum power point tracking algorithm is applied. Maximum power point tracking (MPPT) is a procedure or algorithm used to determine the maximum power point (MPP) of a system—in this case the maximum power point of a solar array (see, e.g., "Maximum power" in FIG. 22 and working point (2506) in FIG. 25). In other words, an MPPT algorithm can adjust the current and voltage produced by the solar array until the voltage times current is maximized. A variety of algorithms and devices can be used to carry out MPPT. For instance, in an embodiment, an inverter connected to an output of the solar array can change the impedance that the solar array sees, thus causing the voltage and current produced by the solar array to change. By sweeping or fluttering the impedance over one or more ranges of values, an MPPT algorithm can determine what impedance corresponds with the MPP, and set the impedance to that value such that the solar array operates at the MPP. In another embodiment, MPPT can include the steps of (1) adjusting the impedance that the solar array sees (or adjusting the solar array voltage or causing the working point to move along the I-V curve), (2) monitoring the solar array's reaction to the adjusting impedance (or current or working point), (3) continuing to adjust the impedance (or current or working point) and monitoring the solar array's response, (4) based on the monitoring, determine a maximum power point for the solar array, and (5) set the impedance (or current or working point) to a value that corresponds to the solar array's MPP.

The apply operation (2620) can operate after either of the balance operations (2604, 2614). The apply operation (2620) can also operate after any number of repetitions or loops of either or both of the balance operations (2604, 2614). In an embodiment, the apply operation (2620) can operate after any number of repetitions or loops of the first identify operation (2602) and the first balance operation (2604); after any number of repetitions or loops of the second identify operation (2612) and the second balance operation (2614); and after any number of repetitions or loops of a combination of the first and second identify and apply operations (2602, 2604, 2612, 2614). For instance, strong and weak solar modules in each of one or more string buses can be identified in the first identify operation (2602). Currents produced by solar modules in each of the one or more string buses can be balanced in the first balance operation (2604). Strong and weak string buses in each of the one or more string buses can be identified in the second identify operation (2612). Voltages produced by the one or more string buses can then be balanced in the second balance operation (2614). An MPPT algorithm can then be applied to the solar array in the apply operation (2620).

In another embodiment, the method (2600) can begin with the first identify operation (2602) and the first balance operation (2604) followed by one or more loops of the apply operation (2620). The second identify operation (2612) and the second balance operation (2614) can then occur followed by one or more further loops of the apply operation (2620). It should be understood that the first and second identify operation (2602, 2612), the first and second balance operations (2604, 2614), and the apply operation (2620) can operate in any order or pattern, with each operation repeating one or more times. In an embodiment, the apply operation (2620) can operate multiple times before the first or second identify operations (2602, 2612) resume. Alternatively, the identify and balance operations (2602, 2604, 2612, 2614) can run simultaneously with the apply operation (2620). In an embodiment, the applying an MPPT algorithm is not a necessary part of the method (2600). Rather, the method (2600) can merely include balancing the solar modules and the string buses.

In this disclosure, systems and methods for balancing string buses have been described where string bus output voltages for strong string buses were decreased until they converged on weak string bus voltages (see FIG. 32) resulting in an increased current from the solar array. However, string bus output voltage can also be balanced by increasing string bus output voltages, as discussed below.

Figure 33:
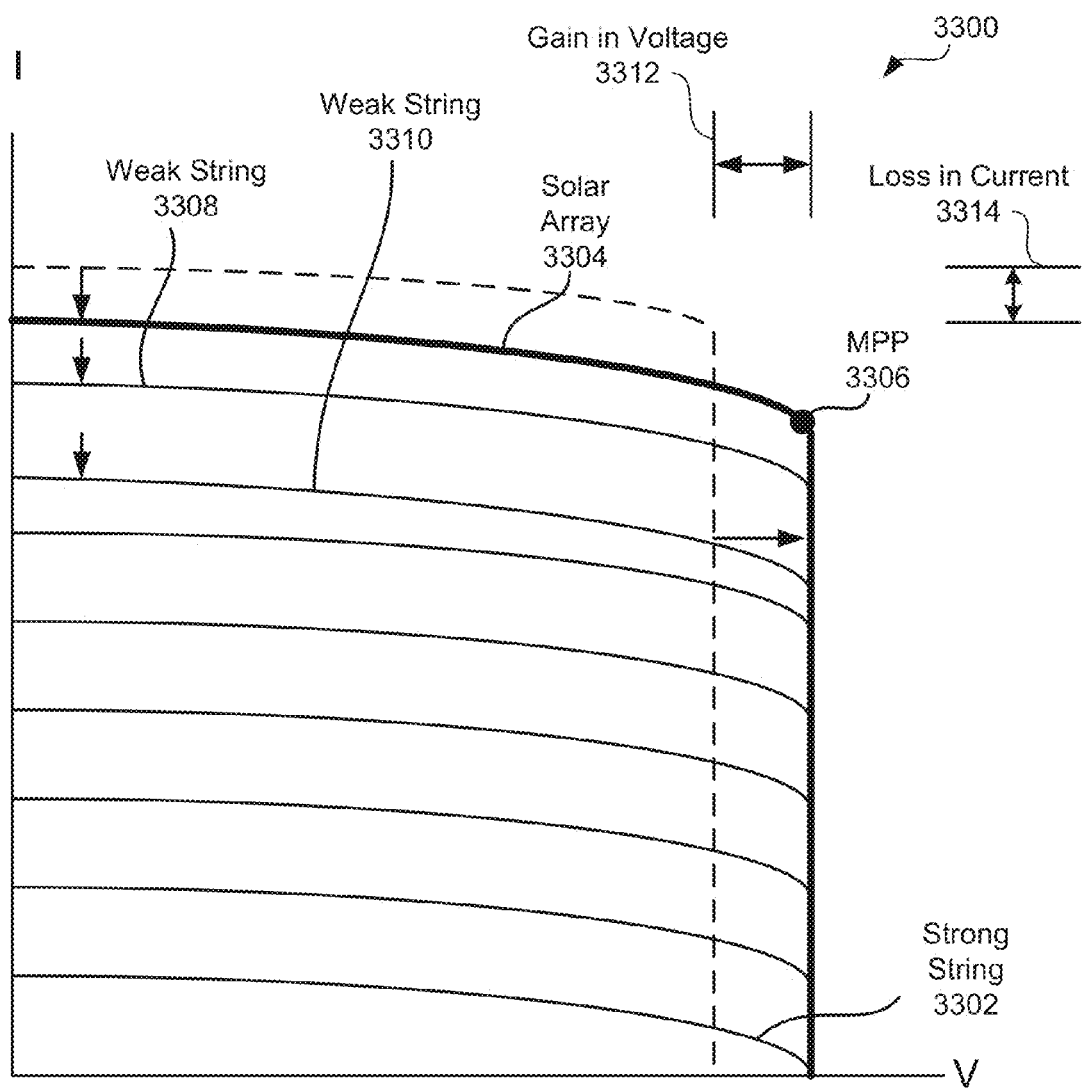
FIG. 33 illustrates an I-V curve for a solar array having string buses balanced via increasing string bus output voltage.

FIG. 33 illustrates an I-V curve (3300) for a solar array having string buses balanced via increasing string bus output voltage. Recall that FIG. 31 illustrates the I-V curve (3100) for the solar array before the string bus output voltages are balanced. FIG. 32 illustrates the I-V curve (3200) for the solar array after the string bus output voltages are balanced by decreasing the voltage output of strong string buses to match that of weak string buses. In contrast, in FIG. 33 the voltage outputs of the two weak string buses (3308, 3310) are increased to balance them with the voltage outputs of the strong string buses (3302). As such, the voltage output for the solar array (3304) increases by a gain in voltage (3312). The solar array voltage before balancing is represented by the vertical dashed line. As a result of increasing the voltage output from the weak string buses (3308, 3310), the current output of the weak string buses (3308, 3310) decreases causing the solar array current output to decrease by a loss in current (3314). However, the gain in voltage along with benefit of avoiding losses associated with downconverting the strong string bus output voltages, more than compensates for the loss in current (3314).

Figure 34:
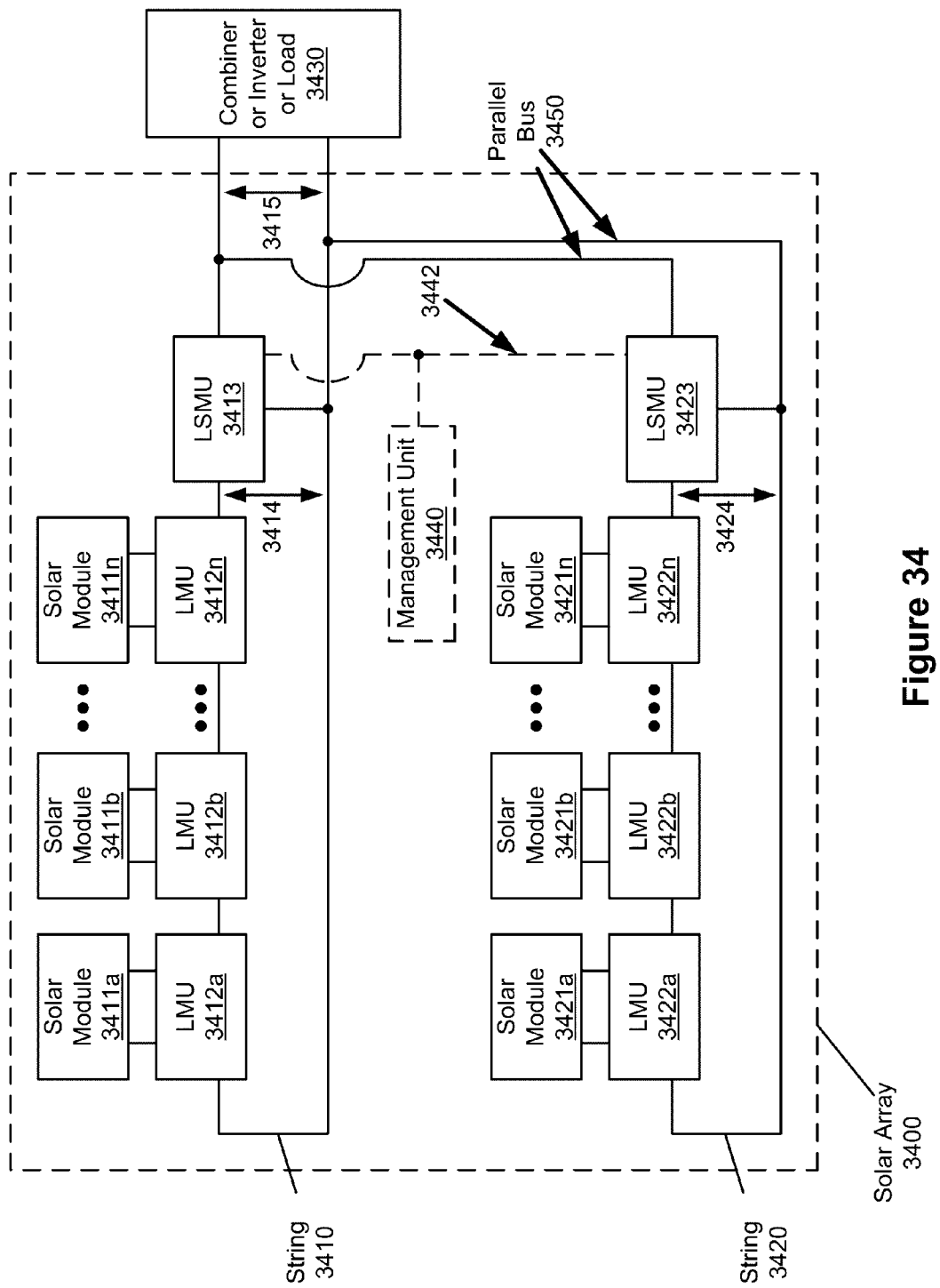
FIG. 34 illustrates an embodiment of a solar array according to the present disclosure.

FIG. 34 illustrates an embodiment of a solar array (3400) according to the present disclosure. Like previously described solar arrays in this disclosure, the solar array (3400) includes two strings (3410, 3420) (or string buses), although two or more can be used. For the purposes of clarity only one string (3410) will be described. However, both strings (3410, 3420) can have identical or similar structures, so this discussion also can apply to the second string (3420) in one embodiment. The string includes two or more local management units (LMUs) (3412) and two or more solar modules (3411). Each LMU (3412) is connected in parallel with one of the solar modules (3411). The LMU (3412) controls the current on the string (3410) by downconverting a voltage provided by the solar modules (3411). The string output voltage (3414) is the sum of the voltages provided by the solar modules (3411) on the string (3410).

The LMUs (3412) are connected in series via conductive connections (e.g., wires, leads, power cables). The string (3410) collects power from the solar modules (3411) and conducts the power towards a combiner, inverter, or load (3430). The strings (3410, 3420) can be connected in parallel via a parallel bus (3450). Each string (3410, 3420) has a string output voltage (3414, 3424). In an embodiment, one or more solar modules (3411) can be connected directly to the string (3410) without an LMU (3412). In a further embodiment, each string can be replaced with a single solar panel.

Unlike solar arrays previously discussed in this disclosure (recall FIGS. 4A-4B), the solar array (3400) also includes local string management units (LSMUs) (3413, 3423). The LSMUs (3413, 3423) produce a solar array output voltage (3415) and are connected to a combiner (or combiner box) (3430), an inverter (3430), or a load (3430). If connected to an inverter (3430), then the inverter (3430) can run an MPPT algorithm to find the MPP for the solar array (3400) after every loop of balancing (of both solar modules (3411, 3421) and strings (3410, 3420)). A first LSMU (3413) is connected to the first string (3410) and is configured to convert the first string output voltage (3414) to the solar array output voltage (3415). A second LSMU (3423) is connected to the second string (3420) and is configured to convert the second string output voltage (3424) to the solar array output voltage (3415). The LSMUs (3413, 3423) are connected between positive and negative ends of the strings (3410, 3420) as illustrated in FIG. 34. The LSMUs (3413, 3423) can be connected in parallel via parallel bus (3450). The LSMUs (3413, 3423) are configured to upconvert or downconvert the string output voltages (3414, 3424) for the parallel bus 3450. The LSMUs (3413, 3423) can also monitor the string output voltages (3414, 3424) and the solar array output voltage (3415). The LSMUs (3413, 3423) can also transmit data regarding the string output voltages (3414, 3424) or the solar array output voltage (3415) to each other via an optional connection 3442, which can be a wired or wireless connection. The LSMUs (3413, 3423) can be configured to identify a strongest string and a weakest string. In an embodiment, the strongest string has a larger string output voltage (3414, 3424) than all other strings (3410, 3420). In an alternative embodiment, the strongest string produces more power than all other strings (3410, 3420). The weakest string has a smaller string output voltage (3414, 3424) than all other strings (3410, 3420). In an alternative embodiment, the weakest string produces less power than all other strings (3410, 3420). The LSMUs (3413, 3423) can be configured to identify strong strings—strings that are within a range from the output voltage (or power) of a strongest string. The LSMUs (3413, 3423) can be configured to identify weak strings—strings that are not within a range from the output voltage (or power) of a strongest string. For instance, if the strongest string has a string output voltage of 5V and the range is 0.2V, then all strings having a string output voltage of 4.8V-5.0V will be identified as strong strings. All other strings will be identified as weak strings. The LSMUs (3413, 3423) can be configured to select a target voltage. The target voltage is the voltage at which the LSMUs (3413, 3423) push the solar array output voltage (3415) towards by either upconverting or downconverting the string output voltages (3414, 3424).

In an embodiment, balancing strings (3410, 3420) using LSMUs (3413, 3423) can entail first identifying the strongest string. In an embodiment, the LSMUs (3413, 3423) can be configured to identify strings (3410, 3420) that are within the range from the output voltage of the strongest string and to identify strings that are not within the range from the output voltage of the strongest string.

In an embodiment, one LSMU (3413, 3423) can be a controlling LSMU. The controlling LSMU can do any one or more of the following: monitor the string output voltages (3414, 3424); transmit data regarding the string output voltages (3414, 3424) to other LSMUs (3413, 3423); monitor the solar array output voltage (3415); transmit data regarding the solar array output voltage (3415) to other LSMUs (3413, 3423); identify the strongest string; identify the weakest string; identify strings that are within the range from the output voltage of the strongest string; identify strings that are not within the range from the output voltage of the strongest string; and select the target voltage.

Optionally, a management unit (3440) can perform the tasks of the controlling LSMU. The management unit (3440) can be in wired or wireless communication with the LSMUs (3413, 3423). The management unit (3440) can monitor the string output voltages (3414, 3424), as well as the solar array output voltage (3415), via optional connection (3442). The management unit (3440) can identify a strongest string and a weakest string along with strings that are within the range from the output voltage of the strongest string, and strings that are not within the range from the output voltage of the strongest string. The management unit (3440) can select the target voltage. The management unit (3440) can communicate with other management units. Those other management units can be in communication with other solar arrays. The other management units can be monitor other solar arrays and thus be external to the solar array 3400.

In an embodiment, balancing strings (3410, 3420) involves converting the string output voltages (3414, 3424) to the target voltage on the parallel bus (3450). In an embodiment, the target voltage is selected to be equal to a string output voltage (3414, 3424) of the strongest string. In this case, string output voltages (3414, 3424) for strings (3410, 3420) that are not within the range from the output voltage of the strongest string can be upconverted and/or downconverted so that the solar array output voltage (3415) of the parallel bus (3450) equals the string output voltage (3414, 3424) of the strongest string. Since the string output voltage (3414, 3424) for the strongest string is equal to the target voltage, the LSMU (e.g., 3413 or 3423) connected to the strongest string (and other LSMUs connected to strings having output voltages within the range of the voltage output of the strongest string, if any) can operate in a bypass mode. In bypass mode, a converter of the LSMU (e.g., 3413, 3423) is turned off to reduce power consumption. Current can pass around or through the LSMU (3413, 3423) while losing no more energy than is lost in normal transit through low-loss or low impedance wires or circuits. In an embodiment, current passes through low-loss portions of the LSMU (3413, 3423). In an embodiment, the bypass mode involves routing current through a transistor, for instance a MOSFET or bipolar transistor.

In an embodiment, the target voltage is equal to an average string output voltage of strings (3410, 3420) that are within the range from the output voltage of the strongest string. In this case an average string output voltage (3414, 3424) can be determined for the strings (3414, 3424) that are within the range from the output voltage of the strongest string where the average includes the voltage of the strongest string. String output voltages (3414, 3424) of strings (3410, 3420) that are not within the range from the output voltage of the strongest string are upconverted so that the solar array output voltage (3415) equals the average string output voltage of the strings (3410, 3420) that are within the range from the output voltage of the strongest string. Only string bus output voltages (3414, 3424) for the strings (3410, 3420) that are not within the range from the output voltage of the strongest string are upconverted. LSMUs (3413, 3423) connected to the strings (3410, 3420) that are within the range from the output voltage of the strongest string, (including the strongest string) operate in bypass mode.

In an embodiment, the target voltage is less than the average output voltage of the strings (3410, 3420) that are within the range from the output voltage of the strongest string. Strings (3410, 3420) having string output voltages (3414, 3424) that are less than the average output voltage of the strings (3410, 3420) that are within the range from the output voltage of the strongest string are upconverted so that the solar array output voltage (3415) equals the target voltage. Strings (3410, 3420) having string output voltages (3414, 3424) that are greater than the average output voltage of the strings (3410, 3420) that are within the range from the output voltage of the strongest string are downconverted so that the solar array output voltage (3415) equals the target voltage. In this embodiment, some LSMUs (3413, 3423) are configured to both upconvert and downconvert voltages.

In an embodiment, the target voltage is greater than the string output voltage (3414, 3424) of the strongest string. In this case string output voltages (3414, 3424) for all strings (3410, 3420), including the strongest string, are upconverted so that the solar array output voltage (3415) equals the target voltage.

In one embodiment of a bypass mode of an LSMU (3413, 3423), the converter of the LSMU (3413, 3423) is not used, and a conductive path around the converter of the LSMU (3413, 3423) is used to bypass the converter of the LSMU (3413, 3423). In other words, when an LSMU (3413, 3423) is in bypass mode, current travels from a string (3410, 3420) to the inverter/combiner/load (3430) with a low voltage loss. For instance, a transistor can route current around the voltage converter of the LSMU (3413, 3423). For instance, a bypass switch (e.g., transistor) could be used to redirect current through a low-resistance wire in the LSMU (3413, 3423) rather than through the circuitry that causes losses. In an embodiment, such a switch can route current around the outside of the LSMU (3413, 3423). In an embodiment, the bypass mode can be the mode that the LSMU (3413, 3423) normally operates in unless instructed otherwise.

In an embodiment, the solar array (3400) can be connected to a combiner, inverter, or load (3430). For the case of a combiner (3430), the LSMUs (3413, 3423) can be connected in parallel via the combiner (3430). This connection can exist within or outside of the combiner (3430). In an embodiment, there can be one to four LSMUs (3413, 3423) in a combiner. However, it is also possible to have more than four LSMUs (3413, 3423) combined in a combiner (3430). The output of the combiner (3430) can be provided to an inverter (not shown). In an embodiment, outputs from multiple combiners (3430) can be combined in parallel and provided to an inverter. In one embodiment, the LSMUs (3413, 3423) and at least a portion of the parallel bus (3450) are located within the combiner box (3430).

In an embodiment, the solar array voltage output (3415) can be provided to a load (3430). Non-limiting examples of loads include computers, cell phones, single or multi-family dwellings, apartment or commercial structures, and rechargeable vehicles, to name a few.

In an embodiment, the management unit (3440) and/or the LSMUs (3413, 3423) can reside on or as part of the solar array (3400). In an embodiment, the management unit (3440) and/or the LSMUs (3413, 3423) can reside on one or more solar modules (3411, 3421). In an embodiment, the management unit (3440) and/or the LSMUs (3413, 3423) can reside outside the solar array (3400).

In an embodiment, the string output voltages of two more strong strings can be used to select the target voltage, when the string output voltages of these strong strings are within a predetermined range. The selected target voltage allows the LSMUs of these strong strings to operate in a bypass mode to reduce power consumption and/or conversion losses by the LSMUs. In one embodiment, there may be multiple groups of strong strings that have voltages within the predetermined range, and the group that can achieve a greatest reduction in power consumption via operating in a bypass mode is used to select the target voltage. The string output voltages of other strings are upconverted and/or downconverted to the target voltage. For example, two second strongest strings may have a lower string output voltage or a lower power output than the strongest string, but have a larger string output voltage or a higher power output than all other strings. When the two second strongest strings are used to select the target voltage they can be operated in the bypass mode. In one embodiment, when the two second strongest strings operate in bypass mode, the solar array output power can be greater than the solar array output power produced when only the strongest string is operated in bypass mode.

In an embodiment, the strings can be dived into a first group of strings and a second group of stings. The first group of strings have a greater string output voltage, or greater string output power, than the second group of strings. The first group of strings have string output voltages or power that are within a range of each other such that when connected to the parallel bus, their string output voltage or power is not degraded (or the degradation is less than operating them in non-bypass mode). In some embodiments, some of the strings in the second group may be stronger than the strings in the first group. The first group of strings is selected to operate in bypass mode to increase the power output of the array. For example, a first amount of power may be lost when a string is connected to the parallel bus via an LSMU in bypass mode, in which the string (and other strings connected to the parallel bus in bypass mode) might move away from the maximum power point because of the influence of the parallel bus; and a second amount of power may be lost when the string is connected to the parallel bus via the LSMU upconverting or downconverting the output voltage of the string. When the LSMU is not in the bypass mode, the LSMU can isolate the string from the parallel bus and thus allow the string to run on or near the maximum power point. However, the operation of upconverting or downconverting consumes power. When the first amount of power is less than the second amount of power, the string is selected to be part of the first group for bypass mode; and when the second amount of power is less than the first amount of power, the string is selected to be part of the second group for non-bypass mode.

Figure 35:
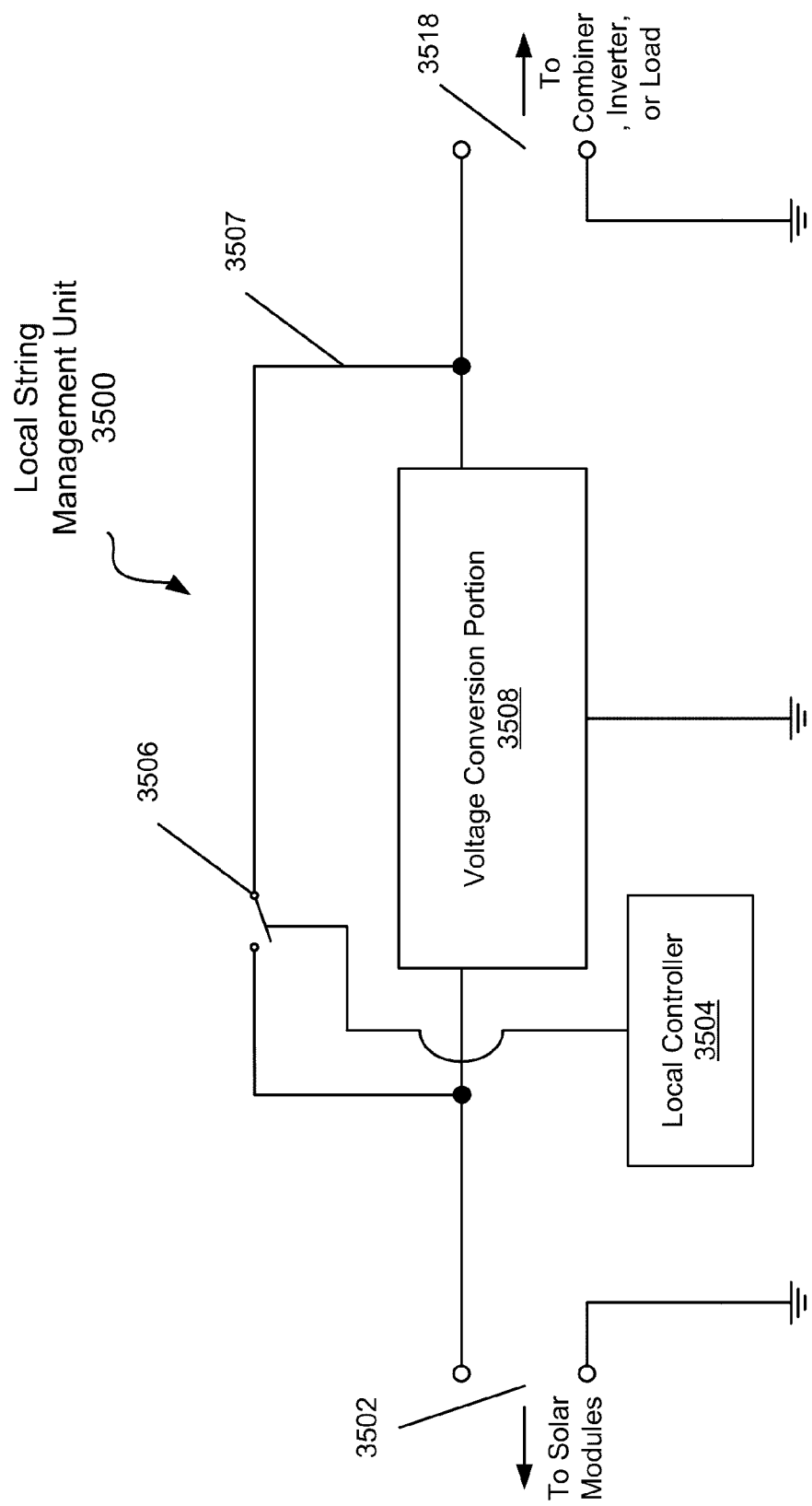
FIG. 35 illustrates an embodiment of a local string management unit (LSMU).

FIG. 35 illustrates an embodiment of an LSMU (3500). The LSMU (3500) can be configured to up-convert and/or down-convert an input voltage to a target voltage. The LSMU (3500) can include an input (3502) configured to receive an input voltage from the string. The LSMU (3500) can include a voltage conversion portion (3508) connected to the input (3502). The voltage conversion portion (3508) can be configured to convert the input voltage to the target voltage. The voltage conversion portion (3508) can be configured to operate in a bypass mode. The LSMU (3500) can include an output (3518) connected to the voltage conversion portion (3508). The output (3518) can be configured to provide the target voltage to a combiner, inverter, and/or load. For instance, the output (3518) can provide the target voltage to a combiner to be combined with output voltages from other strings. A combined output voltage from the combiner can then be provided to an inverter and from there provided to a load or the grid.

As noted, the LSMU (3500) can include the input (3502). The input (3502) can be configured to receive an input voltage from the string. The input (3502) is a portion of the LSMU (3500) capable of forming a conductive path with other electrical devices. For instance, the input (3502) can be connected to the string. In an embodiment, the input (3502) can be a connector or a terminal. The input (3502) can have two poles, one positive and one negative. The negative pole can be grounded.

As noted, the LSMU (3500) can include the voltage conversion portion (3508). The voltage conversion portion (3508) can be configured to convert the input voltage to a target voltage. In other words, the voltage conversion portion (3508) can be a transformer or any voltage-converting device or circuit (e.g., Buck, Buck-Boost, and Cuk converters, to name a few). In one embodiment, the voltage conversion portion (3508) is configured to upconvert the input voltage. In another embodiment, the voltage conversion portion (3508) is configured to downconvert the input voltage. In a further embodiment, the voltage conversion portion (3508) can be configured to either upconvert or downconvert the input voltage, based on a control signal.

In one embodiment, the target voltage for the parallel bus (3450) is determined to increase the total power output from the strings (3410, 3420) to the parallel bus (3450). In the one embodiment, an LSMU is placed in the bypass mode to increase the total energy output of the solar array. For example, if the power consumption of the converter of an LSMU operated in a voltage-converting mode is larger than the drop of power output caused by operating the LSMU in a bypass mode, then the LSMU can be switched to the bypass mode to increase overall power output; otherwise, the LSMU can be switched to the voltage-converting mode The voltage conversion portion (3508) can include multiple systems, one of which is used to upconvert the input voltage and the other is used to downconvert the input voltage. The LSMU (3500) or the voltage conversion portion (3508) can be configured to operate in a bypass mode. The voltage conversion portion (3508) can cause 1-2% energy loss when it is downconverting or upconverting the input voltage. Thus, when the string that the LSMU (3500) is connected to is identified as a string having a string output voltage within a range from the output voltage of the strongest string voltage of a string output voltage of a strongest string, and the target voltage is within a range from the output voltage of a strongest string, the LSMU (3500) can avoid the 1-2% energy loss by operating in the bypass mode.

As noted previously, the bypass mode is a low-loss mode wherein current is routed through a low-loss conductive path. For instance, the switchable connection (e.g., transistor) (3506) can be used to route current around the voltage conversion portion (3508). This allows current to pass from the string, through the LSMU (3500), and to the combiner, inverter, or load while avoiding the losses of traveling through the voltage conversion portion (3508). The voltage conversion portion (3508) can have a connection to ground.

A local controller (3504) can control the switchable connection (3506). For instance, if the switchable connection (3506) is a transistor, then the local controller (3504) can control the transistor (3506) gate. The local controller (3504) can be implemented in hardware, software, or a combination of the two. In an embodiment, a diode can be connected in parallel to the transistor (3506), or used to replace the transistor (3506) in another embodiment.

As noted, the LSMU (3500) provides the output (3518). The output (3518) can be configured to provide the target voltage to a combiner, inverter, or load. The output (3518) is a portion of the LSMU (3500) capable of forming a conductive path with other electrical devices. For instance, the output (3518) can be connected to an inverter or load. Non-limiting examples of the output (3518) include a connector or terminal, to name two. The output (3518) can be connected to outputs from other LSMUs. In an embodiment, outputs of different LSMUs can be combined within a combiner. Connections between LSMU outputs can be made in parallel. In an embodiment, the output (3518) can provide a fixed voltage inverter voltage to an inverter (or to a combiner and then to an inverter). The output (3518) can have two poles, one positive and one negative. The negative pole can be grounded.

Figure 36:
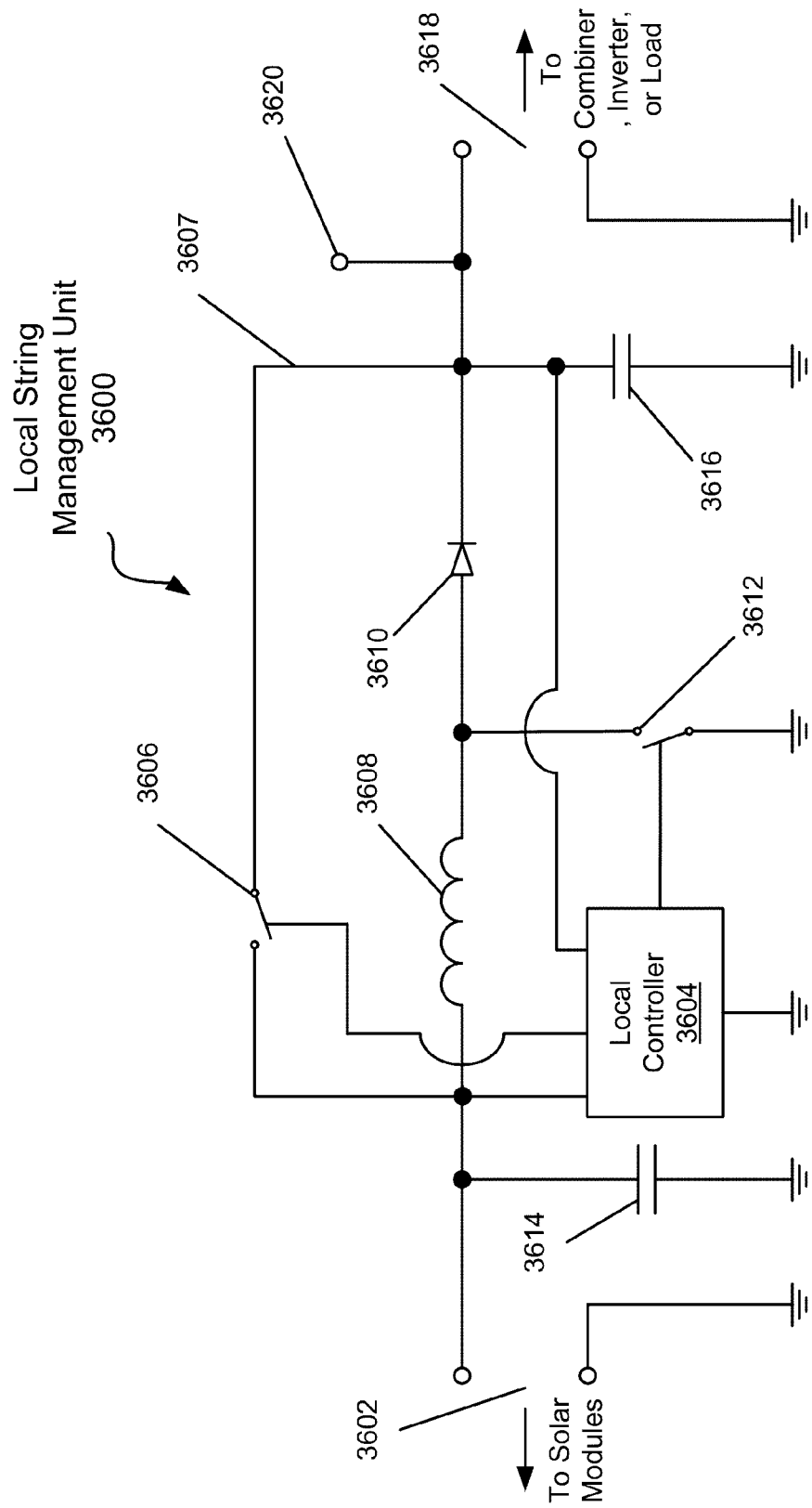
FIG. 36 illustrates another embodiment of an LSMU.

FIG. 36 illustrates another embodiment of a local string management unit (3600). The LSMU (3600) is similar to the LSMU (3500), but provides details as to possible components that make up the voltage conversion portion (3508). In the illustrated embodiment, such components function to convert and filter the input voltage. Like the LSMU (3500), the LSMU (3600) includes an input (3602), an output (3618), and can include a switchable connection (3606) for enabling current to bypass the voltage conversion circuitry.

Unlike LSMU (3500), LSMU (3600) can include an input filter capacitor (3614) and can include an output filter capacitor (3616). The LSMU (3600) also can include a diode (3610) or rectifier. The LSMU (3600) can include a local controller (3604), which can be implemented in hardware, software, or a combination of the two. The local controller (3604) can be in communication with the management unit (3440) discussed with reference to FIG. 34.

In one embodiment, the LSMU (3600) includes a booster converter which includes an inductor (3608) and a switchable connection (3612). The output voltage of the boost converter is determined by the duty cycle of the switch (3612). In the bypass mode, when the switchable connection (3606) is closed, losses due to current passing through the inductor (3612) and the diode (3610) are reduced (and/or are negligible). Thus the ratio of input voltage to target voltage can be controlled via the local controller (3604). The local controller (3604) can also control the bypass mode by controlling the switchable connection (3606). The LSMU (3600) can include a connection (3620) able to connect to other LSMUs. For instance, the connection (3620) can allow LSMUs to be connected within a combiner box.

Figure 37:
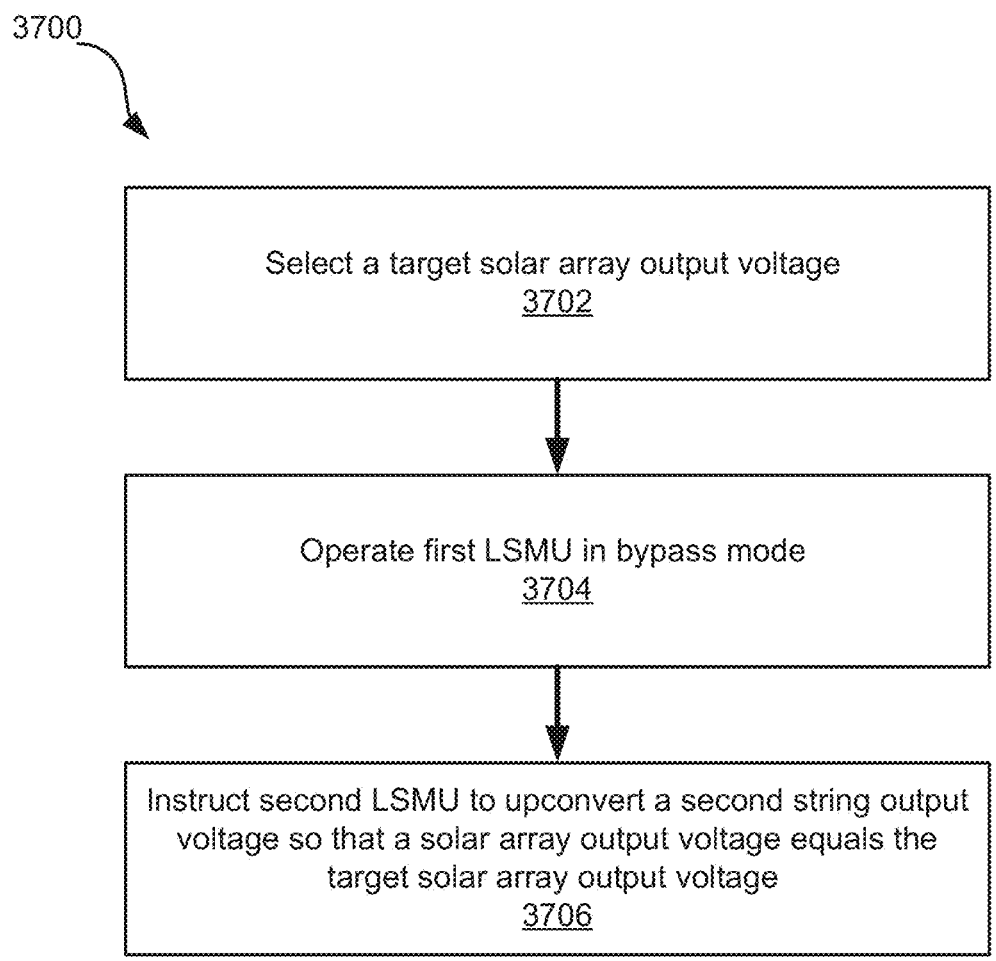
FIG. 37 illustrates an embodiment of a method for balancing strings in a solar array using LSMUs.

FIG. 37 illustrates an embodiment of a method for balancing strings in a solar array using LSMUs. The method (3700) can include a select operation (3702), an operate operation (3704), and an instruct operation (3706).

The select operation (3702) can include selecting the output voltage of a string having a string output voltage within a range from the output voltage of a strongest string as a target voltage. A string having a string output voltage within a range from the output voltage of a strongest string can be referred to as a "strong string." Alternatively, the select operation (3702) can include selecting the average string output voltage of strong strings as the target voltage. The select operation (3702) can be carried out by LSMUs or the management unit. In an embodiment, strong strings and weak strings (having string output voltage not within the range from the output voltage of the strongest string) can be identified. Having identified one or more strong strings, the string output voltages from weak strings can be upconverted in order to cause the solar array output voltage (3415) of the parallel bus (3450) to equal (or match or converges on) the string output voltage (3414, 3424) of the strongest string. Identification of strong strings is not a required operation since such identification can have occurred before the method (3700) begins.

The operate operation (3704) can include operating a first LSMU in a bypass mode. The first LSMU converts the string output voltage for a strongest string or a strong string (a string having a string output voltage that is within a range from the output voltage of the strongest string). In an embodiment, the first LSMU is an LSMU that can be bypassed to increase the total power output of the strings. Bypass mode can be used when the solar array target voltage equals or matches the string output voltage of the strongest string or when the solar array target voltage is within the range from the output voltage of a strongest string. The bypass mode can be used to allow current to pass through or around a first LSMU without a voltage drop due to current passing through high resistance or high impedance circuitry in the first LSMU. When an LSMU operates in bypass mode, the string operates at the voltage of the parallel bus, which may be different from the maximum power point voltage of the string. In other words, there can be a small power loss.

The method (3700) can include an instruct operation (3706) where a second LSMU is instructed to upconvert a second string output voltage so that the solar array output voltage equals the target voltage. The second LSMU can be connected to a second string. The second string can be a weak string or a string having a string output voltage that is not within a range from the output voltage of a strongest string. The instruct operation (3706) can include providing instructions (signals or commands) to the second LSMU to upconvert the second string output voltage. In an embodiment, a management unit provides the instructions to the second LSMU. In an embodiment, a controlling LSMU provides the instructions to the second LSMU. In an embodiment, the controlling LSMU is the second LSMU, so the second LSMU provides the instructions to itself.

After the instruct operation (3706), the method (3700) can repeat or loop. Alternatively, the method (3700) can wait for one or more loops of an MPPT algorithm to run. Once the MPPT algorithm has run one or more times, solar modules on the string can be balanced, and the method (3700) can begin again. The inverter carries out the MPPT algorithm. In an embodiment, the MPPT algorithm runs at the same time that the method (3700) operates. In other words, the inverter tries to find the solar array's MPP while the solar array is balancing currents produces by solar modules on each string and balancing voltages between the parallel-connected strings. The MPPT algorithm does not have to stop for balancing of solar modules and strings to take place.

In one embodiment, an inverter is allowed to be powered by two (or more) separately controlled strings, connected to the parallel bus (3450) via respective LSMUs, and to operate with its internal MPPT algorithm (that is typically designed for a single string) to deliver optimal or near optimal overall system performance. This arrangement does not require that the inverter's internal MPPT be turned off or the need to move the inverter to a fixed input voltage, and also not require a separate MPPT per string. In one embodiment, the inverter is to operate at its optimal spot continuously, as power generation conditions change constantly; and hence the system performs continuous rebalancing to achieve optimal operation.

In one embodiment, the inverter's MPPT algorithms pull and tug current to create current changes delta current (dl). The algorithm to control the LSMUs has several operations to calculate the dl for every string and to cause the corresponding current change by adjusting PWM value on LSMUs connected to weaker string(s). The inverter takes further operations to get to the maximum power point.

For example, in one embodiment, the delta current of each string (dIk) is calculated when the string is connected via an LSMU. Weak strings are identified. It may be checked whether disconnecting those strings would produce more power. The average delta current is then calculated for the weak strings (dIW). For each strong string, adjust or keep PWM values of its LSMU to be 100% or near 100% (minimal or no change the string). Other strings are adjusted to match voltage set by strong string by changing their voltage output driving PWM to a different value than 100%. Wait some time to allow the inverter to run several MTTP cycles, before repeating the operations to balancing the strings.

In one embodiment, the decision of whether to up-convert in some cases the strong string may depend on several factors, including weak solar irradiation, temperature, and the parameters of the string vs. the inverter, amongst other consideration, but the decision is not limited to these factors.

In an embodiment, an MPP for the strong string can be determined. The strong string can then operate at its MPP. In an embodiment an inverter can run an MPPT algorithm to determine the MPP for the strong string and the strong string can then operate at its MPP.

In an embodiment, the method (3700) can include identifying one or more strong strings and one or more weak strings. Strong strings and weak strings can be identified as previously described (see discussion of FIG. 26). In an embodiment, the weak string can be disconnected from the solar array, and a resulting change in the power output of the solar array monitored to see if disconnecting the weak string improves the solar array power output. Disconnecting can include setting a duty cycle of a switchable connection (e.g., transistor) in the LSMU to zero (always off or open). It should also be understood that while the method (3700) refers to only a single strong string and a single weak string, the method can also be applied where there is more than one strong string and/or more than one weak string.

Figure 38:
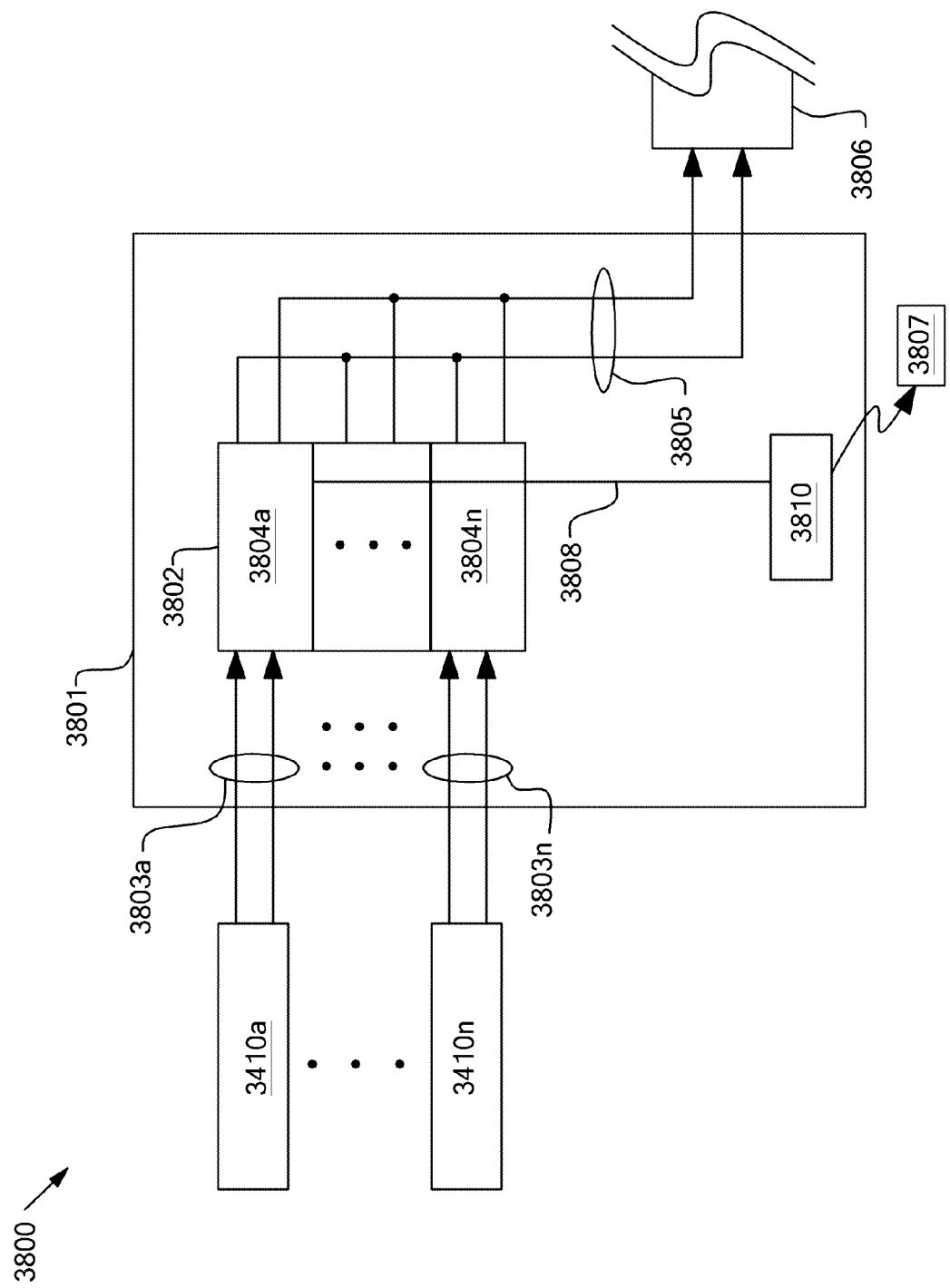
FIG. 38 illustrates an embodiment of a modular unit system used to improve the energy production performance of photovoltaic systems.

To further improve the energy production performance of photovoltaic systems and/or reduce the cost of the systems, an enhanced system and method is provided for measuring relevant data of any string to help managers decide whether to add or remove an LSMU from a string. FIG. 38 illustrates an overview of an exemplary system (3800), according to one aspect of the system and method described herein. Strings (3410*a-n*) are complete strings with LMUs, etc., as illustrated in FIG. 34 and discussed throughout. As described in more detail below, each of the strings (3410*a-n*) is connected or routed to one of the removable modules (3804*a-n*) through connection pairs (3803*a-n*) corresponding to the power input cables from the respective strings (3410*a-n*) of solar panels. In one embodiment, the modules (3804*a-n*) are installed in the combiner box (3801) and configured to be in the form of blades, or thin modular electronic circuit boards, and are enclosed in a blade enclosure, such as cage (3802), capable of holding multiple blades and configured such that an operator can insert a blade into or remove a blade out of the cage (3802).

The modules (3804*a-n*) implemented in the form of blades can be simple bypass blades which can simply facilitate an electric connection between the strings (3410*a-n*) and the load bus (3805), bypass blades with measurement and disconnect features, or bypass blades with measurement and disconnect features as well as an LSMU, such as the blade illustrated in FIG. 34. In one embodiment, an operator can easily remove a blade from the cage (3802) by pulling the blade away from the cage (3802), or by other non-destructive ways to disengage/uninstall the blade from the cage (3802), such as pushing one or more levelers configured to eject the blade from a slot connector or receptacle in which the module is installed/inserted.

In an embodiment, modules (3804*a-n*) implemented in the form of blades have five connections/connectors through which the blades are connected to other system components in the cage (3802), which provides a housing to the components disposed therein. The connections include two connections (3803*a-n*) (one pair each) through which each module (3804*a-n*) implemented in the form of a blade is connected to the corresponding string (3410*a-n*); two connections through which each module (3804*a-n*) implemented in the form of a blade is connected to the load bus (3805); and one connection through which each module (3804*a-n*) implemented in the form of a blade is connected to local controller (3810) through a controller bus (3808). The load bus (3805) is connected to the inverter or other energy consuming unit (3806).

As illustrated in FIG. 38, the local controller (3810) communicates with a central controller (3807) of the overall system. This communication may be achieved by a wired connection or a wireless connection. Even though controller bus (3808) is illustrated as a single unit in FIG. 38, in other embodiments, controller bus (3808) may comprise of discrete lines (not shown). In another embodiment (not shown), the system (3800), rather than having a single local controller (3810), has a small controller in each module (3804*a-n*) implemented in the form of a blade. In other embodiments, each module (3804*a-n*) implemented in the form of a blade may have its own local controller (not shown), and the local controller may employ a simple communication protocol such as, for example, an I2 bus or similar to communicate with local controller (3810). In one embodiment, some of the functions of the LSMU as discussed above (e.g., described in connection with FIG. 34) are moved from the modules (3804*a-n*) implemented in the form of blades to the local controller (3810) to reduce the cost of the modules (3804*a-n*) implemented in the form of blades and the cost of the overall system (since the modules (3804*a-n*) implemented in the form of blades can share the functions implemented in the local controller (3810) through the controller bus (3808)). In one embodiment, some functions of the LSMU as discussed above are implemented in one (or more) of the modules (3804*a-n*) implemented in the form of blades; and other modules (3804*a-n*) implemented in the form of blades without such functions are configured to communicate with modules (3804*a-n*) implemented in the form of blades having such functions in a way to communicate with the local controller (3810) to implement such function. Such a location controller (3810) can be implemented in one or more of the removable modules (3804*a-n*) implemented in the form of blades in one embodiment.

Figure 39B:
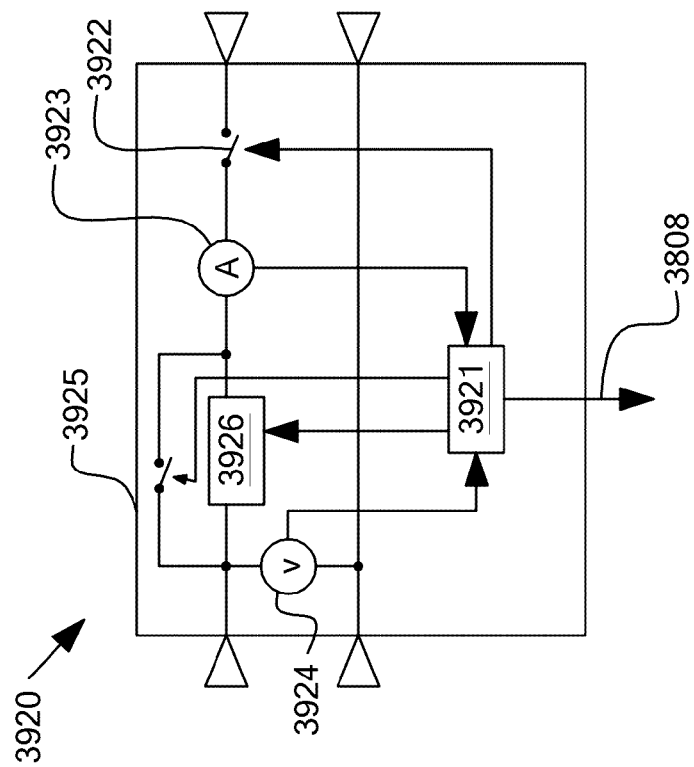
FIGS. 39A and 39B illustrate two embodiments of a modular unit's circuitry that can be used in the modular unit system of FIG. 38.
Figure 39A:
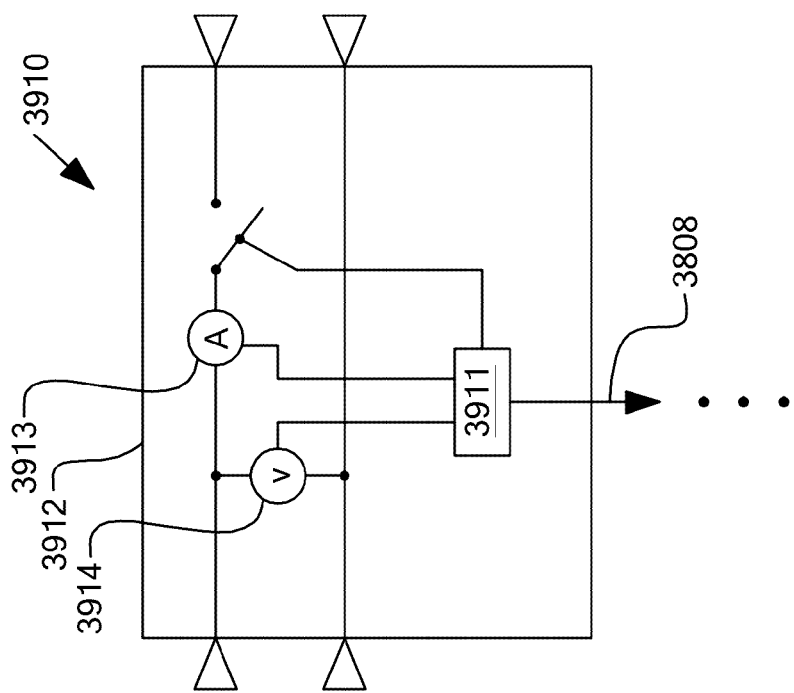

FIGS. 39A and 39B illustrate measure-and-disconnect and measure-and-disconnect-with-LSMU module types, respectively, according to various aspects of the system and method disclosed herein. FIG. 39A illustrates the measurement-and-disconnect module having a voltage-measuring unit (3914) for measuring voltage, a current-measuring unit (3913) for measuring current provided by a string connected to that module, and a switch (3912) for connecting or disconnecting the string to or from the load bus (3805). The measuring units (3914 and 3913) and switch (3912) can interact with a local processor (3911) which connects, via the controller bus (3808) back to the local controller (3810), which in turn connects back to the central controller (3807), as illustrated in FIG. 38.

FIG. 39B illustrates an embodiment similar to that of FIG. 39A, except that it includes an upconversion unit (3926) (e.g., as in an LSMU discussed above in connection with FIG. 34), and a bypass switch (3925) that can be activated by controller (3921) to bypass upconversion unit (3926). Switch (3922) is analogous to switch (3912) of FIG. 39A, and is utilized for connecting or disconnecting the string to the module. In one embodiment, the switches (3925, 3922, and 3912) are mechanical switches; in other embodiments the switches (3925, 3922, and 3912) may include solid-state switches instead of mechanical switches, or other types of switching devices. Thus, the switches illustrated in the drawings are not necessarily mechanical switches. In some embodiments, a bypass diode (not shown) may be utilized.

Figure 40:
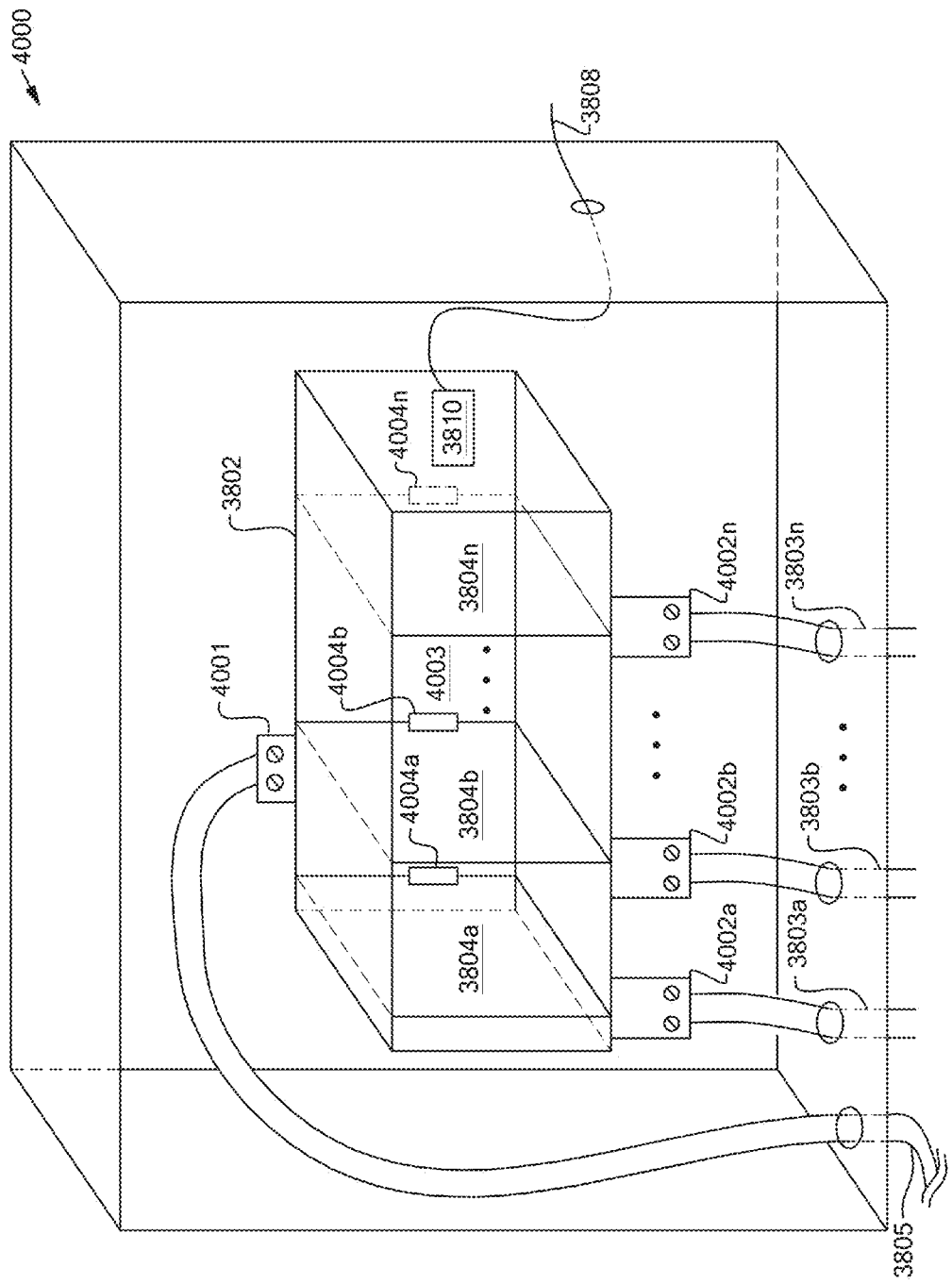
FIG. 40 illustrates an overview of an embodiment of a modular unit system used to improve the energy production performance of photovoltaic systems having a housing to encase the modular unit system.

FIG. 40 illustrates an overview of a case (4000) which can be utilized to encase the cage (3802) of FIG. 38, according to one aspect of the system and method described herein. Cage (3802) can be mounted in the center of case (4000). The illustrated embodiment of FIG. 40 further includes screw terminal block (4001), to which the load bus (3805) is connected, as well as screw terminal blocks (4002*a-n*), to which the string cables (3803*a-n*) are connected. In some embodiments, the load bus (3805) and the string cables (3803*a-n*) are secured to screw terminal blocks (4002*a-n*) with screws, and in other embodiments, the connection can be made with special secure fasteners and/or connectors. The screw terminal blocks (4002*a-n*) supply the current into the backplane board (4003) of cage (3802). As illustrated in FIG. 40, the backplane board (4003) can be a printed circuit board (PCB) secured in the cage (3802) into which the modules (3804*a-n*) implemented in the form of blades are connected by sliding into connectors (4004*a-n*). In a preferred embodiment, an operator can easily remove a blade from the cage (3802) by pulling the blade away from the connectors (4004*a-n*). In one embodiment, connectors (4004*a-n*) have multiple contacts for each of the power connectors. Connectors (4004*a-n*) can also have additional spacing between those connections due to the high voltage and required creepage distance, and can have as many connections as needed to the controller bus (3808). The controller bus (3808) is connected to the local controller (3810). In some embodiments, the local controller (3810) can be a separate module also plugged into backplane board (4003), while in other embodiments, the local controller (3810) can be implemented directly on the backplane board (4003). Further, in some embodiments, the screw terminals (4002*a-n*) can be secured directly on the modules (3804*a-n*) implemented in the form of blades instead of on the backplane board (4003), thereby reducing the number of necessary interconnections.

Figure 41:
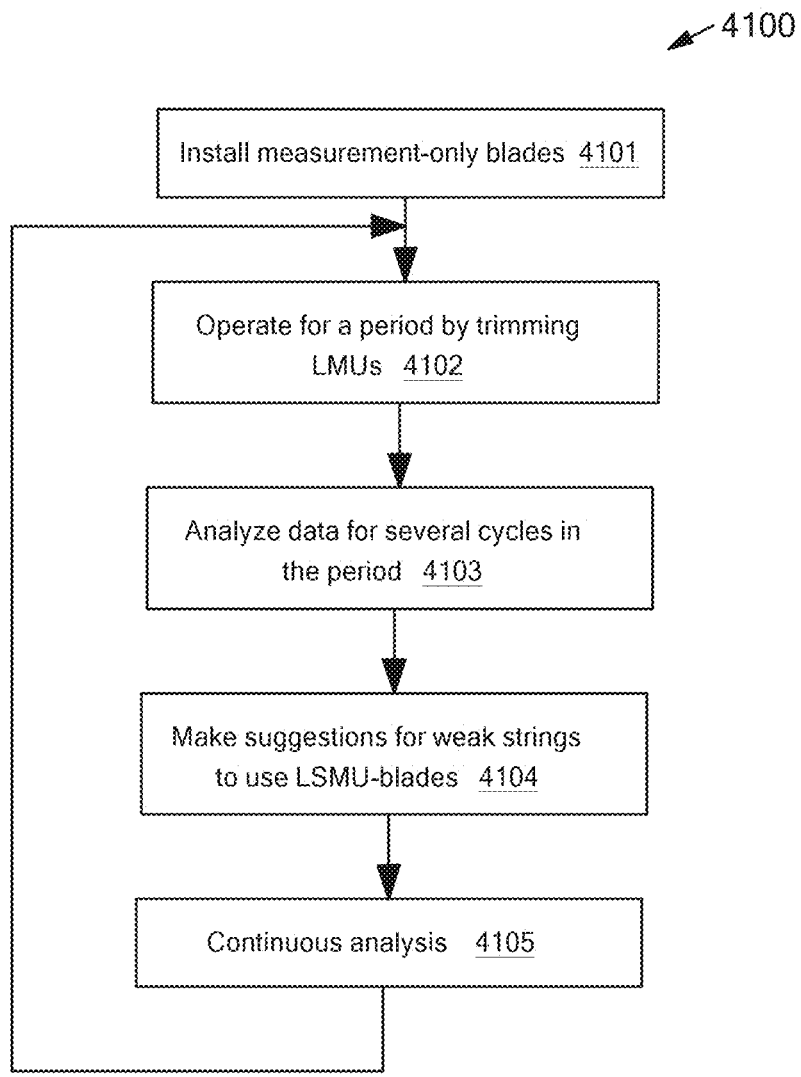
FIG. 41 illustrates an embodiment of a method for improving the energy production performance of photovoltaic systems.

FIG. 41 illustrates an overview of an exemplary process flow (4100), according to the system and method disclosed herein. In step (4101), all measurement-only blades are installed. In step (4102), the system operates for a certain period by trimming the LMUs, thereby essentially reducing the voltage on the strong strings to match the voltage on the weaker strings. The time period during which the system operates with all measurement-only blades can be as short as one or two days, a few months, or as long as several years, or otherwise before a string starts to degrade due to aging. After the period of operation (4102) has elapsed, the string performance data is analyzed in operation (4103). In light of the analysis performed in operation (4103), suggestions are made identifying weak strings to receive a blade with an LSMU for voltage upconversion in operation (4104). In one embodiment, the suggestions are made based on comparing the measurements to a predetermined target direct current range, which can be a target voltage range, a target power range, or a target current range for the parallel bus, as discussed throughout herein. In operation (4105), after the installation of blades on weak strings, the analysis of string performance data resumes and continues. The process then cycles back to operation (4102) after a certain period of time, such as, for example, every two or three months, and the system operation is again analyzed and modified as described above. In some embodiments, the review and analysis cycle described above may be used to adjust the strings in the system as needed for seasonal changes in solar power and position. In other embodiments, the review and analysis cycle is utilized in identifying and mitigating the adverse effects of panel aging in certain strings.

Figure 42:
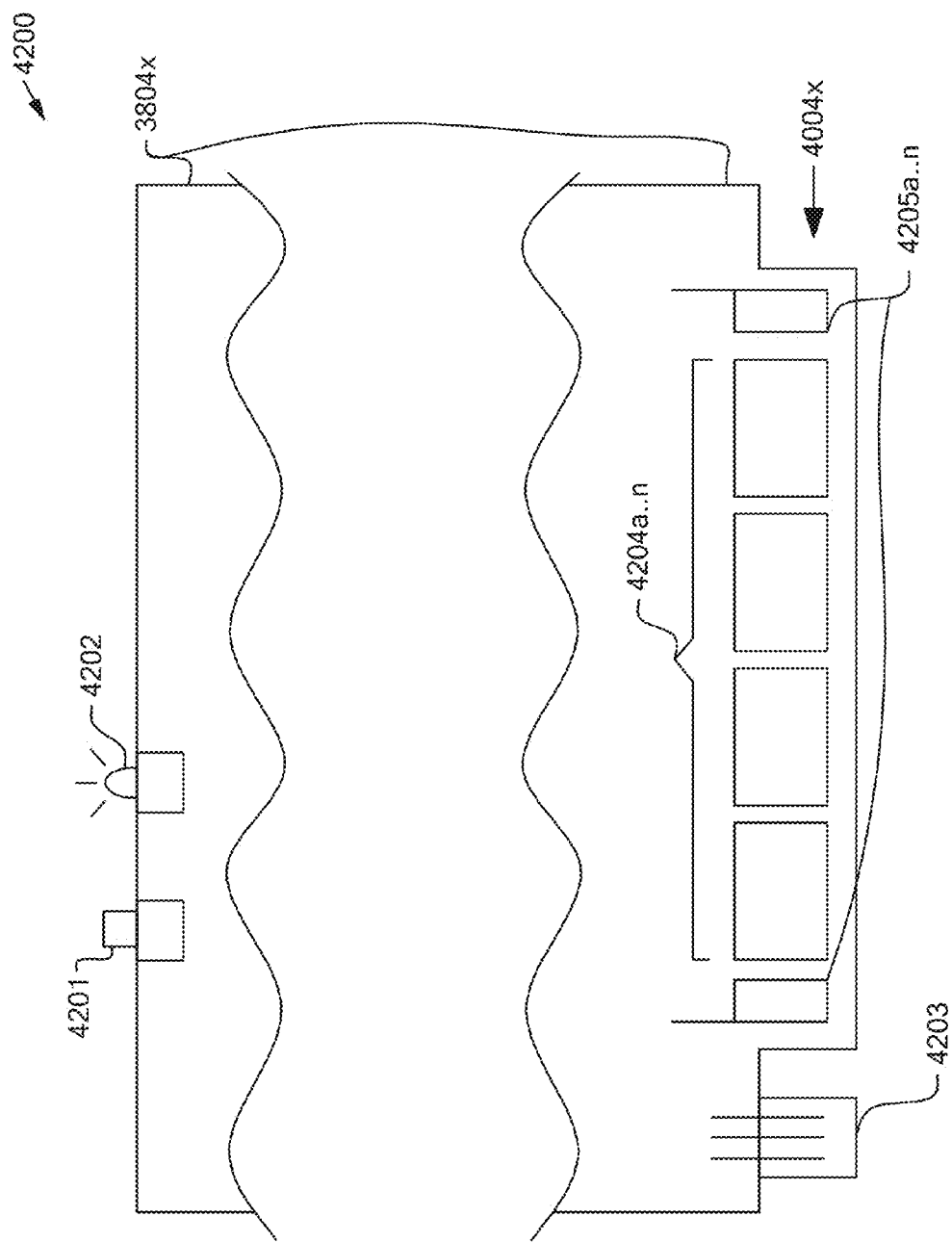
FIG. 42 illustrates an overview of an exemplary modular unit in form of a blade for use in a modular unit system used to improve the energy production of photovoltaic systems.

FIG. 42 illustrates an overview of exemplary feature set (4200) of module (3804x) implemented in the form of a blade, according to one aspect of the system and method disclosed herein. As explained above, the blade utilized in some embodiments described herein can be a simple bypass blade, a bypass blade with measurement and disconnect features, or a bypass blade with measurement and disconnect features as well as an LSMU, such as the blade illustrated in FIG. 34. As such, module (3804x) implemented in the form of a blade may or may not have all components of an LSMU illustrated in FIG. 34.

In one embodiment, a switch device (4201) enables a user to push a button, for example, to trigger a system switch such as switch (3912) or (3922) illustrated in FIGS. 39A and 39B, respectively, to turn off the current before removing a blade for exchange or maintenance, thus avoiding any arcing. In one embodiment, an indicator light (4202) (or other suitable indicator, for example electrophoretic, LCD, etc.) can be utilized to indicate the on/off status of the unit. Connector (4004x), as illustrated herein in greater detail, includes two sections with the controller section (4203) illustrated as a separate piece. A person of ordinary skill in the art would appreciate that such separation is not necessary, but in many cases, additional spacing is desired for galvanic separation for creeping current, etc. In one embodiment, four high-powered connectors (4204a-n) fit into a section whose width accommodates all of them, with the width necessary to provide multiple contacts for each of the higher currents and voltages in a typical system. In some embodiments, spaces between each connector may be added to provide better galvanic separation.

In one embodiment, two short pins (4205a-n) are grouped with the high-powered connectors (4204a-n). These short pins (4205a-n) can be, for example, half-length, so as to make contact when module (3804x) implemented in the form of a blade is fully inserted. If module (3804x) in the form of a blade is removed without prior deactivation of the circuit, disconnection of short pins (4205a-n) would occur prior to the disengagement of the high-powered connectors (4204a-n) and thus immediately cause the controller (e.g., 3810, 3911, or 3921) to break the circuit before the main power is disrupted, thus giving the controller (e.g., 3810, 3911, or 3921) time to turn off switches (3922) and (3912).

Figure 43:
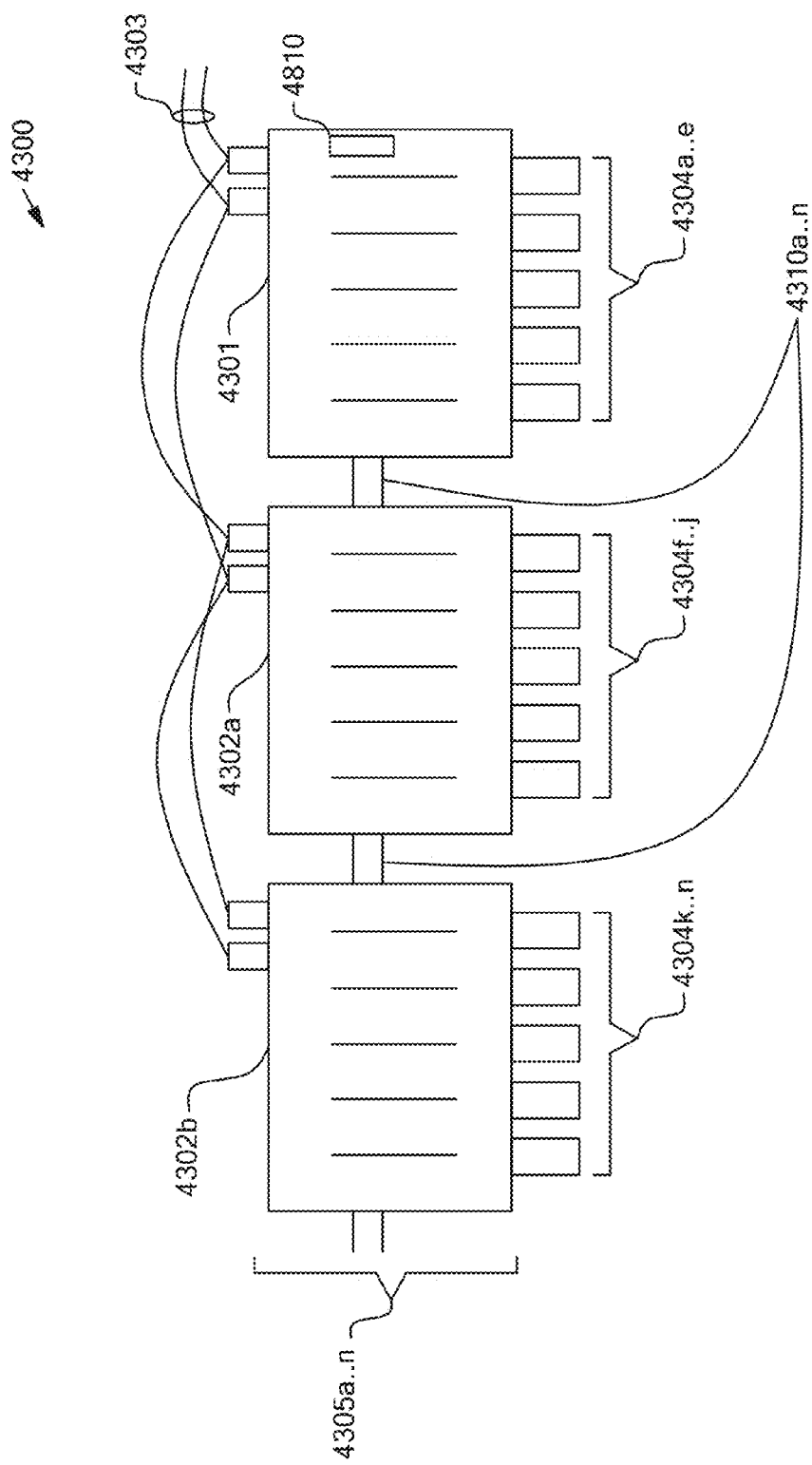
FIG. 43 illustrates an alternative embodiment of a modular unit system used to improve the energy production performance of photovoltaic systems.

FIG. 43 illustrates an exemplary alternative embodiment (4300) of cage (3802), previously described in relation to FIG. 40, according to one aspect of the system and method disclosed herein. Rather than installing one long cage that often is only partially used, in a modular approach, multiple cages may be installed, with each cage unit having a plurality of receptacles or connector slots to receive the removable modules. The receptacles or connector slots have connectors corresponding to the connectors (e.g., 4203, 4205, 4204) of a removable module. When the removable module is installed in the receptacle or connector slot, the connectors of the removable module and the connectors of the receptacle or connector slot make contact with each other to form electrical connections between the circuitry on the removable module and the circuitry on the cage (3802). In one embodiment, the case (4000) includes a controller cage unit (4301) having a controller (3810), and two slave cage units (4302a) and (4302b) each having six receptacle slots. One skilled in the art would appreciate that the number of slots is purely exemplary. In fact, a box may contain, for example, three cages with 12 slots each, for a total of 36 strings, etc. However, in one embodiment, the slave cage units contain six slots, because current combiner boxes are typically sized in increments of six. While as illustrated in FIG. 43, slave cage units (4302a) and (4302b) do not contain their own controller (3810) and rely on internal connections (4310a-n) in a daisy-chain format to connect to controller cage unit (4301), in other embodiments, more than one slave cage unit may contain a controller. As illustrated in FIG. 43, the power bus (4303) is connected by daisy-chaining the plug-in or screw-on cables to the cage units (4301, 4302a and 4302b), and each cage unit (4301, 4302a and 4302b) has its own connections (4304a-n) for the string cables (3803a-n).

Figure 44:
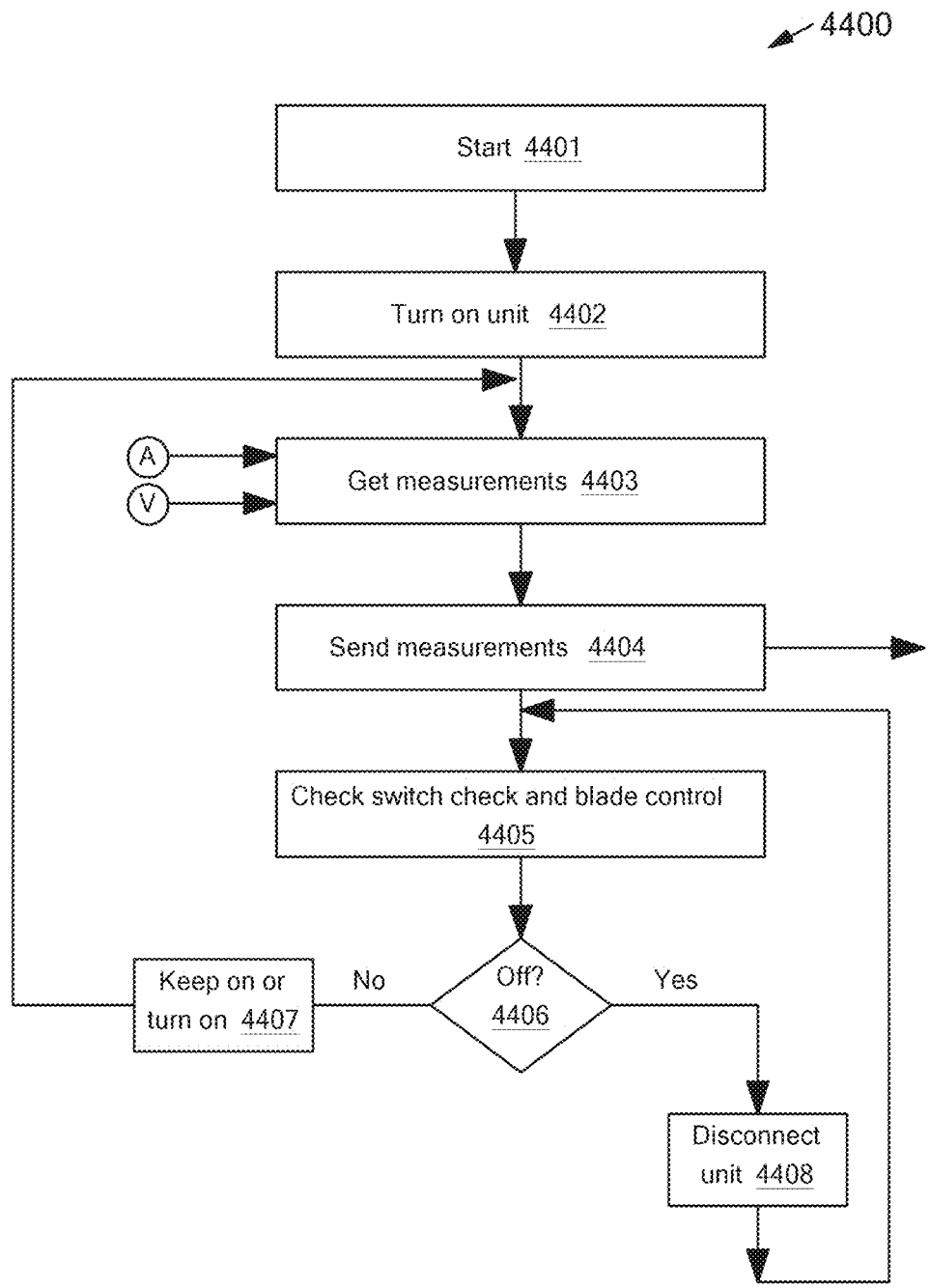
FIG. 44 illustrates an embodiment of a method for utilizing a modular unit system in improving the energy production performance of photovoltaic systems.

FIG. 44 shows an exemplary process (4400) for operation of the removable module unit, according to one aspect of the system and method disclosed herein. The system is initialized (4401) after the strings (3410a-n) are connected to the modules (3804a-n) implemented in the form of blades. The blade unit is turned on (4402), which can be done by switch (3912) or (3922). Measurements are received (4403) in the controller (e.g., 3911 or 3921) of the blade from amp and voltage meters (if both are present; in some cases, only one or the other type of meter may be present) of the blade. The measurements are sent to the local controller (3810) from the controller (e.g., 3911 or 3921) of the blade via the controller bus (3808). The system (e.g., the controller (3911) or (3921) of the blade, the local controller (3810), and/or the central controller (3807)) checks (4405) to determine if the switch (3912) or (3922) or the short pins (4205a-n) on the blades have been activated (e.g., in a position indicating that the blade is not fully seated in the receptacle or connection slot). If it is determined (4406) that either is activated, the blade is disconnected by turning off switch (3912) or (3922). The system (e.g., the controller (3911) or (3921) of the blade, the local controller (3810), and/or the central controller (3807)) continuously checks (4405) the switch (3912) or (3922) or the short pins (4205a-n) until the blade is fully seated. If the switch (3912) or (3922) or the short pins (4205a-n) on the blades have not been activated (e.g., in a position indicating that the blade is fully seated in the receptacle or connection slot), the blade is kept on or turned on (4407) by turning on the switch (3912) or (3922). When the switch (3912) or (3922) is turned on or off (to connect or disconnect the string from the load bus (3805)), the system (e.g., under the control of the controller (3911) or (3921) of the blade, the local controller (3810), and/or the central controller (3807)) may turn light (4202) on or off, according to the status of the switch (3912) or (3922). Further, in some cases, arc detection circuitry may be added to either the LSMU or the bypass module. Using arc detection/prevention is functionally orthogonal to some of the LSMU/bypass card functions discussed above, but complements the functionality nicely. In some cases arc detection may cover the whole box only, in lieu of each string separately.

Figure 45:
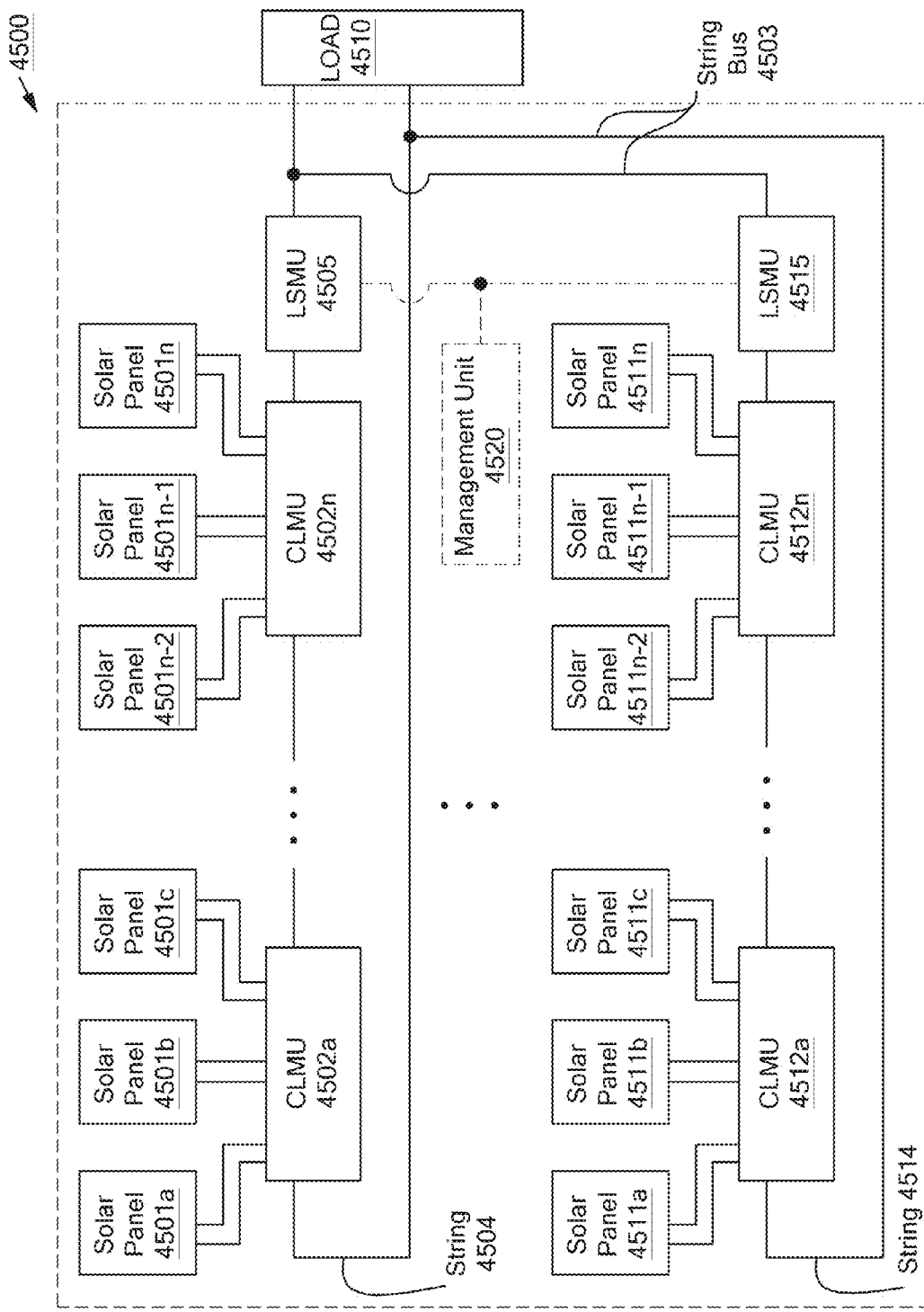
FIG. 45 illustrates an embodiment of a system utilizing combined local management units (CLMUs) to improve the energy production performance of photovoltaic systems.

FIG. 45 illustrates an exemplary overview of a photovoltaic system (4500) having a plurality of strings (e.g., 4504 and 4514) for supplying electric power to a load (4510), which among other things, can be a power grid, a string combiner, or an inverter. The system utilizes combined local management units (CLMUs) (e.g., 4502*a-n*), each configured to operate more than one solar panel (e.g., 4501*a-c*) to the string bus (4503), as compared, for example, to the system illustrated in FIG. 34, wherein each solar panel is connected to and managed by a separate LMU dedicated thereto. For purposes of clarity and simplicity, the system illustrated in FIG. 45 includes two sets of series connected CLMUs (4502*a-n* and 4512*a-n*), with each CLMU connected between a three-panel group (e.g., 4502*a-c*) and the string bus (4503). One skilled in the art would recognize that the system disclosed herein is not limited to the illustrated exemplary system, and may include additional or fewer strings and CLMUs, or groups of solar panels with more or fewer solar panels connected to the CLMUs.

In one embodiment, the strings (e.g., 4504 and 4514) can be received in and managed via the LSMUs (e.g., 4505 or 4515), which can be any of the LSMUs disclosed herein. For example, a modular unit string management system as illustrated in FIGS. 38 and 40 can be used to implement the LSMUs (e.g., 4505 or 4515) in a combiner box.

In one embodiment, the system management unit (4520) can be utilized to determine one or more operating parameters (e.g., duty cycles, phases, synchronize pulses, etc.) based on measurements of the operating voltages and currents of the solar panels as reported by the individual CLMUs (e.g., 4502*a-n*). A CLMU (4502*a*) is configured to determine its own duty cycles for operating the respective solar panels (e.g., 4501*a-c*) with or without relying upon communicating with other management units. The duty cycles are configured to separately operate the solar modules in the group connected to the CLMU at the maximum power point.

Figure 46:
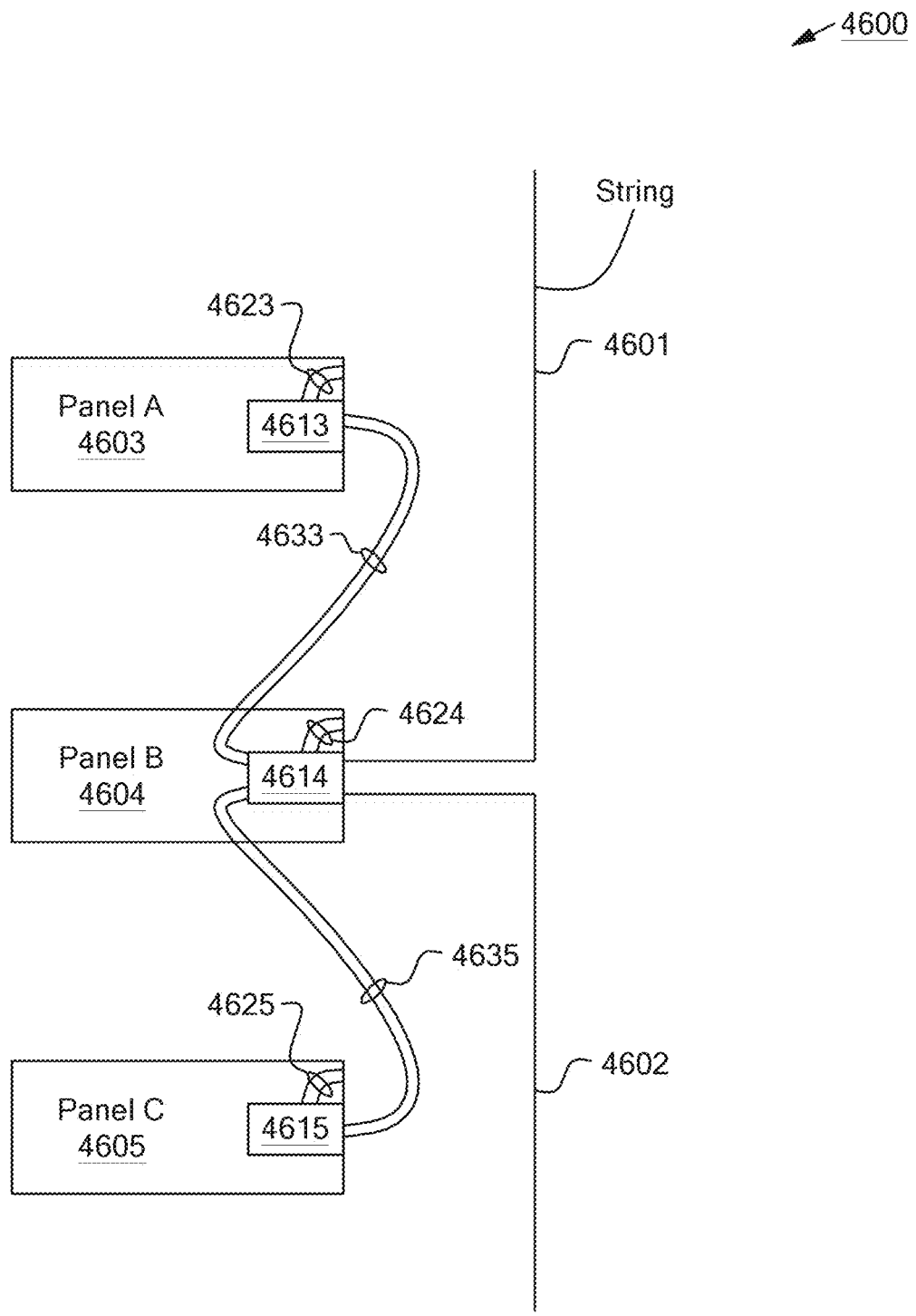
FIG. 46 illustrates an exemplary embodiment of a system having three solar panels connected to a solar string through a single CLMU.

FIG. 46 illustrates an exemplary overview of a system (4600) which utilizes a CLMU housed inside a junction box (e.g., 4614) of a solar panel (e.g., 4604) to manage the solar panels (e.g., 4603, 4604 and 4605) that are connected to the CLMU. For purposes of clarity and simplicity, the exemplary system illustrated in FIG. 46 includes a three-panel group consisting of Panel A (4603), Panel B (4604), and Panel C (4605). One skilled in the art would understand that the system disclosed herein is not limited to a single group of panels, or to three-panel groups. For example, the system disclosed herein may include a group of panels in a string having more or fewer panels than three. Also, the disclosed system can include more than a single group of panels with each group connected to a CLMU.

In one embodiment, the CLMU functions as an LMU discussed above for each individual solar panel (e.g., 4603, 4064 or 4605) to separately operate the solar panels/solar modules. However, combining the LMU functions in a CLMU allows the sharing of common components and reducing of the number and cost of management units present in the system.

In the exemplary system (4600) illustrated in FIG. 46, the junction box (4614) on Panel B 4604 houses the CLMU. In one embodiment, the CLMU is housed in the junction box of the panel physically located in the middle or center of the group of panels connected thereto (to reduce the wire length required to connect the panels (4603, 4604 and 4605)). If there are an even number of panels in the group, the CLMU can be housed in the junction box of one of the middle panels.

In one embodiment, the CLMU is secured in a location separate from the individual solar panels connected thereto (as illustrated in FIG. 45). For example, the CLMU can be installed at a location at or near the center of the region defined by the locations of the junction boxes of the solar panels controlled by the CLMU. Alternatively, the CLMU can be installed inside the junction box of the solar panel that is located closest to the center of the regions defined by the locations of the junction boxes of the solar panels controlled by the CLMU.

In FIG. 46, the positive and negative output terminals of the junction box (4614) of Panel B (4604) are connected to the wires (4601, 4602) of the string bus leading to other solar panels in the string. The positive and negative output terminals of Panel A's junction box (4613) are connected to a pair of input terminals of Panel B's junction box (4614) through a pair of wires (4633). Similarly, the positive and negative output terminals of Panel C's junction box (4615) are connected to another pair of input terminals of Panel B's junction box (4614) by a pair of wires (4635). Local wires (4623, 4624, 4625) are used to connect the solar modules of the respective Panels A, B and C to a further pair of input terminals of their respective junction boxes (4613, 4614, 4615). In Panel B, the CLMU installed in the junction box (4614) connects the input terminals to the output terminals. In Panels A and C, the junction box (4614) of Panel B connects their input terminals (corresponding to local wires 4623 and 2625) directly to their output terminals. Thus, the solar modules of Panels A, B and C are operated and controlled by the CLMU located inside the junction box (4614) of Panel B. Thus, Panels A and C are connected to the string via the junction box (4614) of Panel B that houses the CLMU.

Figure 47:
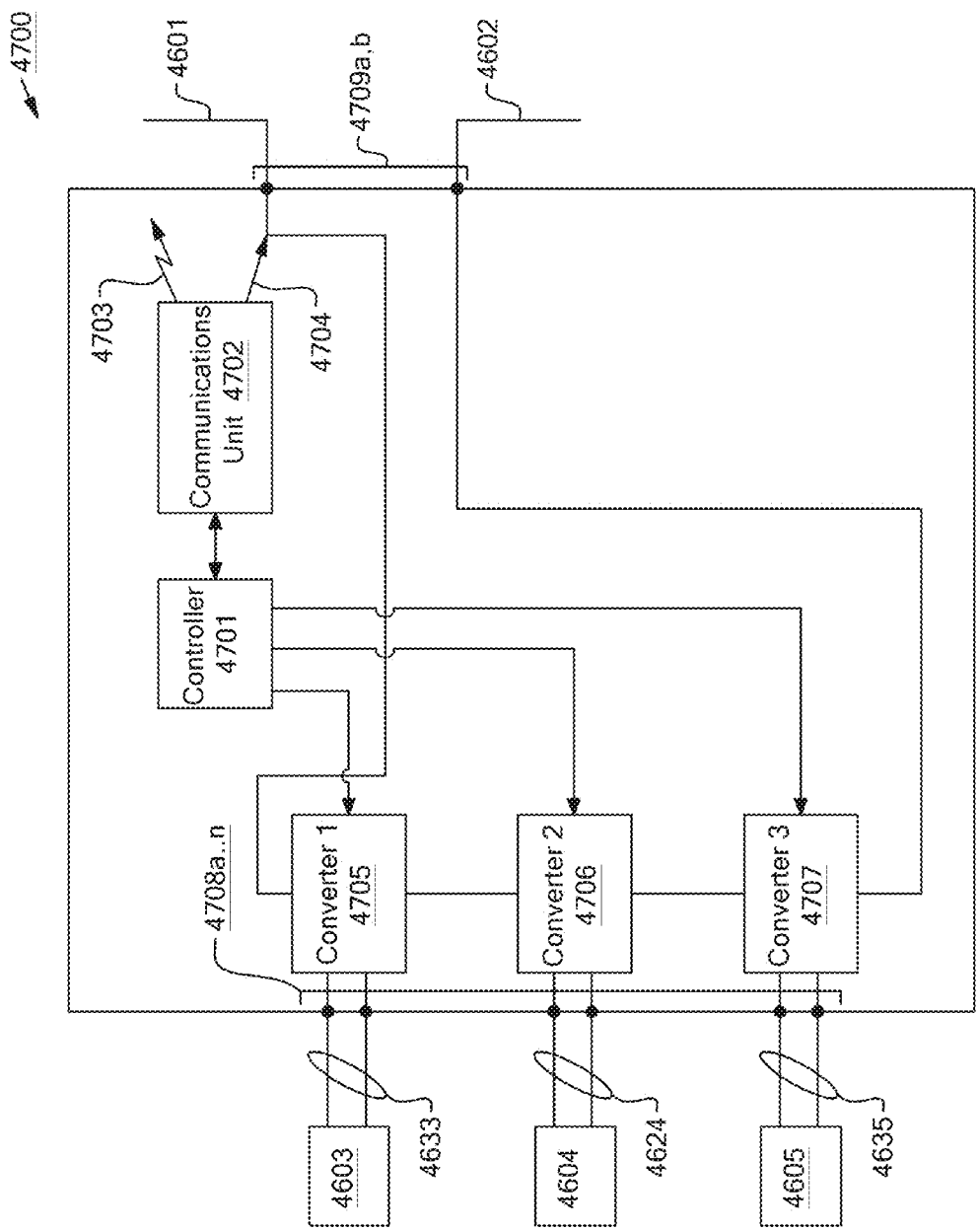
FIG. 47 illustrates an exemplary embodiment of a CLMU used to improve the energy production performance of a group of solar panels connected thereto.

FIG. 47 illustrates an exemplary junction box (4700) encasing the CLMU, similar to the junction box (4614) of Panel B in FIG. 46, according to one aspect of the system and method disclosed herein. Similar to the discussion of FIG. 46, and for purposes of clarity and simplicity, the exemplary system illustrated in FIG. 47 also includes a three-panel group. In FIG. 47, three direct current converters (4705, 4706, 4707) are connected to the solar modules (4603, 4604, 4605) of three separate panels (e.g., Panels A, B and C illustrated in FIG. 46), respectively, through three connector pairs (4708*a-c*) (e.g., input terminals corresponding to the local wires (4623, 4624, 4625) illustrated in FIG. 46). One skilled in the art would understand that the system disclosed herein is not limited to a single group of panels, three-panel groups, or the corresponding number of converters connected thereto. More or less converters can be included in the CLMU for controlling/operating more or less panels as a group.

In one embodiment, the junction box (4614) is secured to the panel physically located in the middle of the panel group layout. Because different configurations are possible, for example, with two, four, five, or any other suitable number of panels, the illustrated positioning may be different in other embodiments of the disclosed system.

In FIG. 47, the outputs of the converters (4705-4707) are connected in series; and the connectors (4709a and 4709b) connect the series connected converters (4705-4707) to the wires (4601 and 4602) leading to other panels in the string.

In FIG. 47, the CLMU housed in the junction box (4614) includes control circuitry which includes a controller (4701) and a communications unit (4702). The controller (4701) operates the converters connected thereto (e.g., 4705, 4706, and 4707) according to their separate duty cycles. In one embodiment, controller (4701) is configured to control all converters connected thereto (e.g., 4705, 4706, and 4707). In one embodiment, configuring the controller to implement the multiple-converter control function is accomplished by modifying the controller's software. In one embodiment, the multiple-converter control functionality is implemented by utilizing a controller capable of running multiple independent software instances, each instance controlling one converter.

The converters (e.g., 4705, 4706, and 4707) may be any of the types described herein throughout. For example, the converter (e.g., 4705, 4706, or 4707) can be an LMU (101) illustrated in FIGS. 1-3B without the controller (109); and the controllers (109) of the respective LMUs (101) can be combined via the controller (4701) and the communications unit (4702) to reduce cost. Thus, through sharing the common components (e.g., the controller and the communications unit), the cost of the system is reduced.

Also, the methods disclosed above to individually control or operate the solar modules of separate panels can be used accordingly with a CLMU hosted inside the junction box (4614).

Communications unit (4702) may use a wireless connection (4703), or a wired connection (4704) to the string (4601), to communicate with a system management unit (e.g., (204) illustrated in FIG. 4A, FIG. 4B, and FIG. 11A, (3440) illustrated in FIG. 34). In one embodiment, communications unit (4702) is configured to enable the single controller (4701) to control more than one converter (e.g., 4705, 4706, and 4707) by facilitating the controller's communications with the system management unit. In FIG. 47, the converters (4705, 4706, and 4707) share a controller (4701). Alternatively, each converter may have its own controller.

In one embodiment, galvanic separation may be used on the wires between the controller and the converters for creeping current etc.

While the input voltages of solar modules (4603-4605) connected to the converters (4705-4707) of the CLMU may be different, the output currents of the converters (4705-4707) are the same, due to the series connection of the outputs of the converters (4705-4707). Thus, a single current measurement unit/current sensor can be used to measure the output current of the solar panels connected to a CLMU.

In one embodiment, the CLMU is configured to use a voltage measurement unit for multiple solar panels connected to the CLMU via a set of switches. The CLMU controls the states of the switches to dynamically connect the voltage measurement unit to one of the converters (4705-4707) at a time to measure the input or output voltage measurement of the respective solar panel.

In one embodiment, the system may have a combiner box to combine multiple strings of panels that are connected via CLMUs, in a way as illustrated in FIGS. 38-44.

In FIG. 47, the CLMU controls/operates the solar modules (4603-4605) in a way similar to a cluster of LMUs, each separately controlling/operating a respective one of the solar modules (4603-4605). Integrating the cluster of LMUs into the CLMU housing in a single junction box allows the cluster of LMUs to share hardware components (e.g., the communications unit (4702) and at least part of the controller (4701)) and thus reduces the cost of the system. Alternatively, the CLMU may have a number of complete, separate LMUs in one housing.

In one embodiment, a cascading regulation system is configured to supply reliable power inexpensively based on power sources having power outputs that may vary significantly over time and/or due to changes in environment conditions, such as solar energy.

For example, the cascading regulation system can be used to power a local power consumption unit in a system, such as the local management unit (LMU) of a solar panel, a combined local management unit (CLMU) connected to one or more solar panels, etc.

In one embodiment, the cascading regulation system is connected to a number of serially connected power sources and uses multiple regulators having different cutoff voltages to provide an output for the local power consumption unit. Each of the regulators is connected to a different subset of serially connected power sources and so configured that if the voltage generated by the regulator at the lowest tap is no longer sufficient for a stable supply to the local power consumption unit, the next higher regulator takes over, and the output voltage drops in a small step in the takeover of the next higher tap. When the voltage generated across a subsection grows, a lower connected tap may take over again, producing a slightly higher output voltage for the local power consumption unit. The cutover steps are chosen such that the output voltage range of the set of regulators matches the range given as the acceptable input range for the local power consumption unit.

Figure 48:
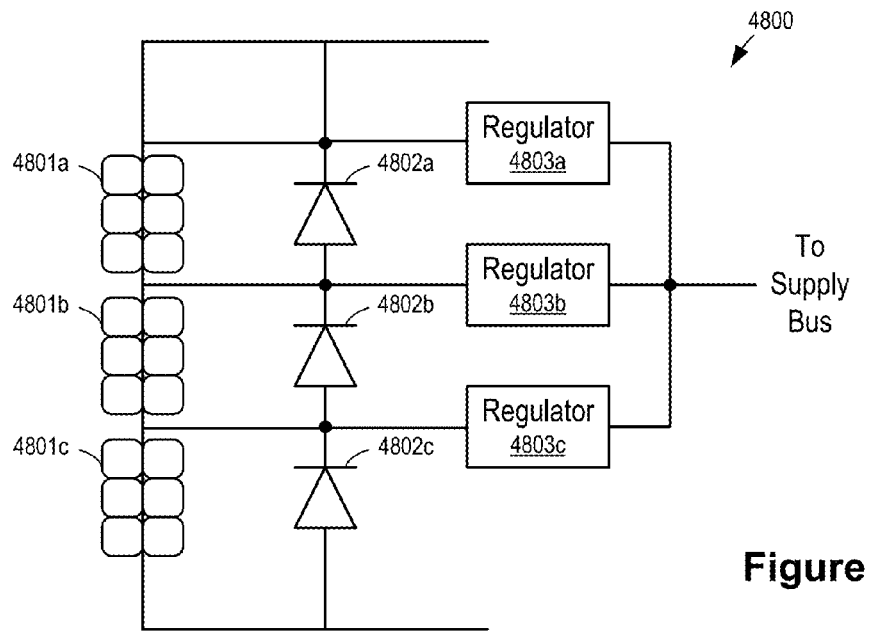
FIG. 48 illustrates an exemplary embodiment of a power feed having a cascading regulation system.

FIG. 48 illustrates an exemplary embodiment of a power feed having a cascading regulation system.

In the system (4800) illustrated in FIG. 48, sections (4801a, 4801b, 4801c) of solar cells are connected in series, with respective flow back protection diodes (4802a, 4802b, 4802c) for the respective sections (4801a, 4801b, 4801c).

In FIG. 48, the outputs of the sections (4801a, 4801b, 4801c) are connected in series to provide different input voltages for the set of regulators (4803a, 4803b, 4803c). The outputs of the regulators (4803a, 4803b, 4803c) are connected to power the same supply bus.

FIG. 48 illustrates an example of a cascading regulation system having three regulators (4803a, 4803b, 4803c) connected to three sections (4801a, 4801b, 4801c) of solar cells. More or less regulators can be used in a similar way. For example, in some embodiments, four or more cascading regulators can be used to power the supply bus. In another embodiment, two cascading regulators can be used to power the supply bus.

Since the sections (4801a, 4801b, 4801c) are connected in series, the input voltage for the regulator (4803c) is higher than the input voltage for the regulator (4803b), which is higher than the input voltage for the regulator (4803a).

For example, when each of the sections (4801a, 4801b, 4801c) has an output voltage of 10V, the input voltages for the regulators (4803a, 4803b, 4803c) are 30V, 20V, and 10V respectively.

When the sections (4801a, 4801b, 4801c) have sufficient output voltages (e.g., in normal energy production operations), the lowest section (4083c) is configured to be sufficient to supply the lowest regulator (4803c); and the higher regulators in the cascading system are blocked.

In one embodiment, the normal output voltage of the lowest section (4081c) is configured to be close to the output voltage of the lowest regulator (4803c) to increase efficiency.

For example, when the normal output voltage of the lowest section (4083c) is 10V and the designed the output voltage of the regulator (4803c) is 8.5V, the voltage drop is across the input and output of the regulator (4803c) only about 1.5V. Thus, even when a simple regulator is used, the efficiency of the regulator (4803c) can be about 85%, which can be higher than the efficiency of most house-keeping converters designed for converting at such a level of power.

When the output voltage of the lowest section (4081c) is reduced to a predetermined level, the voltage regulator (4803c) fails to produce a sufficient output to the supply bus and may be blocked; and the next higher regular (4803b) is used to power the supply bus.

For example, due to the reduction in power output in the sections (4801a, 4801b, 4801c), when the regulator (4803b) is used, the input voltage for regulator (4803b) is reduced to 16V (e.g., from the normal input voltage of 20V). The voltage regulator (4803b) receives the input voltage of 16V and supply an 8V output to the supply bus, resulting in an efficiency of at least 50 percent. As the input voltage for the voltage regular (4803b) decreases, the efficiency of supplying the 8V output to the supply bus increases (since the voltage drop across the regulator (4803b) decreases), before the input voltage for the voltage regulator (4803b) is too low to power the supply bus, in which case the output of the regulator (4803a) takes over powering the supply bus and the outputs of the regulators (4803b and 4803c) are blocked.

When the input voltage for the regulator (4803b) is deceased to a predetermined level (e.g., 9V), the regulator (4803a) takes over to power the supply bus at a reduced voltage (e.g., 7.5V). Since the input voltage for regulator (4803a) is reduced (to below 13.5V from the normal input voltage of 30V), the efficiency of the regulator (4803a) to power the supply bus at 7.5V is 55 percent or better.

For example, in one embodiment, when the input voltage provided by the section (4801c) of solar cells to the regulator (4803c) is between a first range (e.g., 8.5V to 10V), the lowest regulator (4803c) is used to power the supply bus (e.g., at 8.5V); and the higher regulators (4803b and 4803a) are blocked. When the input voltage provided by the section (4801c) of solar cells to the regulator (4803c) is below the first range (e.g., 8.5V) and the input voltage provided by the serial connection of the sections (4801c and 4801b) is in a second range (e.g., 8V to 17V), the middle regulator (4803b) is used to power the supply bus at a reduced voltage (e.g., near 8V); and the other regulators (4803a and 4803c) are blocked. When the input voltage provided by the serial connection of the sections (4801c and 4801b) is below the second range (e.g., 8V) and the input voltage provided by the serial connection of the sections (4801c, 4801b, and 4801a) is in a third range (e.g., 7.5V to 12V), the upper regulator (4803a) is used to power the supply bus (e.g., near 7.5V); and the lower regulators (4803b and 4803c) are blocked.

The reduced overall cost and simplicity of the system and method of the cascading system illustrated in FIG. 48 provides an efficient solution for smart solar panels containing a controller that needs a stable, but cost effective power supply. Because each higher regulator (e.g., 4803a, or 4803b) in the cascading system has a slightly lower output voltage than a respective lower regulator (e.g., 4803b, 4803c), the regulators (4803a, 4803b, 4803c) can be made very simply and can have an output diode for cutover.

Figure 49:
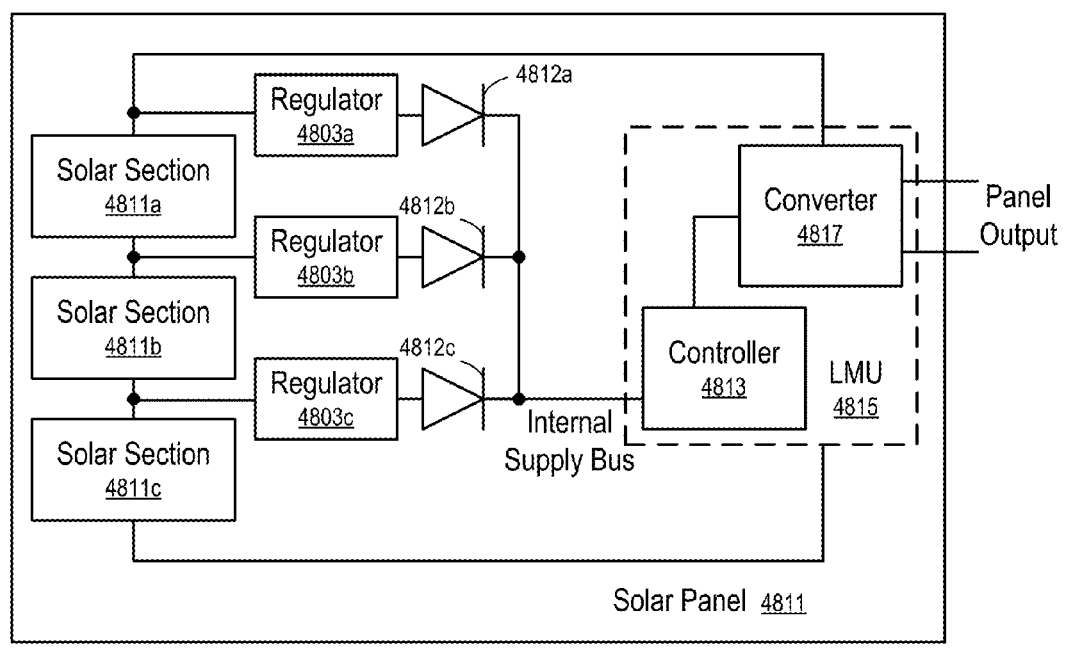
FIG. 49 illustrates an exemplary embodiment of a power feed for a local management unit of a solar panel.

FIG. 49 illustrates an exemplary embodiment of a power feed for a local management unit of a solar panel.

In FIG. 49, the solar panel has a plurality of solar sections (4811a, 4811b, 4811c) connected in series to provide different input voltages to a cascade of voltage regulators (4803a, 4803b, and 4803c). The voltage regulators (4803a, 4803b, and 4803c) are connected to receive inputs from different subsets of the solar sections (4811a, 4811b, 4811c).

For example, the lowest regulator (4803c) in the cascade of regulators (4803a, 4803b, and 4803c) receives the lowest voltage input from the solar section (4811c); the middle regulator (4803b) in the cascade of regulators (4803a, 4803b, and 4803c) receives the middle voltage input from the serial connection of the solar sections (4811b and 4811c); and the highest regulator (4803a) in the cascade of regulators (4803a, 4803b, and 4803c) receives the highest voltage input from the serial connection of the solar sections (4811a, 4811b, 4811c).

Since the input voltage of a higher regulator (e.g., 4803b) is from the series connection of the input voltage of a lower regulator (e.g., 4803c) and an additional solar section (e.g., 4811b), the input voltage of the higher regulator is higher than the lower regulator (e.g., 4803c).

The set of regulators (e.g., 4803a, 4803b, and 4803c) are configured to supply the internal supply bus for the local management unit (4815) at different voltages. A higher regulator (e.g., 4803b) is configured to output at a voltage lower than a lower regulator (e.g., 4803c). Thus, output diodes (4812a, 4812b, 4812c) of the regulators (4803a, 4803b, and 4803c) can be used to selectively isolate the low-output regulators from the internal supply bus. When the power output from the solar sections (e.g., 4803a, 4803b, and 4803c) decreases (e.g., as the intensity of the light received in the solar sections (e.g., 4803a, 4803b, and 4803c) decreases), the increasing input voltages in the cascade of the regulators (e.g., 4803a, 4803b, and 4803c) allow one or more of the regulators to receive sufficient voltage inputs for normal operations; and the output diodes (4812a, 4812b, 4812c) select the highest output to power the internal supply bus and isolate the other the outputs of other regulators from the internal supply bus.

When more than one regulator has sufficient voltage input, the lowest regulator having a sufficient voltage input in the more than one regulator is used to power the internal supply bus. The one or more regulators that have insufficient voltage inputs are also isolated from the internal supply bus.

In FIG. 49, the solar panel (4811) includes a local management unit (4815), which can be a local management unit (or combined local management unit) discussed above (e.g., illustrated in any of FIGS. 1-5, 9, 19, 34, 45-47). The local management unit (4815) includes a converter (4817) and a controller (4813). The internal supply bus provides power to the controller (4813), which controls the operation of the converter (4817) to produce the panel output based on the power produced by the serial connection of the solar sections (4811a, 4811b, 4811c).

Figure 50:
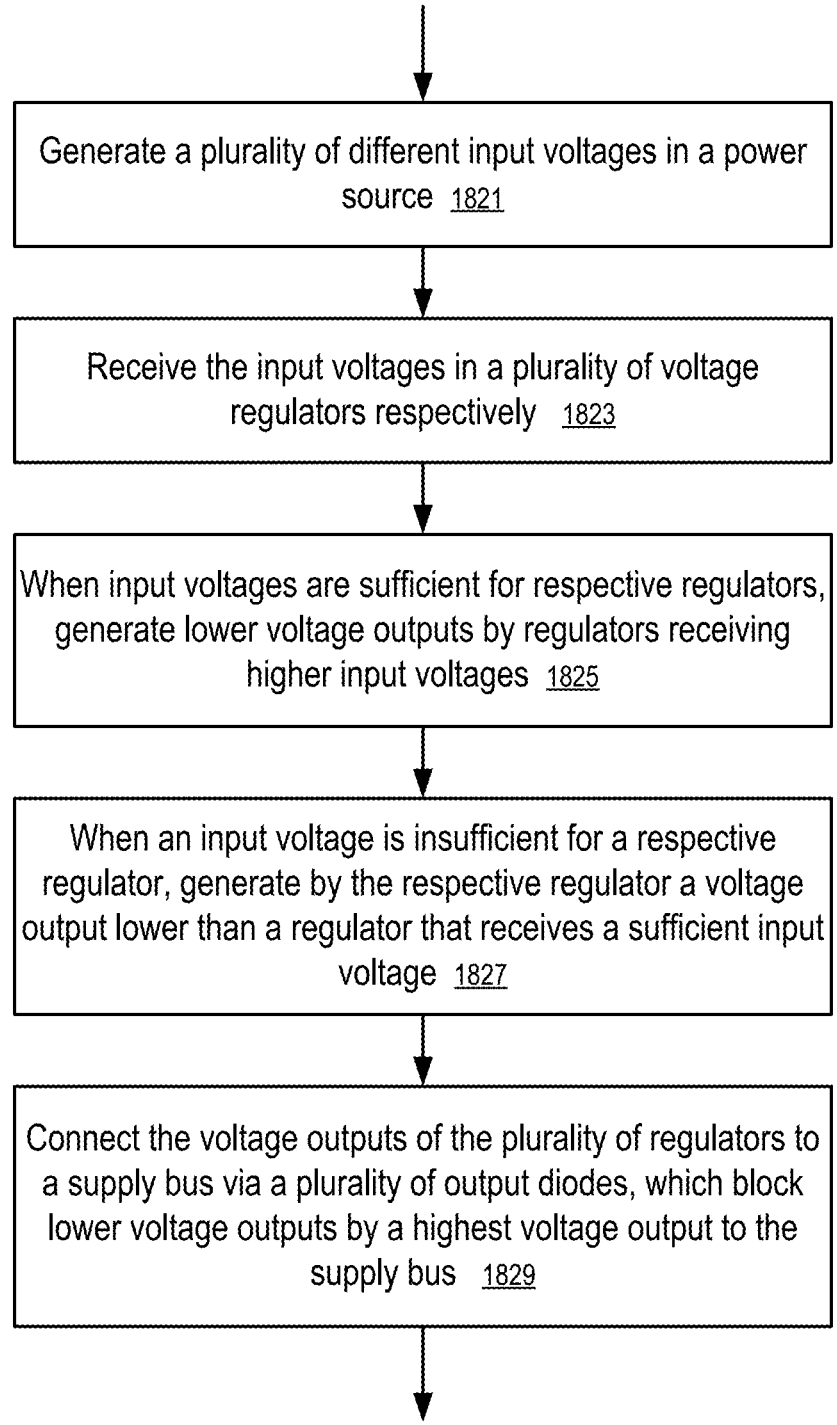
FIG. 50 shows a method implemented in a power feed according to one embodiment.
Figure 51:
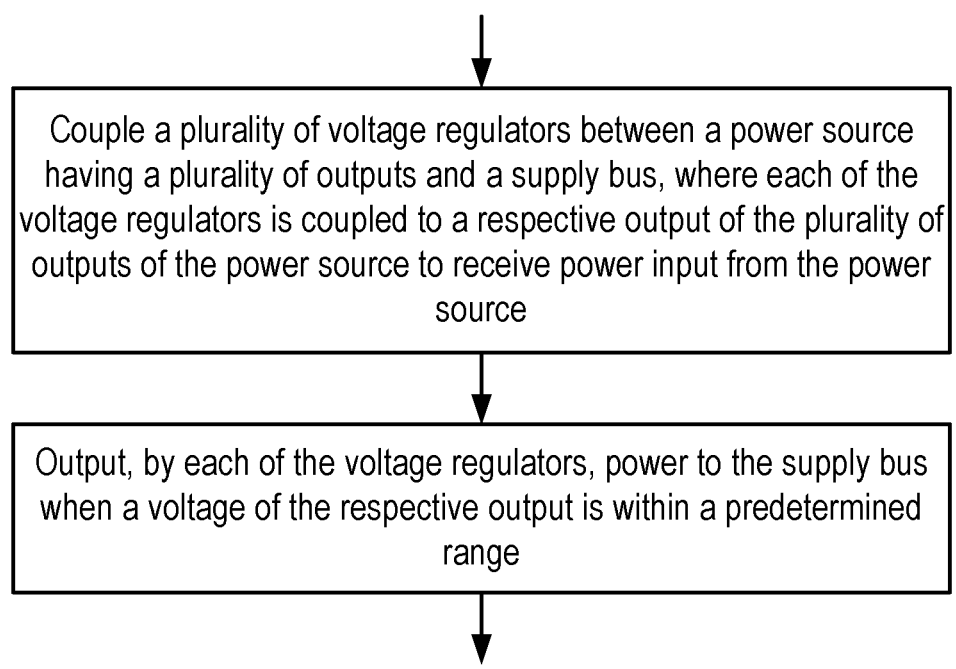
FIG. 51 shows a process implemented via an apparatus according to one embodiment.

FIG. 50 shows a method implemented in a power feed according to one embodiment. The method of FIG. 50 can be implemented via an apparatus illustrated in FIG. 48 or 49, and used with local management units or combined local management units discussed in connection with FIGS. 1-47.

In FIG. 50, a plurality of different input voltages are generated (1821) in a power source (e.g., the serial connected solar cell sections (4801a, . . . , 4801c), or serial connected solar sections (4811a, . . . , 4811c)).

The different input voltages are received (1823) in a plurality of voltage regulators (e.g., 4803a, ..., 4083c) respectively.

When input voltages are sufficient for respective regulators (e.g., 4803a, ..., 4083c), lower voltage outputs are generated (1825) by regulators receiving higher input voltages.

For example, in FIG. 49, the regulator (4803a) receives a higher input voltage than the regulator (4803b), which receives a higher input voltage than the regulator (4803c). When each of the regulators (4803a, 4803b, 4803c) receives a sufficient input voltage, the regulator (4803a) has a lower output voltage than the regulator (4803b), which has a lower output voltage than the regulator (4803c).

When a voltage regulator receives a sufficient voltage input that is above a predetermined threshold, the voltage regulator provides a predetermined voltage output. When the voltage input is insufficient, the voltage regulator fails to produce the predetermined voltage output (may turn off output, output at a level significant lower than the predetermine voltage output, or provide an output that is substantially equal to the input). In FIG. 50, when an input voltage is insufficient for a respective regulator, the respective regulator generates (1827) a voltage output lower than a regulator that receives a sufficient input voltage.

In one embodiment, when a regulator receives insufficient input voltage, the regulators receiving lower input voltages than the regulator also receive insufficient input voltages; and when a regulator receives sufficient input voltage, the regulators receiving lower input voltages than the regulator also receive insufficient input voltages. The outputs of the regulators receiving insufficient input voltages are lower than the outputs of regulators receiving sufficient input voltages.

In FIG. 50, a plurality of output diodes (e.g., 4812a, ..., 4812c) connect (1829) the voltage outputs of the plurality of regulators (e.g., 4803a, ..., 4803c) to a supply bus. A highest voltage output of the regulators (e.g., 4803a, ..., 4803c) to the supply bus causes the output diodes (e.g., 4812a, ..., 4812c) to block lower voltage outputs of the regulators from reaching the supply bus. Thus, the highest voltage output of the regulators (e.g., 4803a, ..., 4803c) is used to power the supply bus.

It is clear that many modifications and variations of this embodiment can be made by one skilled in the art without departing from the spirit of the novel art of this disclosure. For example, the systems and method herein disclosed can be applied to energy generating systems besides photovoltaic systems (e.g., windmills, water turbines, hydrogen fuel cells, to name a few). Also, although the target voltage has been compared to the average string output voltage of strong strings, other reference points for the target voltage can also be used. Some non-limiting examples include an string output voltage for the strongest string or a median string output voltage of strong strings.

In the foregoing specification, the disclosure has been described with reference to specific exemplary embodiments thereof. It will be evident that various modifications can be made thereto without departing from the broader spirit and scope as set forth in the following claims. The specification and drawings are, accordingly, to be regarded in an illustrative sense rather than a restrictive sense.

What is claimed is:

1. An apparatus, comprising:
   a plurality of power generation sections connected in series; and
   a plurality of voltage regulators coupled with the plurality of power generation sections and configured to regulate a supply bus, wherein each of the voltage regulators is coupled to receive input from a different subset of the plurality of power generation sections connected in series;
   wherein when receiving sufficient power input, the voltage regulators are configured to have different output voltages.

2. The apparatus of claim 1, wherein lower voltage outputs of the voltage regulators are configured to be blocked from the supply bus in the presence of a higher voltage output from one of the voltage regulators.

3. The apparatus of claim 2, wherein when receiving sufficient power input, each first voltage regulator of the plurality of voltage regulators receiving a higher voltage input than each second voltage regulator of the plurality of voltage regulators is configured to generate a lower voltage output than the second voltage regulator.

4. The apparatus of claim 1, wherein the different output voltages are within a voltage range acceptable for the supply bus.

5. The apparatus of claim 4, wherein each respective voltage regulator of the plurality of voltage regulators is configured not to control the supply bus when receiving insufficient power input.

6. The apparatus of claim 1, wherein the apparatus is a solar panel; and each of the power generation sections comprises a plurality of solar cells and a back flow protection diode.

7. An apparatus, comprising:
   a plurality of voltage regulators coupled between a power source having a plurality of outputs and a supply bus, wherein each of the voltage regulators is
   coupled to a respective output of the plurality of outputs of the power source to receive power input from the power source, and
   configured to output power to the supply bus when a voltage of the respective output is within a predetermined range;
   wherein in the plurality of voltage regulators, each first voltage regulator receiving a voltage input higher than each second voltage regulator is configured to produce a lower output than the second voltage regulator, unless a voltage input for the second voltage regulator is insufficient to operate the second voltage regulator.

8. The apparatus of claim 7, wherein each of the voltage regulators is configured to output to the supply bus at a different voltage; and lower voltage outputs of voltage regulators are configured to be blocked from the supply bus in the presence of a higher voltage output from one of the voltage regulators.

9. The apparatus of claim 8, wherein each first voltage regulator having an output voltage lower than a second voltage regulator is connected to receive an input voltage from the power source higher than an input voltage received by the second voltage regulator.

10. The apparatus of claim 9, wherein the power source includes a plurality of sections connected in series; and the plurality of voltage regulators are connected to receive input from different subsets of the plurality of sections connected in series.

11. The apparatus of claim 10, wherein each of the plurality of sections comprises a plurality of solar cells and a back flow protection diode.

12. The apparatus of claim 8, wherein different voltage outputs of the voltage regulators are configured to be within an accepted voltage range of the supply bus.

13. The apparatus of claim 7, wherein each respective voltage regulator of the voltage regulators includes an output diode to block an output of the respective voltage regulator from the supply bus when the supply bus is powered by a voltage higher than the output of the respective voltage.

14. The apparatus of claim 7, wherein each respective voltage regulator of the voltage regulators includes an output diode to block an output of the respective voltage regulator from the supply bus when the supply bus is powered by a voltage higher than the output of the respective voltage.

15. A method, comprising:
generating a plurality of different input voltages from a plurality of solar sections connected in series;
providing the plurality of different input voltages to a plurality of voltage regulators respectively;
generating, by the voltage regulators, a plurality of output voltages, wherein a first voltage regulator receiving a higher input voltage than a second voltage regulator is configured to generate a lower output voltage than the second voltage regulator when an input voltage for the second voltage regulator is sufficient to operate the second voltage regulator; and
blocking lower voltage outputs of the voltage regulators from a supply bus when a higher voltage output of the voltage regulators is powering the supply bus.

16. The method of claim 15, wherein the lower voltage outputs is blocked from the supply bus via output diodes of the voltage regulators.

17. The method of claim 15, wherein when the input voltage for the second voltage regulator is insufficient to operate the second voltage regulator, the second voltage regulator does not power the supply bus.

18. The method of claim 17, wherein the plurality of output voltages of the voltage regulators are configured to be within a voltage range acceptable for the supply bus.

* * * * *